(12) United States Patent
Parikh et al.

(10) Patent No.: US 9,097,764 B2
(45) Date of Patent: Aug. 4, 2015

(54) SCAN CHAIN IN AN INTEGRATED CIRCUIT

(71) Applicant: Texas Instruments Incorporated, Dallas, TX (US)

(72) Inventors: Naishad Narendra Parikh, Bangalore (IN); Pranjal Tiwari, Bangalore (IN); Aishwarya Dubey, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 16 days.

(21) Appl. No.: 13/746,153

(22) Filed: Jan. 21, 2013

(65) Prior Publication Data

US 2014/0208176 A1 Jul. 24, 2014

(51) Int. Cl.
*G01R 31/28* (2006.01)
*G01R 31/3185* (2006.01)

(52) U.S. Cl.
CPC .............................. *G01R 31/318541* (2013.01)

(58) Field of Classification Search
CPC ............... G01R 31/318555; G01R 31/318572; G01R 31/318541; G01R 31/318536; H05K 999/99
USPC ........................................................ 714/727
See application file for complete search history.

(56) References Cited

U.S. PATENT DOCUMENTS

| 6,070,259 A * | 5/2000 | Roisen et al. .................. 714/726 |
| 2004/0119502 A1 | 6/2004 | Chandar et al. |
| 2005/0212542 A1 * | 9/2005 | Brown .......................... 324/763 |
| 2007/0290733 A1 | 12/2007 | Aksamit |
| 2011/0010593 A1 * | 1/2011 | Shrivastava .................... 714/727 |
| 2011/0209014 A1 * | 8/2011 | Whetsel ......................... 714/727 |
| 2012/0079334 A1 | 3/2012 | Tam et al. |
| 2014/0136912 A1 * | 5/2014 | Masleid et al. ................ 714/726 |

\* cited by examiner

*Primary Examiner* — Albert Decady
*Assistant Examiner* — Enam Ahmed
(74) *Attorney, Agent, or Firm* — Ronald O. Neerings; Frank D. Cimino

(57) ABSTRACT

In an embodiment, a scannable storage element includes an input circuit for providing a first signal at first node based on a data input and a scan input, where the scan input is of pull-up logic in functional mode. The input circuit includes a first pull-up path comprising a switch receiving data input and a switch receiving scan enable input, and second pull-up path comprising a switch receiving scan input, first pull-down path comprising a switch receiving the scan enable input and a switch receiving the scan input, and second pull-down path comprising a switch receiving the data input. The storage element includes a shifting circuit configured to provide a second signal in response to the first signal at second node, and a scan output buffer coupled to the second node and configured to provide a scan output at a scan output terminal in response to the second signal.

20 Claims, 22 Drawing Sheets

SCAN CHAIN IN AN INTEGRATED CIRCUIT

TECHNICAL FIELD

The present disclosure generally relates to scan chains and power and area optimization in Integrated Circuits (ICs).

BACKGROUND

In integrated circuit (IC) testing, the test technique of internal embedded scan design has become a cost effective solution to test the operation of ICs. Scan design is accomplished by altering the structure of standard flip-flops and latches (storage elements) within the IC into scan flip-flops and latches by providing a second alternate scan input for scan data parallel to the functional data input. The alternate input for scan data is generally implemented by placing a multiplexer in front of the standard input which selects either scan data or functional data. These "scannable" elements are then connected together in a serial shift register fashion by connecting the output of one element to the scan input of a next element via a "scan chain". The scan chain can load and unload internal IC state information by allowing scan data to be transferred from one element to another on each active clock edge when a scan enable signal is asserted.

The static timing analysis (STA) closure frequency in automatic test pattern generation (ATPG) shift mode of the scannable storage circuits are quite high, but production test description languages (TDLs) are run at lower frequencies due to high IR drop and reliability issues caused by the complete design logic toggling in the ATPG shift mode. Combinatorial logic contributes to more than 40% of power consumption in scan mode. It is not required for the logic to toggle during ATPG shift. If the toggle on functional combinational logic can be stopped, the ATPG shift frequency can be increased significantly resulting in lesser test-time and hence lesser tester cost. The power consumption of the design depends upon the choice of a "pull-down" Q gating or a "pull-up" Q gating flop for a particular path. Post silicon test programs' development makes it difficult to decide on a type of circuit that ensures minimum test power for all possible TDL combinations, especially in case of partial usage of "gated Q" flops.

In functional mode of operation, the SD (scan input) pins of flops are connected to SQ (scan output) pins of the previous flop. Whenever there is a signal activity on the D (functional data) pin of a flop, the signal travels to the SD pins of the subsequent flops, thereby causing unnecessary power loss. Considerable amount of power is burnt unnecessarily on test circuits in functional operations. When device is operated in overdrive modes (high frequency modes), the power loss becomes significant causing faster battery discharge.

SUMMARY

This Summary is provided to introduce a selection of concepts in a simplified form that are further described below in the detailed description. This Summary is not intended to identify key or essential features of the claimed subject matter, nor is it intended to be used as an aid in determining the scope of the claimed subject matter.

A number of exemplary scannable storage elements in Integrated Circuit (ICs), configured for reducing area and power requirement are disclosed. In an embodiment, a scannable storage element for use in an IC is provided. The scannable storage element includes an input circuit configured to provide a signal to a first node in response to one of a data input and a scan input, the scan input being a pull-up logic in a functional mode. The input circuit includes a first pull-up path comprising a first switch receiving a data input and a second switch receiving a scan enable input, and a second pull-up path comprising a third switch receiving a scan input, the second pull-up path and the first pull-up path coupled between a power supply and the first node, a first pull-down path comprising a fourth switch receiving the scan enable input and a fifth switch receiving the scan input, and a second pull-down path comprising a sixth switch receiving the data input, the first pull-down path and the second pull-down path coupled between the first node and a reference supply. The storage element also includes a shifting circuit comprising one or more sequential components, configured to provide a second signal in response to the first signal at a second node, and a scan output buffer coupled to the second node for receiving the second signal, the scan output buffer configured to provide a scan output at a scan output terminal in response to the second signal, where the scan output is one of a pull-up logic and a pull-down logic in the functional mode and the scan output corresponds to the scan input in a shift mode.

In another embodiment, a scannable storage element for use in an IC is provided. The scannable storage element includes an input circuit configured to provide a signal to a first node in response to one of a data input and a scan input, the scan input being a pull-down logic in a functional mode. The input circuit includes a first pull-up path comprising a first switch transistor receiving the scan input and a second switch receiving the data input, and a second pull-up path comprising the first switch and a third switch receiving an inverted scan enable input, the second pull-up path and the first pull-up path coupled between a power supply and the first node, a first pull-down path comprising a fourth switch receiving the inverted scan enable input and a fifth switch receiving the data input, and a second pull-down path comprising a sixth switch receiving the scan input, the first pull-down path and the second pull-down path coupled between the first node and a reference supply. The scannable storage element also includes a shifting circuit comprising one or more sequential components, configured to provide a second signal in response to the first signal at a second node, and a scan output buffer coupled to the second node for receiving the second signal, where the scan output buffer is configured to provide a scan output at a scan output terminal in response to the second signal, where the scan output is one of a pull-up logic and a pull-down logic in the functional mode and the scan output corresponds to the scan input in a shift mode.

In another embodiment, a scannable storage element for use in an IC is provided. The scannable storage element includes an input circuit configured to provide a signal to a first node in response to one of a data input and a scan input, the scan input being one of a pull-up and a pull-down logic in a functional mode. The scannable storage element also includes a shifting circuit comprising one or more sequential components, configured to provide a second signal in response to the first signal at a second node, and a scan output buffer coupled to the second node for receiving the second signal, the scan output buffer configured to provide a scan output at a scan output terminal in response to the second signal, where the scan output is one of a pull-up logic and a pull-down logic in the functional mode and the scan output corresponds to the scan input in a shift mode.

In another embodiment, a method for operating a scannable storage element in an IC. The method includes generating a first signal at a first node of the scannable storage element in response of one of a data input and a scan input, the scan input being one of a pull-up and a pull-down logic in a functional mode. The method includes generating a second signal by one or more sequential elements in response to the first signal at a second node of the scannable storage element. The method further includes generating a scan output at a scan output terminal of the scannable storage element in response to the second signal, wherein the scan output is one of a pull-up logic and a pull-down logic in the functional mode and the scan output corresponds to the scan input in a shift mode.

Other aspects and example embodiments are provided in the drawings and the detailed description that follows.

DETAILED DESCRIPTION

Figure 1:
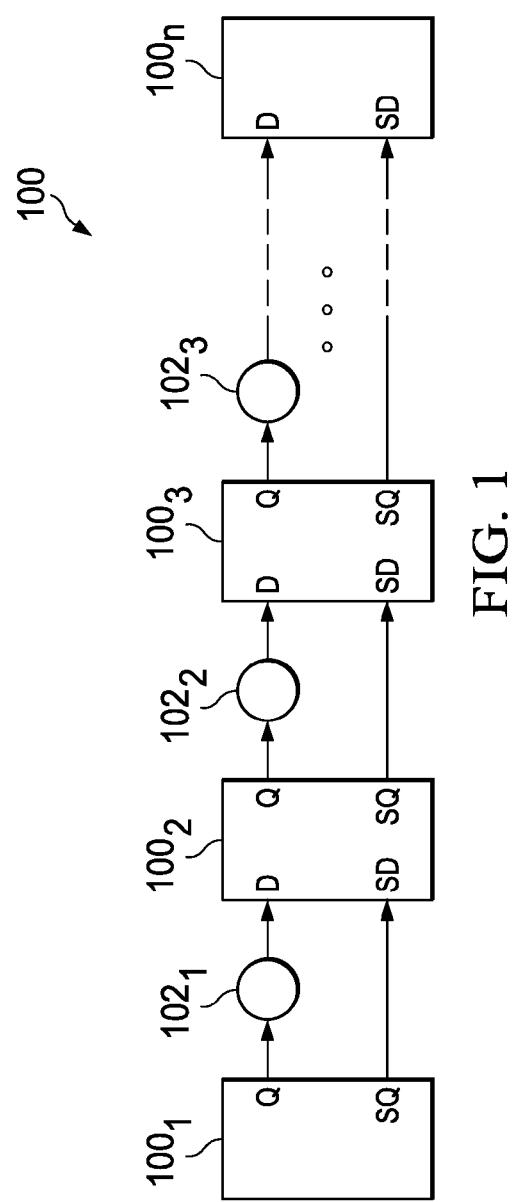
FIG. 1 illustrates an example of a scan chain in an Integrated Circuit (IC) according to an embodiment.

FIG. 1 illustrates an example of a scan chain 100 in an Integrated Circuit (IC) according to an embodiment. As shown in FIG. 1, the scan chain 100 is formed by a number of scannable storage elements $100_1, 100_2 \ldots 100_n$. Each of the scannable storage element (hereinafter scannable storage element is also referred to as "storage element") has inputs such as a data input (see, 'd') and a scan input (see, 'sd'), and corresponding outputs a data output (see, 'd') and a scan output (see, 'sq'). The scan chain 100 is configured to operate in a functional mode or a shift mode. In an embodiment, the storage elements $100_1, 100_2 \ldots 100_n$ may be coupled in a serial manner to configure the scan chain. For instance, a data input 'd' of a storage element (for example, of storage element $100_2$) is coupled to a data output 'q' of a preceding storage element (storage element $100_1$), and a scan input 'd' of the storage element (for example, storage element $100_2$) is coupled to a data output 'q' of a preceding storage element (for example, the storage element $100_1$). There may be some combinational components (for example, $102_1, 102_2, 102_3 \ldots$) between the data input and the data output 'q' of the preceding storage element. Various configurations of the storage elements of the scan chain 100 are described further in reference to FIGS. 2 to 21.

Figure 2:
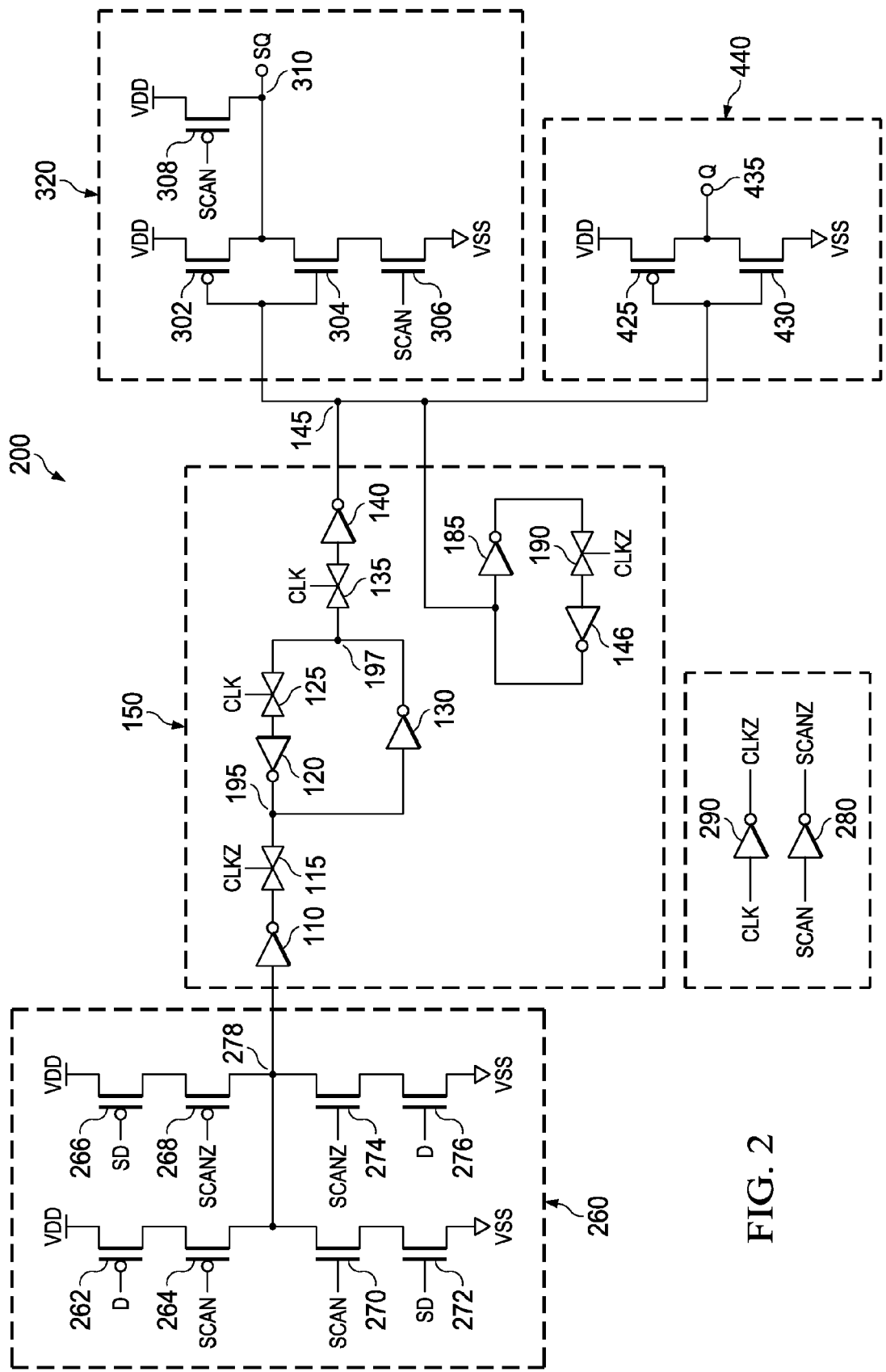
FIG. 2 illustrates a first scannable storage element of the scan chain with scan output pull-up in functional mode according to an embodiment.

FIG. 2 illustrates an example of the first storage element of the scan chain 100 according to an embodiment. For instance, the storage element 200 may be an example of the first scannable storage element $100_1$ of the scan chain 100. In this embodiment, the storage element 200 is configured such that a scan output of the storage element 200 is pull-up in functional mode in order to save power by disabling toggling of scan elements in an IC. For instance, by pulling up the scan output terminal in the functional mode, power consumption caused by combinational logic switching in scan path (which is driven by the scan output terminal) may be reduced.

The scannable storage element 200 includes a node 145 coupled to a scan output buffer such as a scan output buffer 320 for driving a scan output terminal. In this example embodiment, the node 145 is also coupled to a data output buffer 440 for driving a data output terminal. The storage element 200 is configured to be selectively coupled to a data input terminal (for receiving a data input) and a scan input terminal (for receiving a scan input) in response to scan enable input. For instance, the storage element 200 includes a multiplexer 260 having the data input (see, 'd') and a scan input (see, 'sd'). A scan enable input (SCAN) acts as a select line for the multiplexer 260. The multiplexer 260 is configured by comprising 8 MOS transistors, for example, PMOS transistors 262, 264, 266, 268, and NMOS transistors 270, 272, 274 and 276. An additional transistor 280 is also required for converting the SCAN to an inverted SCAN signal (SCANZ). The transistors 262 and 264 configure a first pull-up path between a power supply (see, VDD) and a node 278, where gate of the transistor 262 is connected to the data input 'd', and the gate of the transistor 262 is connected to the SCAN. The transistors 266 and 268 configure a second pull-up path between VDD and the node 278, where gate of the transistor 266 is connected to the scan input 'sd', and the gate of the transistor 268 is connected to SCANZ. The transistors 270 and 272 configure a first pull-down path between the node 278 and a reference supply (see, VSS), where gate of the transistor 270 is connected to the SCAN, and the gate of the transistor 272 is connected to the scan input 'sd'. The transistors 274 and 276 configure a second pull-down path between the node 278 and VSS, where gate of the transistor 274 is connected to the SCANZ, and the gate of the transistor 276 is connected to the data input 'd'.

An output (the node 278) of the multiplexer 260 is connected to a shifting circuit 150 that is configured to provide a signal at the node 145 based on the output of the multiplexer 260. In the embodiment shown in the FIG. 2, the shifting circuit 150 includes one or more latches/flip-flops configured by an inverter 110, a transmission gate 115, an inverter 120, an inverter 130, a transmission gate 125, a transmission gate 135, an inverter 140, an inverter 146, an inverter 185 and a transmission gate 190. It should be noted that there may be various variations of the shifting circuit 150 from the embodiment shown in FIG. 2. The inverter 110 is coupled to the output of the multiplexer 260, and an output of the inverter 110 is connected to an input of the transmission gate 115. An inverted clock input (CLKZ) is provided to the transmission gate 115. The CLKZ may be provided by inverting the clock input CLK using an inverter 290. An output of the transmission gate 115 is connected a node 195. The inverter 130 is connected to the node 195. The transmission gate 125 is connected to an output of the inverter 130. Output of the transmission gate 125 is connected to an input of the inverter 120. The transmission gate 125 is connected to a clock signal (CLK). The output of the inverter 130 is also connected to a node 197. An input of the transmission gate 135 is connected to the node 197. An output of the transmission gate 135 is connected to the inverter 140 which is then connected to the node 145.

The data output buffer 440 includes a PMOS transistor 425 and an NMOS transistor 430 (comprising an inverter). The source of the transistor 425 is connected to a power supply voltage (for example, VDD) and the drain of the transistor 425 is connected to a node 435. The source of the transistor 430 is connected to a reference supply (or ground voltage, see, VSS) and the drain of the transistor 430 is connected to the node 435. The gates of both the transistors (425 and 430) are connected to the node 145. The data output terminal is connected to the node 310, from where the data output 'q' is taken. The scan output buffer 320 includes a PMOS transistor 302 and an NMOS transistor 304. Source of the transistor 302 is connected to the power supply voltage (Vdd) and drain of the transistor 302 is connected to the node 535. The gate of the transistor 302 is connected to the node 145. The source of the transistor 304 is connected to the drain of another NMOS transistor 306 and the drain of the transistor 304 is connected to the node 310. Gate of the transistor 306 is also connected to the node 145. Source of the transistor 306 is connected to the reference supply and the drain of the transistor 306 is connected to the source of the transistor 304. The gate of transistor 306 is connected to the scan enable input (SCAN). The transistor 306 is used to disable the direct path between VDD and VSS when SCAN is 0. Another PMOS transistor 308 is used to pull-up the scan output 'sq'. Source of the transistor 308 is connected to the power supply VDD and drain of the transistor 308 is connected to the node 310 (that is the scan output 'sq'). Gate of the transistor 308 is connected to scan enable input (SCAN). The scan output (sq) of the storage element 200 is taken from the node 310.

The operation of the storage element 200 is now explained. The multiplexer 260 causes a signal corresponding to one of the data input and the scan input 'sd', to be transferred at the node 362. As illustrated in the FIG. 2, when SCAN is logic 0, an inverse of the data input 'd' is transferred at the node 278, and when SCAN is logic 1, an inverse of the scan input 'sd' is transferred at the node 278. For explanation, if SCAN is logic 0, the pull-up path comprising the transistor 262 and 264 is enabled, and the pull-down path comprising the transistor 274 and 276 are enabled. Accordingly, the transistors 262, 264, 274 and 276 form an inverter configuration, and an inverted logic level of 'd' is transferred to the node 278. Assuming that is set to logic 1, then inverse of 'd', for example, logic 0 will then be available at the node 278. The shifting circuit 150 is configured to force a logic level at the node 145 that is the inverse of the value at the node 278. For example, output of the inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at node 197 (logic 0) to the inverter 120. The inverter 120 forces logic 1 on the node 195. Another transmission gate 135 in enabled when CLK becomes high and hence transfers the value at node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 440 (an inverter) inverts the value at the node 145 and force a logic 0 at the node 435. The data output 'q' is taken from the node 435 (that is the data output terminal) as inverse of the data input 'd'. In some other embodiments, another inverter may be added in the data output buffer 440 to get to the data output 'q' that is of same logic level as the data input 'd'. As SCAN is logic 0, the transistor 306 is disabled, which stops the data propagation to the node 310. At the same time the transistor 308 is enabled which then pulls up the node 310 to logic 1. The scan output terminal is coupled to the node 310. Accordingly, in functional mode (when SCAN is logic 0), the scan output 'sq' is tied to logic 1 (this may help in power reduction in functional mode due to combinational logic switching in scan path which is driven by the scan output terminal). The scan enable input (SCAN) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 1.

When SCAN is logic 1, the pull-up path comprising the transistor 266 and 268 is enabled, and the pull-down path comprising the transistor 270 and 272 are enabled. Accordingly, the transistors 266, 268, 270 and 272 form an inverter configuration, and an inverted logic level of 'sd' is transferred to the node 278. It should be further be noted that when SCAN is logic 1, the scan output buffer 320 acts as an inverter, as the transistor 308 is disabled and the transistors 302, 304 and 306 form an inverter configuration. The shifting circuit 150 is configured to force a logic level at the node 145 that is the inverse of the node 278. For instance, if the scan input 'sd' is logic 1, the node 278 is at logic 0, and the node 145 is at logic 1. The scan output buffer 320 then transfers logic 0 at the node 310 that is coupled to the scan output sq. Accordingly, inverse of the scan input 'sd' is transferred to the scan output 'sq' when the device (IC) operates in the shift mode.

Figure 3:
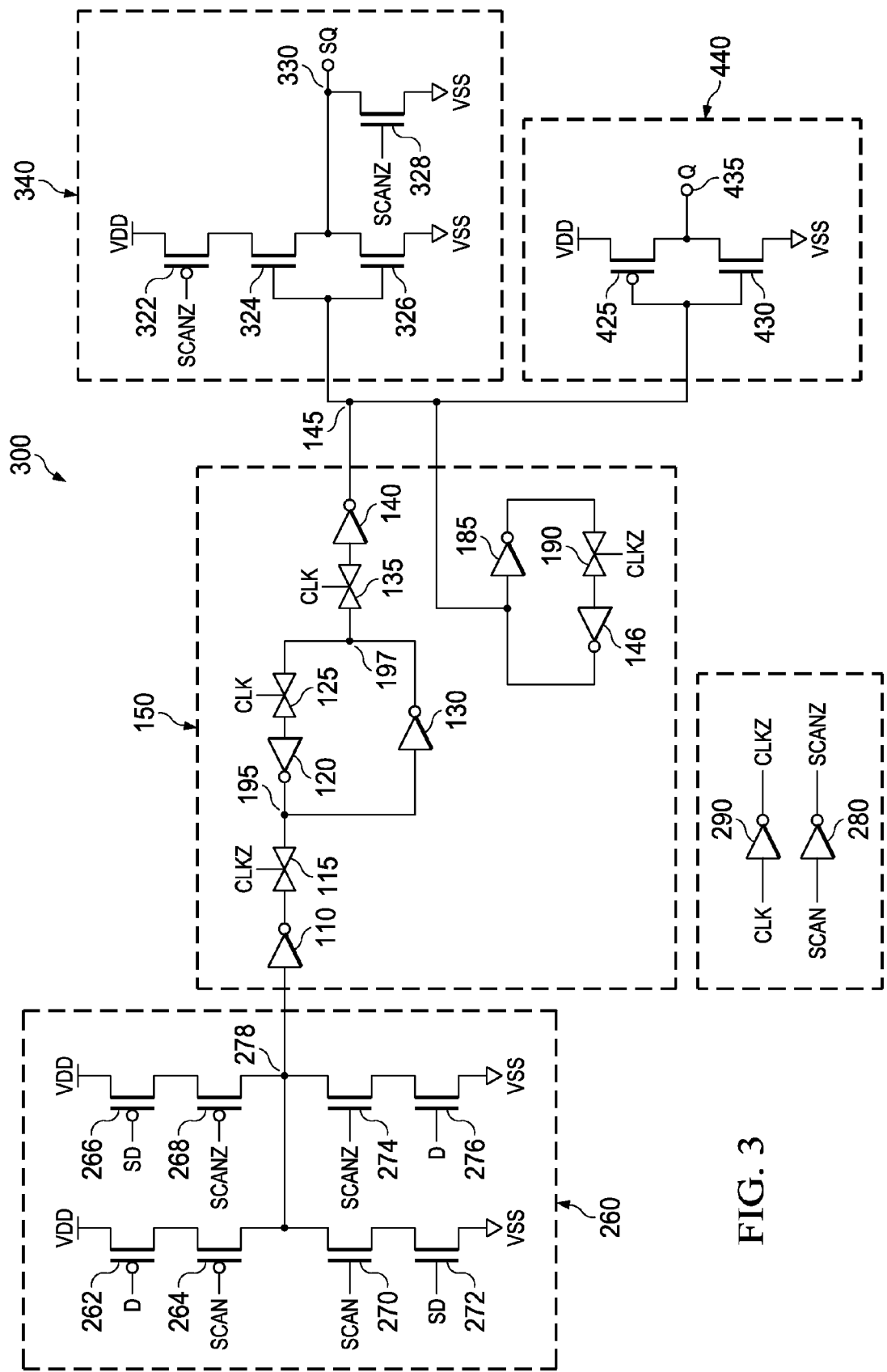
FIG. 3 illustrates a first scannable storage element of the scan chain with scan output pull-down in functional mode according to an embodiment.

FIG. 3 illustrates an example of the first storage element of the scan chain 100 according to another embodiment. For instance, the storage element 300 may be an example of the first scannable storage element $100_1$ of the scan chain 100. In this embodiment, the storage element 300 is configured such that a scan output of the storage element 300 is pull-down in functional mode in order to save power by disabling toggling of scan elements in an IC.

The storage element 300 includes a node 145 coupled to a scan output buffer such as a scan output buffer 340 for driving a scan output terminal. In this example embodiment, the node 145 is also coupled to data output buffer 440 for driving a data output terminal. The storage element 300 is configured to be selectively coupled to a data input terminal (for receiving a data input) and a scan input terminal (for receiving a scan input) in response to scan enable input. For instance, the storage element 300 includes a multiplexer 260 having the data input (see, 'd') and a scan input (see, 'sd'). A scan enable input (SCAN) acts as a select line for the multiplexer 260. The multiplexer 260 is configured by comprising eight MOS transistors, for example, PMOS transistors 262, 264, 266, 268, and NMOS transistors 270, 272, 274 and 276. An additional transistor 280 is also required for converting the SCAN to an inverted SCAN signal (SCANZ). The transistors 262 and 264 configure a first pull-up path between a power supply (see, VDD) and a node 278, where gate of the transistor 262 is connected to the data input 'd', and the gate of the transistor 262 is connected to the SCAN. The transistors 266 and 268 configure a second pull-up path between the VDD and the node 278, where gate of the transistor 266 is connected to the scan input 'sd', and the gate of the transistor 268 is connected to SCANZ. The transistors 270 and 272 configure a first pull-down path between the node 278 and the reference supply (VSS), where gate of the transistor 270 is connected to the SCAN, and the gate of the transistor 272 is connected to the scan input 'sd'. The transistors 274 and 276 configure a second pull-down path between the node 278 and VSS, where gate of the transistor 274 is connected to the SCANZ, and the gate of the transistor 276 is connected to the data input 'id'.

An output (the node 278) of the multiplexer 260 is connected to a shifting circuit 150 that is configured to provide a signal at the node 145 based on the output of the multiplexer 260. In the embodiment shown in the FIG. 3, the shifting circuit 150 includes one or more latches/flip-flops configured by an inverter 110, a transmission gate 115, an inverter 120, an inverter 130, a transmission gate 125, a transmission gate 135, an inverter 140, an inverter 146, an inverter 185 and a transmission gate 190. It should be noted that there may be various variations of the shifting circuit 150 from the embodiment shown in FIG. 2. The inverter 110 is coupled to the output of the multiplexer 260, and an output of the inverter 110 is connected to an input of the transmission gate 115. An inverted clock input (CLKZ) is provided to the transmission gate 115. An output of the transmission gate 115 is connected to a node 195. The inverter 130 is connected to the node 195. The transmission gate 125 is connected to an output of the inverter 130. Output of the transmission gate 125 is connected to an input of the inverter 120. The transmission gate 125 is connected to a clock signal (CLK). The output of the inverter 130 is also connected to a node 197. An input of the transmission gate 135 is connected to the node 197. An output of the transmission gate 135 is connected to the inverter 140 which is then connected to the node 145.

As also described in reference to FIG. 2, the data output buffer 440 includes the PMOS transistor 425 and the NMOS transistor 430 (comprising an inverter). The data output terminal is connected to the node 310, from where the data output 'q' is taken. The scan output buffer 340 includes PMOS transistors 322 and 324 and NMOS transistors 326 and 328. Source of the transistor 322 is connected to power supply voltage (Vdd) and drain of the transistor 322 is connected to source of the transistor 324. Drain of the transistor 324 is connected to the node 330 and also to the drain of the transistor 326. Gates of the transistor 324 and 326 are connected to the node 145, and gate of the transistor 322 is connected to SCANZ. Drain of the NMOS transistor 720 is connected to the node 330, and gate of the transistor 328 is connected to the SCANZ causing the transistor 328 to act as a pull-down transistor in the functional mode (when SCANZ is logic 1). Further, the transistor 322 is used to disable the direct path between VDD and VSS in the functional mode. It should be noted that in the shift mode (when SCANZ is logic 0), the transistor 428 is disabled; and the transistor 322 is enabled thereby providing a direct path VDD and VSS in the shift mode. Accordingly, in the shift mode, the transistors 322, 324 and 326 form an inverter configuration and provide an inverse of the value of the node 145 to the node 330.

The operation of the storage element 300 is now explained. The multiplexer 260 causes a signal corresponding to one of the data input 'd' and the scan input 'sd', to be transferred at the node 362. As illustrated in the FIG. 3, when SCAN is logic 0, an inverse of the data input 'd' is transferred at the node 278, and when SCAN is logic 1, an inverse of the scan input 'sd' is transferred at the node 278. For explanation, if SCAN is logic 0, the pull-up path comprising the transistor 262 and 264 is enabled, and the pull-down path comprising the transistor 274 and 276 are enabled. Accordingly, the transistors 262, 264, 274 and 276 form an inverter configuration, and an inverted logic level of is transferred to the node 278. Assuming that 'd' is set to logic 1, then inverse of 'd', for example, logic 0 will then be available at the node 278. The shifting circuit 150 is configured to force a logic level at the node 145 that is the inverse of the value at the node 278. For example, output of the inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at node 197 (logic 0) to the inverter 120. The inverter 120 forces logic 1 on the node 195. Another transmission gate 135 in enabled when CLK becomes high and hence transfers the value at node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 440 (an inverter) inverts the value at the node 145 and force a logic 0 at the node 435. The data output 'q' is taken from the node 435 (that is the data output terminal) as inverse of the data input 'd'. In some other embodiment, another inverter may be added in the data output buffer 440 to get to the data output 'q' that is same as data input 'd'. As SCAN is logic 0, the transistor 322 is disabled, which stops the data propagation to the node 330. At the same time the transistor 328 is enabled which then pulls-down the node 330 to logic 0. The scan output terminal is coupled to the node 330. Accordingly, in functional mode (when SCAN is logic 0), the scan output 'sq' is tied to logic 0 (this may help in power reduction in functional mode due to combinational logic switching in scan path which is driven by the scan output terminal). The scan enable input (SCAN) acts as a control signal, which decides whether to tie the scan output terminal 'sq' to logic 0 or not. Accordingly, when SCAN is logic 0, the data output 'q' follows the inverse of the data input 'd' and the scan output 'sq' is tied to logic 0.

When SCAN is logic 1, the pull-up path comprising the transistor 266 and 268 is enabled, and the pull-down path comprising the transistor 270 and 272 are enabled. Accordingly, the transistors 266, 268, 270 and 272 final an inverter configuration, and an inverted logic level of 'sd' is transferred to the node 278. It should be further be noted that when SCAN is logic 1, the scan output buffer 340 acts as an inverter, as the transistor 328 is disabled and the transistors 322, 324 and 326 form an inverter configuration. The shifting circuit 150 is configured to force a logic level at the node 145 that is the inverse of the node 278. For instance, if the scan input 'sd' is logic 1, the node 278 is at logic 0, and the node 145 is at logic 1. The scan output buffer 340 then transfers logic 0 at the node 310 that is coupled to the scan output 'sq'. Accordingly, inverse of the scan input 'sd' is transferred to the scan output 'sq' when the device (IC) operates in the shift mode.

As the scan output is either pull-up or pull-down in the first storage element $100_1$ of the scan chain 100, its logic state is fixed. Various embodiments of the present technology make use of the information to design input multiplexer circuit for the subsequent storage elements. Such designs of the input multiplexer circuits are capable of reducing the number of transistors in the storage elements, and are explained in reference to FIGS. 4 to 21. Further, various embodiments are also capable of gating one or both of the q and sq, and are explained in reference to FIGS. 4 to 21.

Figure 4:
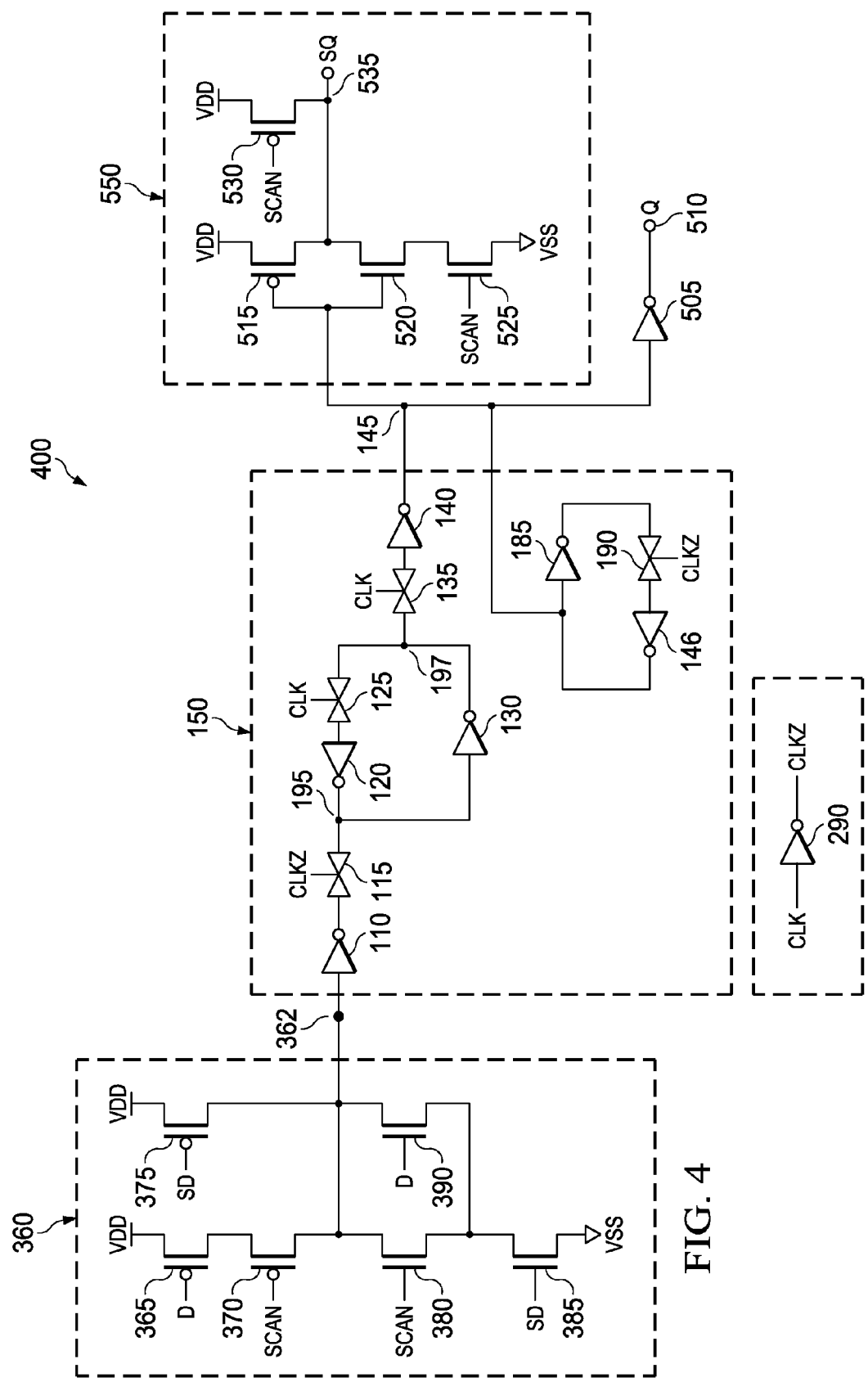
FIG. 4 illustrates a scannable storage element with scan output pull-up in functional mode according to an embodiment.

FIG. 4 illustrates an example of a storage element other than the first storage element of the scan chain 100 according to an embodiment. The storage element 400 may be an example of any of the storage elements $100_2$, $100_3$ ... or $100_n$, in cases where the scan input data 'sd' received by the storage element 400 is pull-up in the functional mode. For instance, the storage element 400 is utilized when the scan output 'sq' (that is coupled to the scan input 'sd' of the storage element 400) provided by a preceding storage element (of the storage element 400) is pull-up in the functional mode (when SCAN is logic 0). For example, when SCAN is logic 0, the scan input 'sd' is logic 1.

The storage element 400 includes a node 145 (a second node) coupled to a scan output buffer 550 for driving a scan output terminal 535. In this example embodiment, the node 145 is also coupled to data output buffer 505 for driving a data output terminal 510. In this embodiment, the data output buffer 505 is shown as an inverter. The storage element 400 includes an input circuit 360 that is configured to receive a data input (see, 'd') and a scan input (see, 'sd') from a data output 'q' and a scan output 'sq' of the preceding storage element, respectively. The input circuit 360 is configured to provide a signal (first signal) corresponding to one of the data input 'd' and the scan input 'sd', at a node 362 (first node). The input circuit 360 provides the signal at the node 362 based on a select signal such as the scan enable input (see, SCAN). The input circuit 360 includes pull-up components and pull-down components coupled to the node 362. For instance, the input circuit 360 includes two pull-up paths connected between the node 362 and the power supply (see, VDD), where the first pull-up path includes a first switch to receive the data input 'd' and a second switch to receive the scan enable input 'SCAN'. An example of the first switch may include a PMOS transistor 365 and an example of the second switch may include a PMOS transistor 370 as shown in the embodiment of FIG. 4, and they are coupled such that a drain of the PMOS transistor 365 is connected to a source of the PMOS transistor 370. The second pull-up path includes a third switch (for example, a PMOS transistor 375) to receive the scan input 'sd'. In this embodiment, gates of the PMOS transistors 365, 370 and 375 are connected to the data input 'd', the scan enable input 'SCAN' and the scan input 'sd', respectively, and sources of the PMOS transistors 370 and 375 are coupled with the node 362. The input circuit 360 further includes two pull-down paths connected between the node 362 and the reference supply (see, VSS) or ground supply. A first pull-down path includes a fourth switch to receive the scan enable input 'SCAN' and a fifth switch to receive the scan input 'sd'. An example of the fourth switch is a NMOS transistor 380 and an example of the fifth switch is a NMOS transistor 385, as shown in the embodiment of FIG. 4, and they are coupled such that a source of the NMOS transistor 380 is connected to a drain of the NMOS transistor 385. A second pull-down path includes a sixth switch to receive the data input 'd'. An example of the sixth switch may include an NMOS transistor 390 as shown in FIG. 4. Gates of the NMOS transistors 380, 385 and 390 are coupled with the scan enable input 'SCAN', the scan input 'sd' and the data input 'd', respectively, and drains of the NMOS transistors 380 and 390 are coupled with the node 362. The input circuit 360 is configured such that it requires only six transistors instead of ten transistors that are otherwise required in the input circuit 260, as the 'sd' input is fixed (for example, of logic 1) in the functional mode. Though, in the embodiments shown in FIG. 4, the first switch, the second switch, the third switch, the fourth switch, the fifth switch and the sixth switch are shown as PMOS or NMOS transistors, but they can also be configured using other components that are functionally analogous to the MOS transistors, such as BJT transistors, combinations of diodes, and the like.

An output (for example, the node 362) of the input circuit 360 is connected to the shifting circuit 150 that is configured to transfer a signal corresponding to the node 362 to the node 145. The shifting circuit 150 includes to the inverter 110 that takes input from the node 362 and an output of the inverter 110 is connected to the transmission gate 115. An inverted clock input CLKZ is given to the transmission gate 115. The transmission gate 115 is connected a node 195. An inverter 130 is connected to the node 195. Another transmission gate 125 is connected to an output of the inverter 130. Output of the transmission gate 125 is connected to an input of another inverter 120. The transmission gate 125 is connected to clock signal (see, CLK). The output of the inverter 130 is also connected to node 197. A transmission gate 135 is connected to the node 197. An output of the transmission gate 135 is connected to an inverter 140 which is then connected to the node 145. The input of the data output buffer 505 is connected to the node 145 and the output of the data output buffer 505 is connected to node 510 that is the data output terminal. The data output buffer 505 includes an inverter. The node 145 is connected to the inverter 185. The output of the inverter 185 is connected to a node 152, which then connects to a transmission gate 190. The transmission gate 190 is controlled by inverted clock signal CLKZ. The transmission gate 190 drives another inverter 146. The output of the inverter 146 is again connected to the node 145. The scan output buffer 550 includes an inverter configured by a PMOS transistor 515 and an NMOS transistor 520, a transistor 525 (third MOS transistor) and a transistor 530 (a fourth MOS transistor). Source of the transistor 515 is connected to power supply voltage (Vdd) and drain of the transistor 515 is connected to node 535. The gate of the transistor 515 is connected to the node 145. The source of the transistor 520 is connected to the drain of another NMOS transistor 525 and the drain of the transistor 520 is connected to the node 535. Gate of the transistor 525 (third MOS transistor) is also connected to the node 145. Source of the transistor 525 is connected to the ground voltage and drain of the transistor 525 is connected to the source of the transistor 520. The gate of transistor 525 is connected to the scan enable input (SCAN). The transistor 525 is used to disable the direct path between VDD and VSS when SCAN is 0. The transistor 530 (for example, a PMOS transistor) is used to pull-up the scan output 'sq'. Source of the transistor 530 is connected to the supply voltage and drain of the transistor 530 is connected to the node 535 (that is the scan output 'sq'). Gate of the transistor 530 is connected to scan enable input (SCAN). The scan output (sq) of the scannable storage element 400 is taken from the node 535.

The operation of the storage element 400 is now explained. The input circuit 360 causes a signal corresponding to one of the data input 'd' and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 400 is pull-up when the SCAN is logic 0, and this pull-up logic 1 is fed to the scan input 'sd' of the storage element 400. When the SCAN is logic 1, the scan input 'sd' may have either of logic 0 or logic 1 depending upon the test data and value as received from the preceding storage element. As illustrated in the FIG. 4, when SCAN is logic 0, an inverse of the data input 'd.' is transferred at the node 362, and when SCAN is logic 1, an inverse of the scan input 'sd' is transferred at the node 362.

For explanation, if SCAN is logic 0 (scan input 'sd' is logic 1), the transistor 375 and 380 are disabled, and the transistors 370 and 385 are enabled. Accordingly, the transistors 365, 370, 390 and 385 form an inverter configuration, and an inverted logic level of 'd' is transferred to the node 362. Assuming that 'd' is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at node 197 (logic 0) to the inverter 120. The inverter 120 forces logic 1 on the node 195. Another transmission gate 135 in enabled when CLK becomes high and hence transfers the value at node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 505 (an inverter) inverts the value at the node 145 and force a logic 0 at the node 410. The data output 'q' is taken from the node 510 (that is the data output terminal) as inverse of the data input 'd'. In some embodiments, there may be additional inverters added to the data output buffer 505 so as to receive the data output 'q' of same logic as the data input 'd'. As SCAN is logic 0, the transistor 525 is disabled, which stops the data propagation to the node 535. At the same time the transistor 530 is enabled which then pulls up the node 535 to logic 1. The scan output terminal is coupled to the node 535. Accordingly, in functional mode (when SCAN is logic 0), the scan output 'sq' is tied to logic 1 (this may help in power reduction in functional mode due to combinational logic switching in scan path which is driven by the scan output terminal). The scan enable input (SCAN) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 1. In some embodiments, there may be additional inverters added in the scan output buffer 550 so as to receive the scan output 'sq' of same logic as the scan input 'sd'.

When SCAN is logic 1, the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 550 acts as an inverter, as the transistor 530 is disabled and the transistors 515, 520 and 525 form an inverter configuration. The shifting circuit 150 is configured to force a logic level at the node 145 that is the inverse of the node 362. For instance, if the scan input 'sd' is logic 1 (provided the SCAN is logic 1), the node 362 is at logic 0, and the node 145 is at logic 1. The scan output buffer 550 then transfers logic 0 at the node 535 that is coupled to the scan output sq. Accordingly, inverse of the scan input 'sd' is transferred to the scan output 'sq' when the device (IC) operates in the shift mode.

Figure 5:
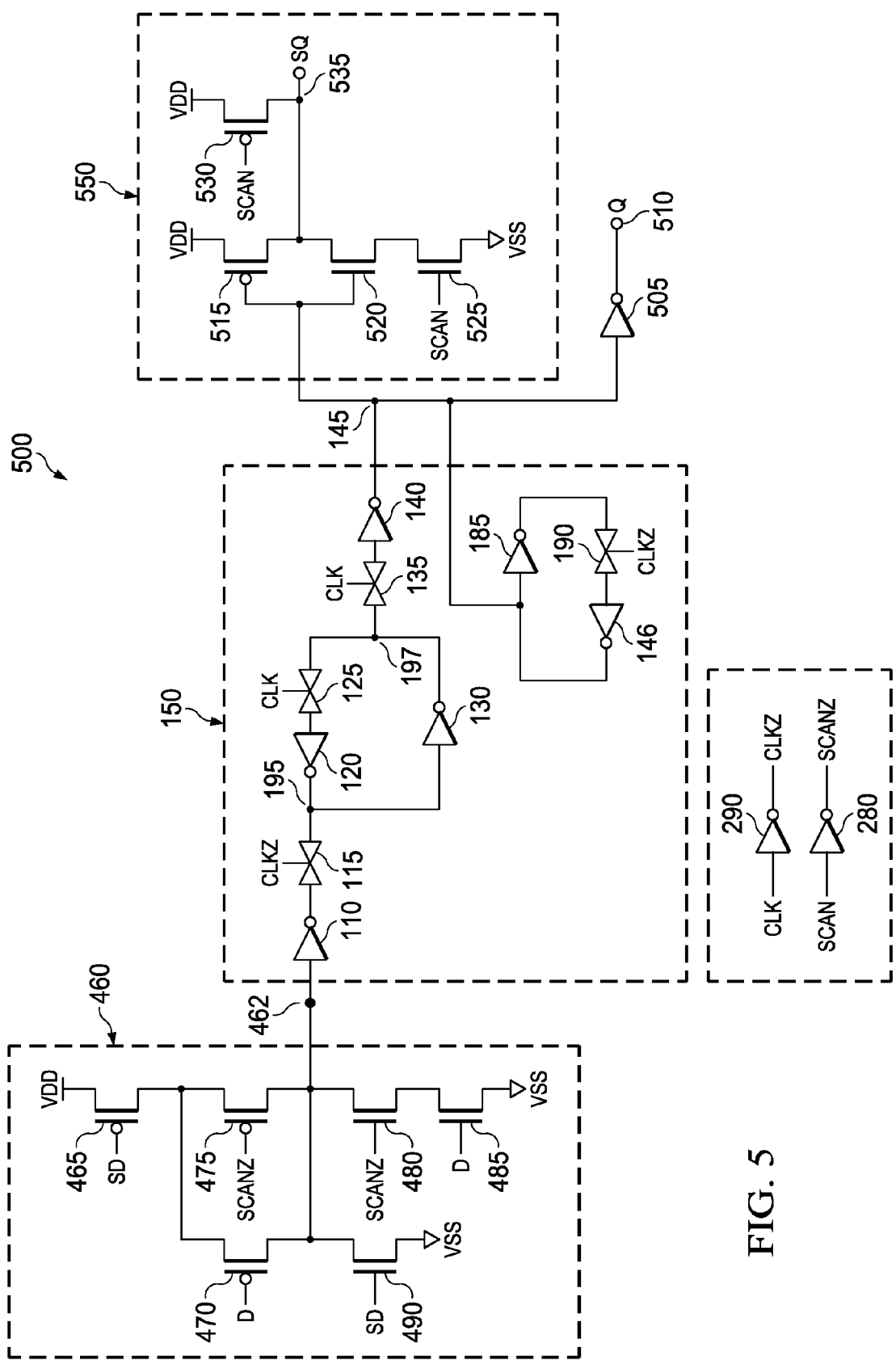
FIG. 5 illustrates a scannable storage element with scan output pull-up in functional mode according to another embodiment.

FIG. 5 illustrates an example of a storage element other than the first storage element of the scan chain 100 according to another embodiment. The storage element 500 may be an example of any of the storage elements $100_2, 100_3 \ldots$ or $100_n$, in cases where the scan input data 'sd' received by the storage element 500 is pull-down in the functional mode. For instance, the storage element 500 is utilized when the scan output 'sq' (that is coupled to the scan input 'sd' of the storage element 500) provided by a preceding storage element (of the storage element 500) is pull-down in the functional mode (when SCAN is logic 0). For example, when SCAN is logic 0, the scan input 'sd' is logic 0.

The storage element 500 includes a node 145 coupled to a scan output buffer 550 for driving a scan output terminal 535. In this example embodiment, the node 145 is also coupled to data output buffer 505 for driving a data output terminal 510. In this embodiment, the data output buffer 505 is shown as an inverter. The storage element 500 includes an input circuit 460 that is configured to receive a data input (see, 'd') and a scan input (see, 'sd') from a data output 'q' and a scan output 'sq' of the preceding storage element, respectively. The input circuit 460 is configured to provide a signal corresponding to one of the data input 'd' and the scan input 'sd', at a node 462 (the first node). The input circuit 460 provides the signal at the node 462 based on a select signal such as inverse scan enable input (see, SCANZ). The input circuit 460 includes pull-up components and pull-down components coupled to the node 462. For instance, the input circuit 460 includes two pull-up paths connected between the node 462 and the power supply (see, VDD), where the first pull-up path includes a first switch to receive the scan input 'sd' and a second switch to receive the data input 'd'. An example of the first switch may include a PMOS transistor 465 and an example of the second switch may include a PMOS transistor 470 as shown in the embodiment of FIG. 5, and they are coupled such that a drain of the PMOS transistor 465 is connected to a source of the PMOS transistor 470. The second pull-up path includes the first switch and a third switch to receive the inverted scan enable input (SCANZ). An example of the third switch may include a PMOS transistor 475. A source of the PMOS transistor 475 is connected to the drain of the PMOS transistor 465. Gates of the PMOS transistors 465, 470 and 475 are connected to the scan input 'sd', the data input 'd' and the inverse scan enable input 'SCANZ', respectively, and sources of the PMOS transistors 470 and 475 are coupled with the node 462. The input circuit 460 further includes two pull-down paths connected between the node 462 and the reference supply (see, VSS) or ground supply. A first pull-down path includes a fourth switch to receive the inverted scan enable input 'SCANZ' and a fifth switch to receive the data input 'd'. An example of the fourth switch may include a NMOS transistor 480 and an example of the fifth switch includes a NMOS transistor 485, and they are coupled such that a source of the NMOS transistor 380 is connected to a drain of the NMOS transistor 485. The second pull-down path includes a sixth switch to receive the scan input 'sd'. An example of the sixth switch may include a NMOS transistor 490. Gates of the NMOS transistors 480, 485 and 490 are coupled with SCANZ, the data input and the scan input 'sd', respectively, and drains of the NMOS transistors 480 and 490 are coupled with the node 462. In the embodiment shown in FIG. 5, the input circuit 460 is configured such that it requires only eight transistors instead of ten transistors that are otherwise required in the input circuit 260, as the 'sd' input is fixed (either of logic 0 or logic 1). It should be noted that in this embodiment, two additional transistors are required as compared to the embodiment described in reference to FIG. 4, as two transistors are required for generating the inverted scan enable input 'SCANZ'. Though, in the embodiments shown in FIG. 5, the first switch, the second switch, the third switch, the fourth switch, the fifth switch and the sixth switch are shown as PMOS or NMOS transistors, but they can also be configured using other components that are functionally analogous to the MOS transistors, such as BJT transistors, combinations of diodes, and the like.

An output (for example, the node 462) of the input circuit 460 is connected to the shifting circuit 150 that is configured to transfer a signal corresponding to the node 462 to the node 145. The shifting circuit 150 includes to the inverter 110 that takes input from the node 462 and an output of the inverter 110 is connected to the transmission gate 115. An inverted clock input CLKZ is given to the transmission gate 115. The transmission gate 115 is connected a node 195. The inverter 130 is connected to the node 195. Another transmission gate 125 is connected to an output of the inverter 130. Output of the transmission gate 125 is connected to an input of another inverter 120. The transmission gate 125 is connected to clock signal (see, CLK). The output of the inverter 130 is also connected to the node 197. A transmission gate 135 is connected to the node 197. An output of the transmission gate 135 is connected to the inverter 140 which is then connected to the node 145. The input of the data output buffer 505 is connected to the node 145 and the output of the data output buffer 505 is connected to node 510 (the data output terminal). The data output buffer 505 includes an inverter. The node 145 is connected to the inverter 185. The output of the inverter 185 is connected to the node 152, which then connects to a transmission gate 190. The transmission gate 190 is controlled by inverted clock signal CLKZ. The transmission gate 190 drives another inverter 146. The output of the inverter 146 is again connected to the node 145. The scan output buffer 550 includes PMOS transistors 515 and an NMOS transistor 520. Source of the transistor 515 is connected to power supply voltage (Vdd) and drain of the transistor 515 is connected to node 535. The gate of the transistor 515 is connected to the node 145. The source of the transistor 520 is connected to the drain of another NMOS transistor 525 and the drain of the transistor 520 is connected to the node 535. Gate of the transistor 525 is also connected to the node 145. Source of the transistor 525 is connected to the ground voltage and drain of the transistor 525 is connected to the source of the transistor 520. The gate of transistor 525 is connected to the scan enable input (SCAN). The transistor 525 is used to disable the direct path between VDD and VSS when SCAN is 0. Another PMOS transistor 530 is used to pull-up the scan output 'sq'. Source of the transistor 530 is connected to the supply voltage and drain of the transistor 530 is connected to the node 535 (that is the scan output 'sq'). Gate of the transistor 530 is connected to scan enable input (SCAN). The scan output (sq) of the scannable storage element 400 is taken from the node 535.

The operation of the storage element 500 is now explained. The input circuit 460 causes a signal corresponding to one of the data input 'd' and the scan input 'sd', to be transferred at the node 462. It should be noted that the scan input 'sd' is logic 0, when the SCAN is logic 0. For instance, a scan output 'sq' of the preceding storage element (such as the storage element 300) of the storage element 500 is pull-down when the SCAN is logic 0, and this pull-down logic 0 is fed to the scan input 'sd' of the storage element 500. When the SCAN is logic 1, the scan input 'sd' may have either of logic 0 or logic 1 depending upon the test data and value as received from the preceding storage element. As illustrated in the FIG. 5, when SCAN is logic 0, an inverse of the data input 'd' is transferred at the node 462, and when SCAN is logic 1 (or when SCANZ is logic 0), an inverse of the scan input 'sd' is transferred at the node 462.

For explanation, in functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that 'd' is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 110 of the shifting circuit 145. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at node 197 (logic 0) to the inverter 120. The inverter 120 forces logic 1 on the node 195. Another transmission gate 135 in enabled when CLK becomes high and hence transfers the value at node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 505 (an inverter) inverts the value at the node 145 and force a logic 0 at the node 510. The data output 'q' is taken from the node 510 (that is the data output terminal) as inverse of the data input 'd'. As SCAN is logic 0, the transistor 525 is disabled, which stops the data propagation to the node 535. At the same time the transistor 530 is enabled which then pulls up the node 535 to logic 1. The scan output terminal is coupled to the node 535. Accordingly, in functional mode (when SCAN is logic 0), the scan output 'sq' is tied to logic 1 (this may help in power reduction in functional mode due to combinational logic switching in scan path which is driven by the scan output terminal). The scan enable input (SCAN) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 1.

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 550 acts as an inverter, as the transistor 530 is disabled and the transistors 515, 520 and 525 form an inverter configuration. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 550 then transfers logic 0 at the node 535 that is coupled to the scan output 'sq'. Accordingly, inverted scan input 'sd' is transferred to the scan output 'sq' when the device operates in the shift mode.

Figure 6:
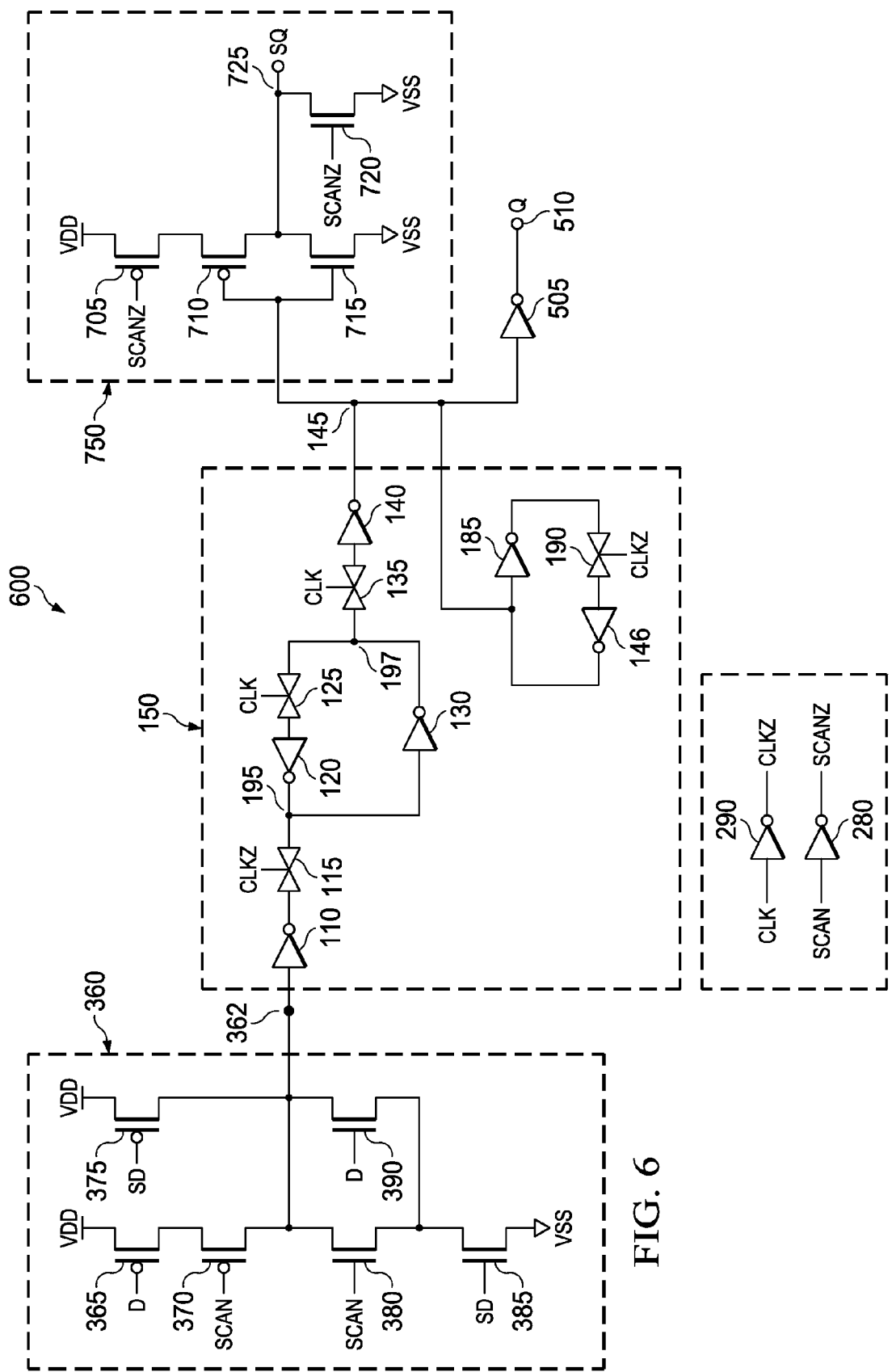
FIG. 6 illustrates a scannable storage element with scan output pull-down in functional mode according to an embodiment.

FIG. 6 illustrates an example of a storage element other than the first storage element of the scan chain 100 according to an embodiment. The storage element 600 may be an example of any of the storage elements $100_2, 100_3 \ldots$ or $100_n$, in cases where the scan input data 'sd' received by the storage element 600 is pull-up in the functional mode. For instance, the storage element 600 is utilized when the scan output 'sq' (that is coupled to the scan input 'sd' of the storage element 600) provided by a preceding storage element (of the storage element 600) is pull-up in the functional mode (when SCAN is logic 0). For example, when SCAN is logic 0, the scan input 'sd' is logic 1.

The storage element 600 includes a node 145 coupled to a scan output buffer 750 for driving a node 725 (scan output terminal). In this example embodiment, the node 145 is also coupled to data output buffer 505 for driving a data output terminal 510. In this embodiment, the data output buffer 505 is shown as an inverter. The storage element 600 includes the input circuit 360 that is configured to receive a data input (see, 'd') and a scan input (see, 'sd') from a data output 'q' and a scan output 'sq' of the preceding storage element, respectively. The input circuit 360 is already described in reference with the FIG. 4, and hence its description is not provided for the sake of brevity. The input circuit 360 is configured to provide a signal corresponding to one of the data input 'd' and the scan input 'sd', at the node 362.

An output (for example, the node 362) of the input circuit 360 is connected to the shifting circuit 150 that is configured to transfer a signal corresponding to the node 362 to the node 145. The input of the data output buffer 505 is connected to the node 145 and the output of the data output buffer 505 is connected to node 510 (the data output terminal). The data output buffer 505 includes an inverter. The scan output buffer 750 is also connected to the node 145. The scan output buffer 750 includes a PMOS transistor 705 (first MOS transistor), an inverter (comprising a PMOS transistor 710 and a NMOS transistors 715), and a NMOS transistor 720 (second MOS transistor). Source of the transistor 705 is connected to power supply voltage (Vdd) and drain of the transistor 705 is connected to source of the transistor 710. Drain of the transistor 710 is connected to the node 535 and also to the drain of the transistor 715. Gates of the transistor 710 and 715 are connected to the node 145, and gate of the transistor 705 is connected to SCANZ. Drain of the NMOS transistor 720 is connected to the node 535, and gate of the transistor 720 is connected to the SCANZ causing the transistor 720 to act as a pull-down transistor in functional mode (when SCANZ is logic 1). Further, the transistor 705 is used to disable the direct path between VDD and VSS in the functional mode. It should be noted that in the shift mode (when SCANZ is logic 0), the transistor 720 is disabled; and the transistor 705 is enabled thereby providing a direct path VDD and VSS in the shift mode. Accordingly, in the shift mode, the transistors 705, 710 and 715 form an inverter configuration and provide an inverse of the value of the node 145 to the node 725.

The operation of the storage element 600 is now explained. The input circuit 360 causes a signal corresponding to one of the data input 'd' and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 600 is pull-up when the SCAN is logic 0, and this pull-up logic 1 is fed to the scan input 'sd' of the storage element 600. When the SCAN is logic 1, the scan input 'sd' may have either of logic 0 or logic 1 depending upon the test data and value as received from the preceding storage element. As described in reference to FIG. 4, when SCAN is logic 0, an inverse of the data input 'd' is transferred at the node 362, and when SCAN is logic 1, an inverse of the scan input 'sd' is transferred at the node 362.

In functional mode (when SCAN is logic 0 or SCANZ is logic 1), the scan input 'sd' is logic 1, so the transistor 375 and 380 are disabled, and the transistors 370 and 385 are enabled. Accordingly, the transistors 365, 370, 390 and 385 form an inverter configuration, and an inverted logic level of is transferred to the node 362. Assuming that 'd' is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at node 197 (logic 0) to the inverter 120. The inverter 120 forces logic 1 on the node 195. Another transmission gate 135 in enabled when CLK becomes high and hence transfers the value at node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 505 (an inverter) inverts the value at the node 145 and force a logic 0 at the node 510. The data output 'q' is taken from the node 510 (that is the data output terminal) as inverse of the data input 'd'. As SCAN is logic 0, the transistor 705 is disabled, which stops the data propagation to the node 725. At the same time the transistor 720 is enabled which then pulls-down the node 725 to logic 0. The scan output terminal is coupled to the node 725. Accordingly, in functional mode (when SCAN is logic 0), the scan output 'sq' is tied to logic 0 (this may help in power reduction in functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input and the scan output 'sq' is tied to logic 0 (i.e., pull-down).

In shift mode (when SCAN is logic 1 or SCANZ is logic 0), the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 750 acts as an inverter, as the transistor 720 is disabled and the transistors 705, 710 and 715 form an inverter configuration. The shifting circuit 150 is configured to force a logic level at the node 145 that is the inverse of the node 362. For instance, if the scan input 'sd' is logic 1 (provided the SCAN is logic 1), the node 362 is at logic 0, and the node 145 is at logic 1. The scan output buffer 750 then transfers logic 0 at the node 725 that is coupled to the scan output 'sq.'. Accordingly, inverse of the scan input 'sd' is transferred to the scan output 'sq' when the IC operates in the shift mode.

Figure 7:
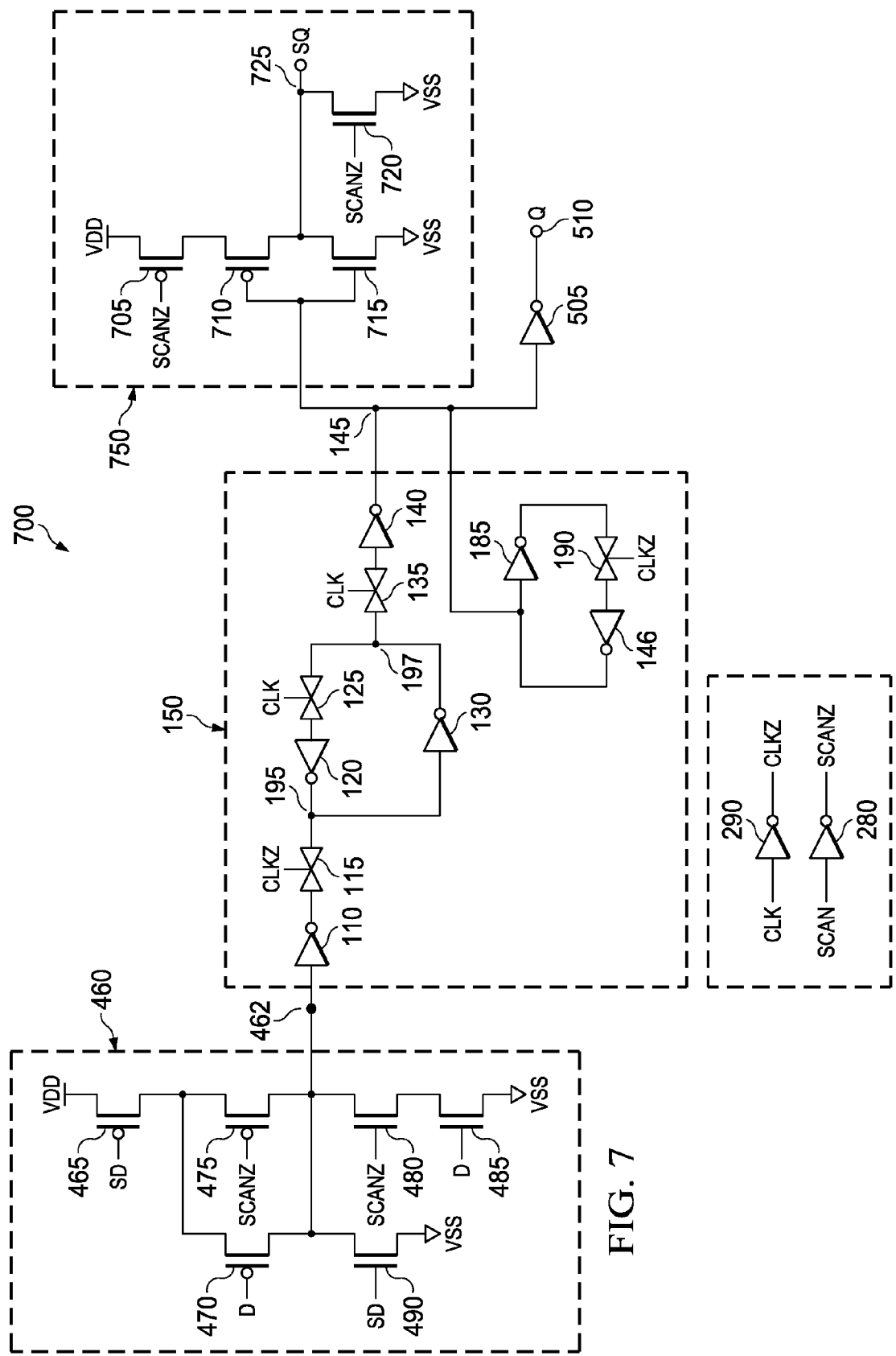
FIG. 7 illustrates a scannable storage element with scan output pull-down in functional mode according to another embodiment.

FIG. 7 illustrates an example of a storage element other than the first storage element of the scan chain 100 according to an embodiment. The storage element 700 may be an example of any of the storage elements $100_2$, $100_3$ ... or $100_n$, in cases where the scan input data 'sd' received by the storage element 700 is pull-down in the functional mode. For instance, the storage element 700 is utilized when the scan output 'sq' (that is coupled to the scan input 'sd' of the storage element 700) provided by a preceding storage element (of the storage element 700) is pull-down in the functional mode (when SCAN is logic 0). For example, when SCAN is logic 0, the scan input 'sd' is logic 0.

The storage element 700 includes a node 145 coupled to the scan output buffer 750 for driving the node 725 (the scan output terminal). In this example embodiment, the node 145 is also coupled to data output buffer 505 for driving a data output terminal 510. In this embodiment, the data output buffer 505 is shown as an inverter. The storage element 700 includes the input circuit 460 that is configured to receive a data input (see, 'd') and a scan input (see, 'sd') from a data output 'q' and a scan output 'sq' of the preceding storage element, respectively. The input circuit 460 is already described in reference with FIG. 5, and hence its description is not provided for the sake of brevity. The input circuit 460 is configured to provide a signal corresponding to one of the data input 'd' and the scan input 'sd', at the node 462. For instance, an inverse of the data input is provided at the node 462 in the shift mode (when SCANZ is logic 1), and an inverse of the scan input 'sd' is provided at the node 462 in the functional mode (when SCANZ is logic 0).

An output (for example, the node 462) of the input circuit 460 is connected to the shifting circuit 150 that is configured to transfer a signal corresponding to the node 462 to the node 145. The input of the data output buffer 505 is connected to the node 145 and the output of the data output buffer 505 is connected to node 510 (the data output terminal). The data output buffer 505 includes an inverter. The scan output buffer 750 is also connected to the node 145. In functional mode, the scan output buffer 750 is configured to pull-down the node 725, however, in the shift mode, the transistors 705, 710 and 715 form an inverter configuration (and the transistor 720 is disabled) providing an inverse of the value at the node 145 to the node 725.

The operation of the storage element 700 is now explained. The input circuit 460 causes a signal corresponding to one of the data input 'd' and the scan input 'sd', to be transferred at the node 462. It should be noted that in this embodiment, the scan input 'sd' is logic 0, when the SCAN is logic 0. For instance, a scan output 'sq' of a preceding storage element (such as the storage element 200) of the storage element 700 is pull-down when the SCAN is logic 0, and this pull-down logic 0 is fed to the scan input 'sd' of the storage element 700. When the SCAN is logic 1, the scan input 'sd' may have either of logic 0 or logic 1 depending upon the test data and value as received from the preceding storage element. As illustrated in the FIG. 7, when SCAN is logic 0, an inverse of the data input 'd' is transferred at the node 462, and when SCAN is logic 1, an inverse of the scan input 'sd' is transferred at the node 462.

For explanation, in functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 110 of the shifting circuit 145. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 505 (an inverter) inverts the value at the node 145 and force a logic 0 at the node 510. The data output 'q' is taken from the node 510 (that is the data output terminal) as inverse of the data input 'd'. As SCAN is logic 0, the transistor 705 is disabled, which stops the data propagation to the node 725. At the same time the transistor 720 is enabled which then pulls-down the node 725 to logic 0. The scan output terminal is coupled to the node 725. Accordingly, in functional mode (when SCAN is logic 0), the scan output 'sq' is tied to logic 0 (this may help in power reduction in functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 750 acts as an inverter, as the transistor 720 is disabled and the transistors 705, 710 and 715 form an inverter configuration. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 750 then transfers logic 0 at the node 725 that is coupled to the scan output 'sq'. Accordingly, inverse of the scan input 'sd' is transferred to the scan output 'sq' when the IC operates in the shift mode.

Figure 8:
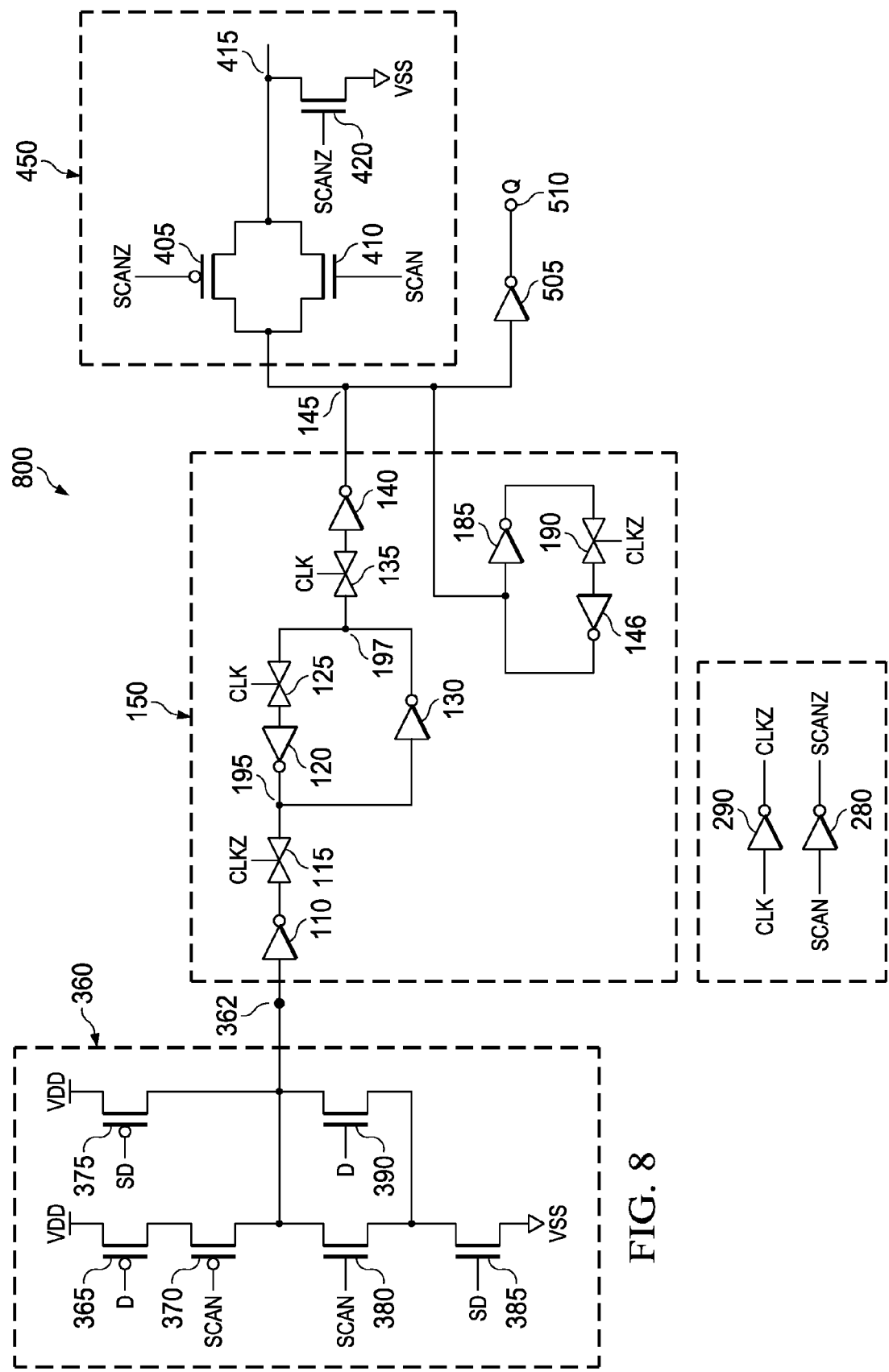
FIG. 8 illustrates a scannable storage element with scan output pull-down in functional mode according to another embodiment.

FIG. 8 illustrates an example of a storage element other than the first storage element of the scan chain 100 according to an embodiment. The storage element 800 may be an example of any of the storage elements $100_2$, $100_3$ ... or $100_n$, in cases where the scan input data 'sd' received by the storage element 800 is pull-up in the functional mode. For instance, the storage element 800 is utilized when the scan output 'sq' (that is coupled to the scan input 'sd' of the storage element 800) provided by a preceding storage element (of the storage element 800) is pull-up in the functional mode (when SCAN is logic 0). For example, when SCAN is logic 0, the scan input 'sd' is logic 1.

The storage element 800 includes the node 145 that is coupled to a scan output buffer 450 for driving a node 415 (scan output terminal). In this example embodiment, the node 145 is also coupled to data output buffer 505 for driving a node 510 (data output terminal). In this embodiment, the data output buffer 505 is shown as an inverter. The storage element 800 includes the input circuit 360 that is configured to receive a data input (see, 'd') and a scan input (see, 'sd') from a data output 'q' and a scan output 'sq' of the preceding storage element, respectively. The input circuit 360 is already described in reference with FIG. 4, and hence its description is not provided for the sake of brevity. The input circuit 360 is configured to provide a signal corresponding to one of the data input 'd' and the scan input 'sd', at the node 362. For instance, an inverse of the data input 'd' is provided at the node 362 in the shift mode (when SCANZ is logic 1), and an inverse of the scan input 'sd' is provided at the node 362 in the functional mode (when SCANZ is logic 0).

An output (for example, the node 362) of the input circuit 360 is connected to the shifting circuit 150 that is configured to transfer a signal corresponding to the node 362 to the node 145. The input of the data output buffer 505 is connected to the node 145 and the output of the data output buffer 505 is connected to node 510 (the data output terminal). The data output buffer 505 includes an inverter. The scan output buffer 450 is also connected to the node 145. The scan output buffer 450 includes a PMOS transistor 405 (fifth MOS transistor) and an NMOS transistor 410 (sixth MOS transistor) (forming a transmission gate) followed by a pull-down NMOS transistor 420 (seventh MOS transistor). Drains of the transistors 405 and 410 are connected to node 145. The sources of the transistors 405 and 410 are connected to the node 415. The gate of the transistor 405 is connected to inverted scan enable input (SCANZ). The gate of the transistor 410 is connected to scan enable input (SCAN). The source of the transistor 420 (third MOS transistor) is connected to the ground voltage and the drain of the transistor 420 is connected to node 415. The gate of the transistor 420 is connected to inverted scan enable input (SCANZ) causing the transistor 420 to act as a pull-down transistor in functional mode (when SCANZ is logic 1). During the functional mode, the transistors 405 and 410 are disabled. In the shift mode (when SCANZ is logic 0), the transistor 420 is disabled; and the transmission gate is enabled and provides the value at the node 145 to the node 415.

The operation of the storage element 800 is now explained. The input circuit 360 causes a signal corresponding to one of the data input and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 800 is pull-up when the SCAN is logic 0, and this pull-up logic 1 is fed to the scan input 'sd' of the storage element 800. When the SCAN is logic 1, the scan input 'sd' may have either of logic 0 or logic 1 depending upon the test data and value as received from the preceding storage element. As described in reference to FIG. 4, when SCAN is logic 0, an inverse of the data input 'd' is transferred at the node 362, and when SCAN is logic 1, an inverse of the scan input 'sd' is transferred at the node 362.

For explanation, if SCAN is logic 0 (scan input 'sd' is logic 1), the transistor 375 and 380 are disabled, and the transistors 370 and 385 are enabled. Accordingly, the transistors 365, 370, 390 and 385 form an inverter configuration, and an inverted logic level of 'd' is transferred to the node 362. Assuming that 'd' is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 505 (an inverter) inverts the value at the node 145 and force a logic 0 at the node 510. The data output 'q' is taken from the node 510 (that is the data output terminal) as inverse of the data input 'd'. As SCAN is logic 0, the transmission gate formed by the transistors 405 and 410 isolates the node 415 from the node 145. At the same time the transistor 420 is enabled which then pulls-down the node 415 to logic 0 irrespective of the clock signal CLK in functional mode. The scan output terminal is coupled to the node 415. Accordingly, in the functional mode (when SCAN is logic 0), the scan output 'sq' is tied to logic 0 (this may help in power reduction in the functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

When SCAN is logic 1, the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 450 acts as a transmission gate buffer, as the transistor 420 is disabled and the transmission gate formed by the transistors 405 and 410 transfers the value present at the node 145 to the node 415. The shifting circuit 150 is configured to force a logic level at the node 145 that is the inverse of the node 362. For instance, if the scan input 'sd' is logic 1 (provided the SCAN is logic 1), the node 362 is at logic 0, and the node 145 is at logic 1. The scan output buffer 450 then transfers logic 1 at the node 415 that is coupled to the scan output 'sq'. Accordingly, the scan input 'sd' is transferred to the scan output 'sq' when the IC operates in the shift mode.

Figure 9:
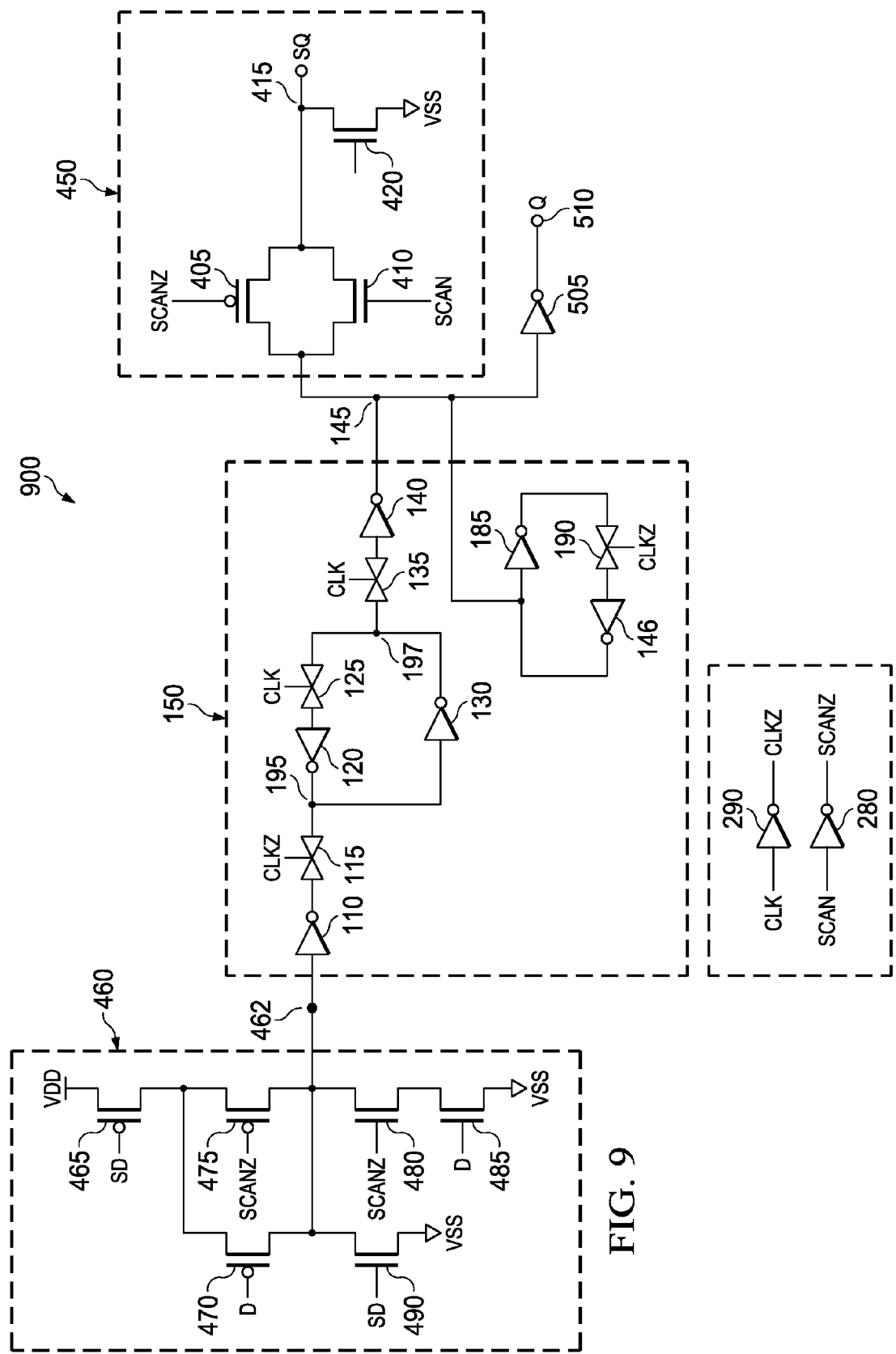
FIG. 9 illustrates a scannable storage element with scan output pull-down in functional mode according to an embodiment.

FIG. 9 illustrates an example of a storage element other than the first storage element of the scan chain 100 according to an embodiment. The storage element 900 may be an example of any of the storage elements $100_2$, $100_3$ ... or $100_n$, in cases where the scan input data 'sd' received by the storage element 900 is pull-down in the functional mode. For instance, the storage element 900 is utilized when the scan output 'sq' (that is coupled to the scan input 'sd' of the storage element 900) provided by a preceding storage element (of the storage element 900) is pull-down in the functional mode (when SCAN is logic 0). For example, when SCAN is logic 0, the scan input 'sd' is logic 1.

The storage element 900 includes the node 145 that is coupled to the scan output buffer 450 for driving the node 415 (scan output terminal). In this example embodiment, the node 145 is also coupled to the data output buffer 505 for driving the node 510 (data output terminal). In this embodiment, the data output buffer 505 is shown as an inverter. The storage element 700 includes the input circuit 460 that is configured to receive a data input (see, 'd') and a scan input (see, 'sd')

from a data output and a scan output 'sq' of the preceding storage element, respectively. The input circuit 460 is already described in reference with FIG. 5, and hence its description is not provided for the sake of brevity. The input circuit 460 is configured to provide a signal corresponding to one of the data input 'd' and the scan input 'sd', at the node 462. For instance, an inverse of the data input is provided at the node 462 in the functional mode (when SCANZ is logic 1), and an inverse of the scan input 'sd' is provided at the node 462 in the shift mode (when SCANZ is logic 0).

An output (for example, the node 462) of the input circuit 460 is connected to the shifting circuit 150 that is configured to transfer a signal corresponding to the node 462 to the node 145. The input of the data output buffer 505 is connected to the node 145 and the output of the data output buffer 505 is connected to node 510 (the data output terminal). The data output buffer 505 includes an inverter. The scan output buffer 450 is also connected to the node 145. As described in reference to FIG. 8, the scan output buffer 450 includes the PMOS transistor 405 (first MOS transistor) and the NMOS transistor 410 (second MOS transistor) (forming a transmission gate) followed by the pull-down NMOS transistor 420. The transistor 420 to act as a pull-down transistor in functional mode (when SCANZ is logic 1), as the transistors 405 and 410 are disabled in the functional mode. In the shift mode (when SCANZ is logic 0), the transistor 420 is disabled; and the transmission gate is enabled and provides the value at the node 145 to the node 415.

The operation of the storage element 900 is now explained. The input circuit 460 causes a signal corresponding to one of the data input 'd' and the scan input 'sd', to be transferred at the node 462. It should be noted that the scan input 'sd' is logic 0, when the SCAN is logic 0. For instance, a scan output 'sq' of a preceding storage element (such as the storage element 200) of the storage element 900 is pull-down when the SCAN is logic 0, and this pull-down logic 0 is fed to the scan input 'sd' of the storage element 900. When the SCAN is logic 1, the scan input 'sd' may have either of logic 0 or logic 1 depending upon the test data and value as received from the preceding storage element. As described in reference to FIG. 5, when SCAN is logic 0, an inverse of the data input 'd' is transferred at the node 462, and when SCAN is logic 1, an inverse of the scan input 'sd' is transferred at the node 462.

In functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that 'd' is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 110 of the shifting circuit 145. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 505 (an inverter) inverts the value at the node 145 and force a logic 0 at the node 510. The data output 'q' is taken from the node 510 (that is the data output terminal) as inverse of the data input 'd'. As SCAN is logic 0, the transmission gate formed by the transistors 405 and 410 isolates the node 415 from node 145. At the same time the transistor 420 is enabled which then pulls-down the node 415 to logic 0 irrespective of the clock signal CLK in functional mode. The scan output terminal is coupled to the node 415. Accordingly, in the functional mode (when SCAN is logic 0), the scan output 'sq' is tied to logic 0 (this may help in power reduction in the functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 450 acts as a transmission gate buffer, as the transistor 420 is disabled and the transmission gate formed by the transistors 405 and 410 transfers the value present at the node 145 to the node 415. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 450 then transfers logic 1 at the node 415 that is coupled to the scan output 'sq'. Accordingly, the scan input 'sd' is transferred to the scan output 'sq' when the IC operates in the shift mode.

Various embodiment of the present technology also provide pull-up and/or pull-down of both of the data output and the scan output, and these embodiments are further described in reference to FIGS. 10 to 21. For instance, in functional mode, the scan output 'sq' may be pull-up or pull-down, and in the shift mode, the data output 'd' may be pull-up or pull-down, thereby saving a greater power in the IC during these modes.

Figure 10:
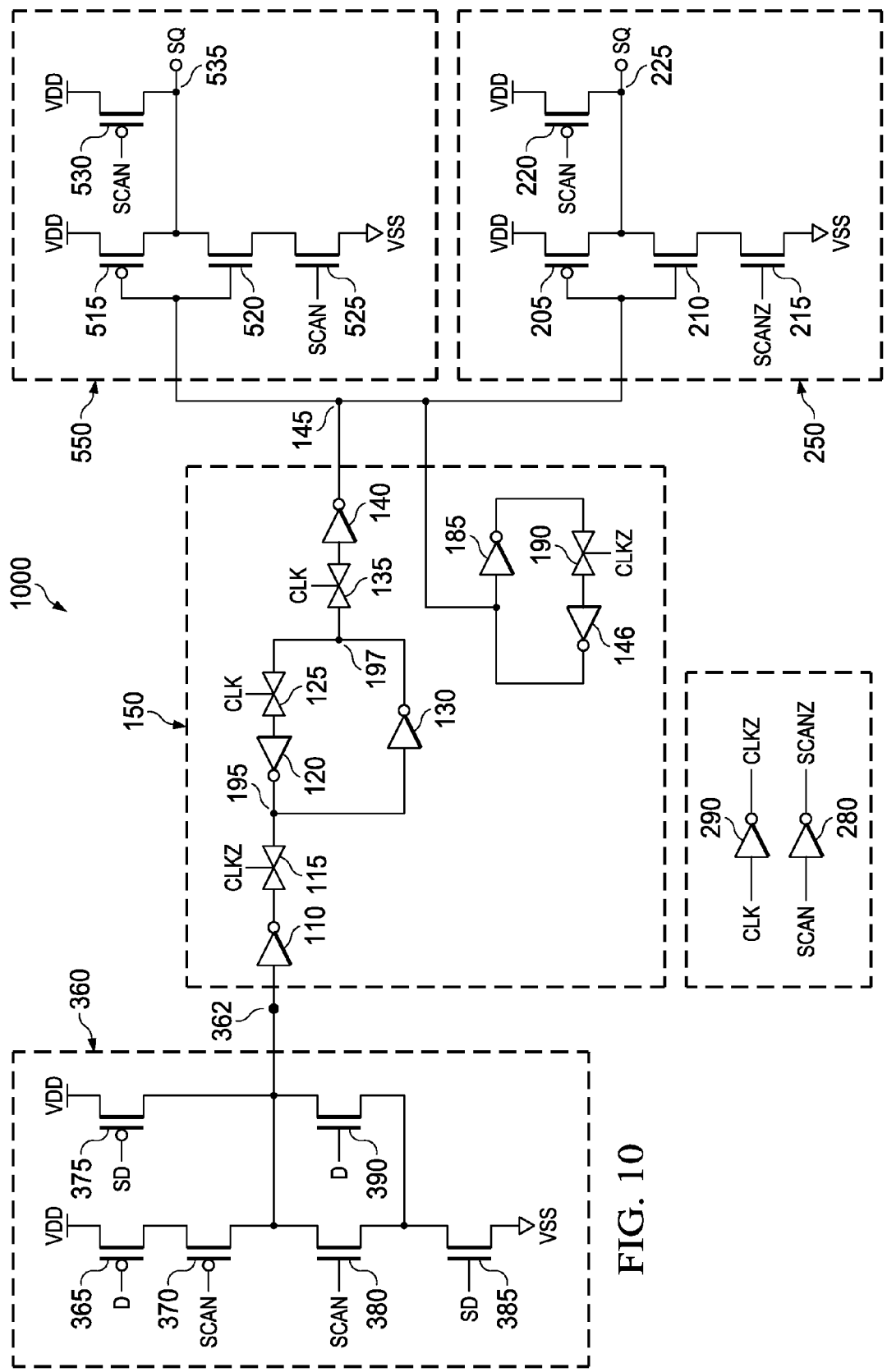
FIG. 10 illustrates a scannable storage element with scan output pull-up in functional mode and data output pull-up in shift mode according to an embodiment.

FIG. 10 illustrates an example of a storage element other than the first storage element of the scan chain 100 according to an embodiment. The storage element 1000 may be an example of any of the storage elements $100_2$, $100_3$ ... or $100_n$ in cases where the scan input data 'sd' received by the storage element 1000 is pull-up in the functional mode. For instance, the storage element 1000 is utilized when the scan output 'sq' (that is coupled to the scan input 'sd' of the storage element 1000) provided by a preceding storage element (of the storage element 1000) is pull-up in the functional mode (when SCAN is logic 0). For example, when SCAN is logic 0, the scan input 'sd' is logic 1.

The storage element 1000 includes a node 145 coupled to a scan output buffer 550 for driving a node 535 (scan output terminal). In this example embodiment, the node 145 is also coupled to a data output buffer 250 for driving a node 225 (data output terminal). The storage element 1000 includes the input circuit 360 that is configured to receive a data input (see, 'd') and a scan input (see, 'sd') from a data output 'q' and a scan output 'sq' of the preceding storage element, respectively. The input circuit 360 is already described in reference with the FIG. 4, and hence its description is not provided for the sake of brevity. The input circuit 360 is configured to provide a signal corresponding to one of the data input 'd' and the scan input 'sd', at the node 362. For instance, an inverse of the data input 'd' is provided at the node 362 in the shift mode (when SCAN is logic 1), and an inverse of the scan input 'sd' is provided at the node 362 in the functional mode (when SCANZ is logic 0).

An output (for example, the node 362) of the input circuit 360 is connected to the shifting circuit 150 that is configured to transfer a signal corresponding to the node 362 to the node 145. The input of the data output buffer 250 is connected to the node 145 and the output of the data output buffer 250 is connected to the node 225 (the data output terminal). The data output buffer 250 includes a PMOS transistor 205 and an NMOS transistor 210. The source of the transistor 205 is connected to power supply voltage and the drain of the transistor 205 is connected to the node 225. The gate of transistor 205 is connected to node 145. The source of the transistor 210 is connected to the drain of another NMOS transistor 215 (eighth MOS transistor) and the drain of the transistor 210 is connected to the node 225. The gate of transistor 210 is also connected to the node 145. The source of the transistor 215 is connected to the ground voltage and the drain of the transistor 215 is connected to the source of the transistor 210. The gate of transistor 215 is connected to inverted scan enable input (SCANZ). The transistor 215 is used to disable VDD to VSS direct path when SCAN is 1. Another PMOS transistor 220 (ninth MOS transistor) is used to pull-up the data output terminal q. The source of the transistor 220 is connected to the supply voltage and drain of the transistor 220 is connected to the node 225 (data output terminal q). The gate of the transistor 220 is connected to inverted scan enable input (SCANZ). Data output (q) of the storage element 1000 is taken from the node 225. The scan output buffer 550 is also connected to the node 145. In functional mode, the scan output buffer 550 is configured to pull-up the node 550. In the shift mode, the transistors 515, 520 and 525 form an inverter configuration (and the transistor 530 is disabled) providing an inverse of the value at the node 145 to the node 535.

The operation of the storage element 1000 is now explained. The input circuit 360 causes a signal corresponding to one of the data input 'd' and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 1000 is pull-up when the SCAN is logic 0, and this pull-up logic 1 is fed to the scan input 'sd' of the storage element 1000. When the SCAN is logic 1, the scan input 'sd' may have either of logic 0 or logic 1 depending upon the test data and value as received from the preceding storage element. As described in reference to FIG. 4, when SCAN is logic 0, an inverse of the data input 'd' is transferred at the node 362, and when SCAN is logic 1, an inverse of the scan input 'sd' is transferred at the node 362.

In functional mode (when SCAN is logic 0 or SCANZ is logic 1), the scan input 'sd' is logic 1, so the transistor 375 and 380 are disabled, and the transistors 370 and 385 are enabled. Accordingly, the transistors 365, 370, 390 and 385 form an inverter configuration, and an inverted logic level of 'd' is transferred to the node 362. Assuming that is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 250 inverts the value at the node 145 and forces a logic 0 at the node 225. As SCAN is logic 0, the transistor 220 is disabled, and the transistors 205, 210 and 215 form an inverter configuration, thereby transferring the inverted value of the node 145 (for example, a logic 0) at the node 225. The data output 'q' is taken from the node 225 (that is the data output terminal) as inverse of the data input 'd'. As SCAN is logic 0, the transistor 525 is disabled, which stops the data propagation to the node 535. At the same time the transistor 530 is enabled which then pulls up the node 535 to logic 1. The scan output terminal is coupled to the node 535. Accordingly, in functional mode (when SCAN is logic 0), the scan output 'sq' is tied to logic 1 (this may help in power reduction in functional mode due to combinational logic switching in scan path which is driven by the scan output terminal). The scan enable input (SCAN) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 1.

In shift mode (when SCAN is logic 1 or SCANZ is logic 0), the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 550 acts as an inverter, as the transistor 530 is disabled and the transistors 515, 520 and 525 form an inverter configuration. The shifting circuit 150 is configured to force a logic level at the node 145 that is the inverse of the node 362. For instance, if the scan input 'sd' is logic 1 (provided the SCAN is logic 1), the node 362 is at logic 0, and the node 145 is at logic 1. The scan output buffer 550 then transfers logic 0 at the node 535 that is coupled to the scan output 'sq'. Accordingly, inverted scan input 'sd' is transferred to the scan output 'sq' when the device operates in the shift mode. As SCAN is logic 1, the transistor 215 is disabled causing disabling the inverter comprised by transistors 205 and 210. The transistor 220 is enabled and pulls-up the node 225 (the data output terminal q) in response to SCANZ being logic 0. It is noted that transistor 215 is configured to protect leakage current through the inverter (formed by the transistors 205 and 210) when the data output terminal (the node 225) is pull-up.

In shift mode, the data output 'q' is tied to logic 1 (this will help in power reduction in shift mode due to combinational logic switching which is driven by data output terminal). The scan enable input (SCAN) acts as a control signal, which decides whether to tie the data output terminal 'q' to logic 1 or not. When SCAN is 0, the data output 'q' follows the inversion of the data input 'd' and the scan output 'sq' is tied to logic 1. When SCAN is logic 1, the data output q is tied to logic 1 and the scan output 'sq' follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 11:
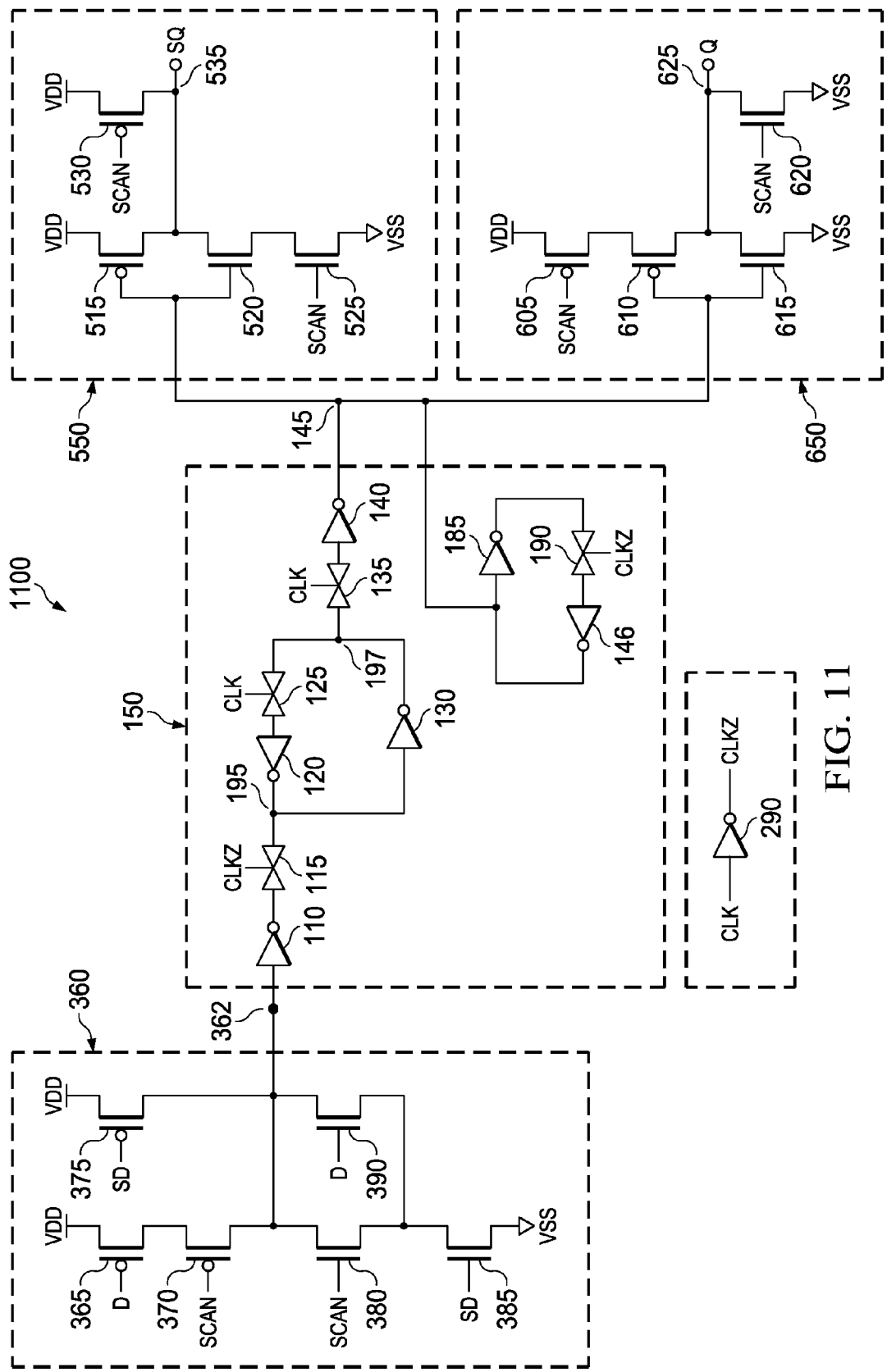
FIG. 11 illustrates a scannable storage element with scan output pull-up in functional mode and data output pull-down in shift mode according to an embodiment.

FIG. 11 illustrates an example of a storage element other than the first storage element of the scan chain 100 according to an embodiment. The storage element 1100 may be an example of any of the storage elements $100_2, 100_3 \ldots$ or $100_n$, in cases where the scan input data 'sd' received by the storage element 1100 is pull-up in the functional mode. For instance, the storage element 1100 is utilized when the scan output 'sq' (that is coupled to the scan input 'sd' of the storage element 1100) provided by a preceding storage element (of the storage element 1100) is pull-up in the functional mode (when SCAN is logic 0). For example, when SCAN is logic 0, the scan input 'sd' is logic 1.

The storage element 1100 includes a node 145 coupled to a scan output buffer 550 for driving a node 535 (scan output terminal). In this example embodiment, the node 145 is also coupled to a data output buffer 650 for driving a node 625 (data output terminal). The storage element 1100 includes the input circuit 360 that is configured to receive a data input (see, V) and a scan input (see, 'sd') from a data output 'q' and a scan output 'sq' of the preceding storage element, respectively. The input circuit 360 is configured to provide a signal corresponding to one of the data input 'd' and the scan input 'sd', at the node 362. For instance, an inverse of the data input is provided at the node 362 in the shift mode (when SCAN is logic 1), and an inverse of the scan input 'sd' is provided at the node 362 in the functional mode (when SCANZ is logic 0).

An output (for example, the node 362) of the input circuit 360 is connected to the shifting circuit 150 that is configured to transfer a signal corresponding to the node 362 to the node 145. The input of the data output buffer 650 is connected to the node 145 and the output of the data output buffer 650 is connected to the node 625 (the data output terminal). The data output buffer 650 also includes a PMOS transistor 610 and an NMOS transistor 615. The source of the transistor 610 is connected to the drain of another PMOS transistor 605 (sixteenth MOS transistor) and the drain of the transistor 610 is connected to the node 625. The gate of the transistor 610 is connected to node 145. The source of the transistor 620 is connected to the ground voltage and the drain of the transistor 620 is connected to the node 625. The gate of transistor 620 is also connected to node 145. The source of the transistor 605 is connected to the power supply voltage and the drain of the transistor 605 is connected to the source of the transistor 610. The gate of transistor 605 is connected to the scan enable input (SCAN). Transistor 605 is used to disable the direct path between VDD and VSS when SCAN is 1. Another NMOS transistor 620 (sixteenth MOS transistor) is used to pull-down the node 625 (the data output terminal). The source of the transistor 620 is connected to the ground voltage and drain of the transistor 620 is connected to the node 625. The gate of the transistor 620 is connected to SCAN. Data output (q) of the scannable storage element 1100 is taken from node 625. The scan output buffer 550 is also connected to the node 145. In functional mode, the scan output buffer 550 is configured to pull-up the node 550. In the shift mode, the transistors 515, 520 and 525 form an inverter configuration (and the transistor 530 is disabled) providing an inverse of the value of the node 145 to the node 535.

The operation of the storage element 1100 is now explained. The input circuit 360 causes a signal corresponding to one of the data input 'd' and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 1100 is pull-up when the SCAN is logic 0, and this pull-up logic 1 is fed to the scan input 'sd' of the storage element 1100. When the SCAN is logic 1, the scan input 'sd' may have either of logic 0 or logic 1 depending upon the test data and value as received from the preceding storage element. As described in reference to FIG. 4, when SCAN is logic 0, an inverse of the data input 'd' is transferred at the node 362, and when SCAN is logic 1, an inverse of the scan input 'sd' is transferred at the node 362.

In functional mode (when SCAN is logic 0 or SCANZ is logic 1), the scan input 'sd' is logic 1, so the transistor 375 and 380 are disabled, and the transistors 370 and 385 are enabled. Accordingly, the transistors 365, 370, 390 and 385 form an inverter configuration, and an inverted logic level of 'd' is transferred to the node 362. Assuming that is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 650 inverts the value at the node 145 and forces a logic 0 at the node 625. As SCAN is logic 0, the transistor 620 is disabled, and the transistors 605, 610 and 615 form an inverter configuration, thereby transferring the inverted value of the node 145 (for example, a logic 0) at the node 625. The data output 'q' is taken from the node 625 (that is the data output terminal) as inverse of the data input 'd'. As SCAN is logic 0, the transistor 525 is disabled, which stops the data propagation to the node 535. At the same time the transistor 530 is enabled which then pulls up the node 535 to logic 1. The scan output terminal is coupled to the node 535. Accordingly, in functional mode (when SCAN is logic 0), the scan output 'sq' is tied to logic 1 (this may help in power reduction in functional mode due to combinational logic switching in scan path which is driven by the scan output terminal). The scan enable input (SCAN) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 1.

In shift mode (when SCAN is logic 1 or SCANZ is logic 0), the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 550 acts as an inverter, as the transistor 530 is disabled and the transistors 515, 520 and 525 form an inverter configuration. The shifting circuit 150 is configured to force a logic level at the node 145 that is the inverse of the node 362. For instance, if the scan input 'sd' is logic 1 (provided the SCAN is logic 1), the node 362 is at logic 0, and the node 145 is at logic 1. The scan output buffer 550 then transfers logic 0 at the node 535 that is coupled to the scan output 'sq'. Accordingly, inverted scan input 'sd' is transferred to the scan output 'sq' when the device operates in the shift mode. As SCAN is logic 1, the transistor 605 is disabled causing disabling the inverter comprised by transistors 605 and 610. The transistor 620 is enabled and pulls down the node 625 (the data output terminal q) in response to SCAN. It is noted that transistor 605 is configured to protect leakage current through the inverter (formed by the transistors 610 and 615) when the data output terminal 625 is pull-down.

In shift mode, the data output 'q' is tied to logic 0 (this will help in power reduction in shift mode due to combinational logic switching which is driven by data output terminal). The scan enable input (SCAN) acts as a control signal, which decides whether to tie the data output terminal 'q' to logical or not. When SCAN is 0, the data output 'q' follows the inversion of the data input and the scan output 'sq' is tied to logic 1. When SCAN is logic 1, the data output q is tied to logic 0 and the scan output 'sq' follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 12:
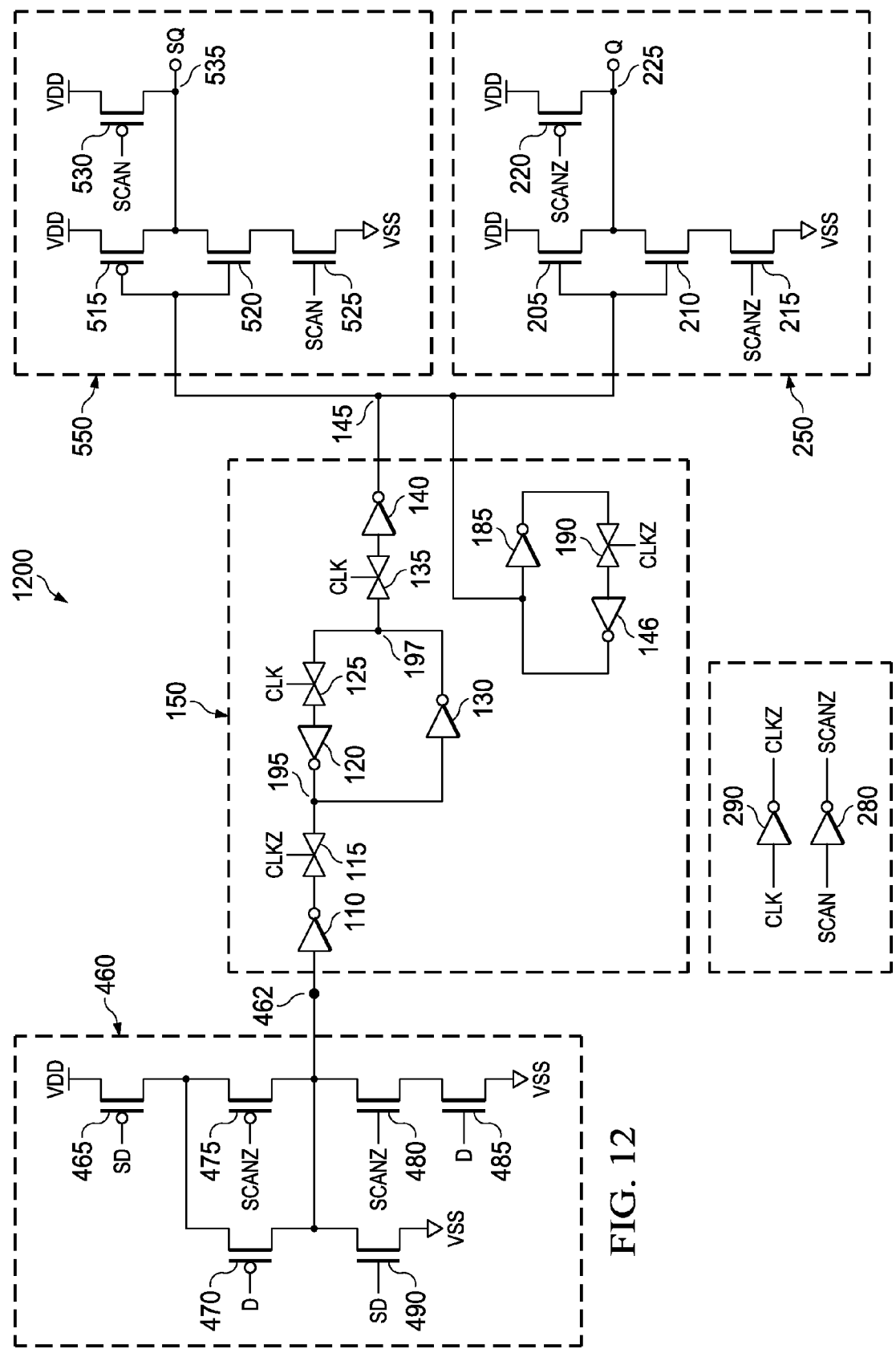
FIG. 12 illustrates a scannable storage element with scan output pull-up in functional mode and data output pull-up in shift mode according to another embodiment.

FIG. 12 illustrates an example of a storage element other than the first storage element of the scan chain 100 according to an embodiment. The storage element 1200 may be an example of any of the storage elements $100_2$, $100_3$ ... or $100_n$, in cases where the scan input data 'sd' received by the storage element 1200 is pull-down in the functional mode. For instance, the storage element 1200 is utilized when the scan output 'sq' (that is coupled to the scan input 'sd' of the storage element 1200) provided by a preceding storage element (of the storage element 1200) is pull-down in the functional mode (when SCAN is logic 0). For example, when SCAN is logic 0, the scan input 'sd' is logic 1.

The storage element 1200 includes a node 145 coupled to a scan output buffer 550 for driving a node 535 (scan output terminal). In this example embodiment, the node 145 is also coupled to a data output buffer 250 for driving a node 225 (data output terminal). The storage element 1200 includes the input circuit 460 that is configured to receive a data input (see, 'd') and a scan input (see, 'sd') from a data output 'q' and a scan output 'sq' of the preceding storage element, respectively. The input circuit 460 is configured to provide a signal corresponding to one of the data input 'd' and the scan input 'sd', at the node 462. For instance, an inverse of the data input 'd' is provided at the node 462 in the shift mode (when SCANZ is logic 1), and an inverse of the scan input 'sd' is provided at the node 462 in the functional mode (when SCANZ is logic 0).

An output (for example, the node 462) of the input circuit 460 is connected to the shifting circuit 150 that is configured to transfer a signal corresponding to the node 462 to the node 145. The input of the data output buffer 250 is connected to the node 145 and the output of the data output buffer 250 is connected to the node 225 (the data output terminal). Data output (q) of the storage element 1200 is taken from the node 225. The scan output buffer 550 is also connected to the node 145. In functional mode, the scan output buffer 550 is configured to pull-up the node 535. In the shift mode, the transistors 515, 520 and 525 form an inverter configuration (and the transistor 530 is disabled) providing an inverse of the value of the node 145 to the node 535.

The operation of the storage element 1200 is now explained. The input circuit 460 causes a signal corresponding to one of the data input 'd' and the scan input 'sd', to be transferred at the node 462. It should be noted that in this embodiment, the scan input 'sd' is logic 0, when the SCAN is logic 0. For instance, a scan output 'sq' of a preceding storage element (such as the storage element 300) of the storage element 1200 is pull-down when the SCAN is logic 0, and this pull-down logic 0 is fed to the scan input 'sd' of the storage element 1200. When the SCAN is logic 1, the scan input 'sd' may have either of logic 0 or logic 1 depending upon the test data and value as received from the preceding storage element. As illustrated in the FIG. 12, when SCAN is logic 0, an inverse of the data input 'd' is transferred at the node 462, and when SCAN is logic 1, an inverse of the scan input 'sd' is transferred at the node 462.

In functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that 'd' is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 120 of the shifting circuit 145. When CLK is low the transmission gate 125 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 250 inverts the value at the node 145 and forces a logic 0 at the node 225. As SCAN is logic 0, the transistor 220 is disabled, and the transistors 205, 210 and 215 form an inverter configuration, thereby transferring the inverted value of the node 145 (for example, a logic 0) at the node 225. The data output 'q' is taken from the node 225 (that is the data output terminal) as inverse of the data input 'd'. As SCAN is logic 0, the transistor 525 is disabled, which stops the data propagation to the node 535. At the same time the transistor 530 is enabled which then pulls up the node 535 to logic 1. The scan output terminal is coupled to the node 535. Accordingly, in functional mode (when SCAN is logic 0), the scan output 'sq' is tied to logic 1 (this may help in power reduction in functional mode due to combinational logic switching in scan path which is driven by the scan output terminal). The scan enable input (SCAN) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 1.

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 550 acts as an inverter, as the transistor 530 is disabled and the transistors 515, 520 and 525 form an inverter configuration. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 550 then transfers logic 0 at the node 535 that is coupled to the scan output 'sq'. Accordingly, inverted scan input 'sd' is transferred to the scan output 'sq' when the device operates in the shift mode. As SCAN is logic 1, the transistor 215 is disabled causing disabling the inverter comprised by transistors 205 and 210. The transistor 220 is enabled and pulls-up the node 225 (the data output terminal q) in response to SCANZ being logic 0. It is noted that transistor 215 is configured to protect leakage current through the inverter (formed by the transistors 205 and 210) when the data output terminal (the node 225) is pull-up.

In shift mode, the data output 'q' is tied to logic 1 (this will help in power reduction in shift mode due to combinational logic switching which is driven by data output terminal). The scan enable input (SCAN) acts as a control signal, which decides whether to tie the data output terminal 'q' to logic1 or not. When SCAN is 0, the data output 'q' follows the inversion of the data input and the scan output 'sq' is tied to logic 1. When SCAN is logic 1, the data output q is tied to logic 1 and the scan output 'sq' follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 13:
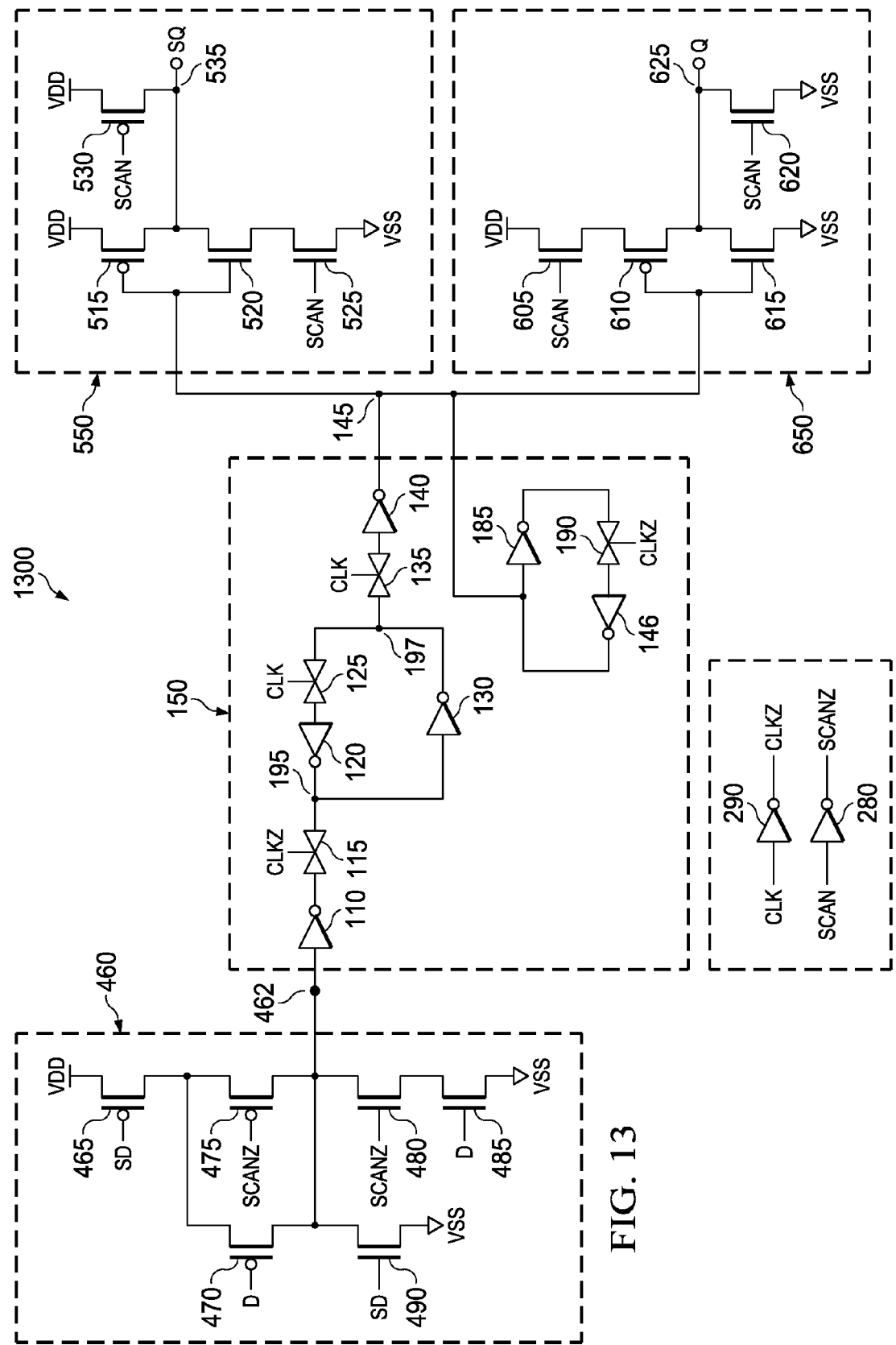
FIG. 13 illustrates a scannable storage element with scan output pull-up in functional mode and data output pull-down in shift mode according to an embodiment.

FIG. 13 illustrates an example of a storage element other than the first storage element of the scan chain 100 according to an embodiment. The storage element 1300 may be an example of any of the storage elements $100_2$, $100_3$ ... or $100_n$, in cases where the scan input data 'sd' received by the storage element 1300 is pull-down in the functional mode. For instance, the storage element 1300 is utilized when the scan output 'sq' (that is coupled to the scan input 'sd' of the storage element 1300) provided by a preceding storage element (of the storage element 1300) is pull-down in the functional mode (when SCAN is logic 0). For example, when SCAN is logic 0, the scan input 'sd' is logic 1.

The storage element 1300 includes a node 145 coupled to a scan output buffer 550 for driving a node 535 (scan output terminal). In this example embodiment, the node 145 is also coupled to the data output buffer 650 for driving the node 625 (data output terminal). The storage element 1300 includes the input circuit 460 that is configured to receive a data input (see, 'd') and a scan input (see, 'sd') from a data output 'q' and a scan output 'sq' of the preceding storage element, respectively. The input circuit 460 is configured to provide a signal corresponding to one of the data input 'd' and the scan input 'sd', at the node 462. For instance, an inverse of the data input is provided at the node 462 in the shift mode (when SCANZ is logic 1), and an inverse of the scan input 'sd' is provided at the node 462 in the functional mode (when SCANZ is logic 0).

An output (for example, the node 462) of the input circuit 460 is connected to the shifting circuit 150 that is configured to transfer a signal corresponding to the node 462 to the node 145. The input of the data output buffer 650 is connected to the node 145 and the output of the data output buffer 650 is connected to the node 625 (the data output terminal). Data output (q) of the storage element 1300 is taken from the node 625. The scan output buffer 550 is also connected to the node 145. In functional mode, the scan output buffer 550 is configured to pull-up the node 550. In the shift mode, the transistors 515, 520 and 525 form an inverter configuration (and the transistor 530 is disabled) providing an inverse of the value of the node 145 to the node 535.

The operation of the storage element 1300 is now explained. The input circuit 460 causes a signal corresponding to one of the data input 'd' and the scan input 'sd', to be transferred at the node 462. It should be noted that in this embodiment, the scan input 'sd' is logic 0, when the SCAN is logic 0. For instance, a scan output 'sq' of a preceding storage element (such as the storage element 300) of the storage element 1300 is pull-down when the SCAN is logic 0, and this pull-down logic 0 is fed to the scan input 'sd' of the storage element 1300. When the SCAN is logic 1, the scan input 'sd' may have either of logic 0 or logic 1 depending upon the test data and value as received from the preceding storage element. As illustrated in the FIG. 13, when SCAN is logic 0, an inverse of the data input 'd' is transferred at the node 462, and when SCAN is logic 1, an inverse of the scan input 'sd' is transferred at the node 462.

In functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that 'd' is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 130 of the shifting circuit 145. When CLK is low the transmission gate 135 becomes transparent and the logic 1 at the input of transmission gets transferred to the node 195, forcing the output of the inverter 130 (node 197) to be logic 0. When CLK becomes high the transmission gate 135 becomes transparent which transfers the value at the node 197 (logic 0) to the inverter 130. The inverter 130 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 650 inverts the value at the node 145 and forces a logic 0 at the node 625. As SCAN is logic 0, the transistor 620 is disabled, and the transistors 605, 610 and 615 form an inverter configuration, thereby transferring the inverted value of the node 145 (for example, a logic 0) at the node 625. The data output 'q' is taken from the node 625 (that is the data output terminal) as inverse of the data input 'd'. As SCAN is logic 0, the transistor 525 is disabled, which stops the data propagation to the node 535. At the same time the transistor 530 is enabled which then pulls up the node 535 to logic 1. The scan output terminal is coupled to the node 535. Accordingly, in functional mode (when SCAN is logic 0), the scan output 'sq' is tied to logic 1 (this may help in power reduction in functional mode due to combinational logic switching in scan path which is driven by the scan output terminal). The scan enable input (SCAN) acts as a control signal, which decides whether to tie the scan output terminal 'sq' to logic 1 or not. Accordingly, when SCAN is logic 0, the data output 'q' follows the inverse of the data input and the scan output 'sq' is tied to logic 1.

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 550 acts as an inverter, as the transistor 530 is disabled and the transistors 515, 520 and 525 form an inverter configuration. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 550 then transfers logic 0 at the node 535 that is coupled to the scan output 'sq'. Accordingly, inverted scan input 'sd' is transferred to the scan output 'sq' when the device operates in the shift mode. As SCAN is logic 1, the transistor 605 is disabled causing disabling the inverter comprised by transistors 605 and 610. The transistor 620 is enabled and pulls down the node 625 (the data output terminal q) in response to SCAN. It is noted that transistor 605 is configured to protect leakage current through the inverter (formed by the transistors 610 and 615) when the data output terminal is pull-down.

In shift mode, the data output 'q' is tied to logic 0 (this will help in power reduction in shift mode due to combinational logic switching which is driven by data output terminal). The scan enable input (SCAN) acts as a control signal, which decides whether to tie the data output terminal 'q' to logic1 or not. When SCAN is 0, the data output 'q' follows the inversion of the data input 'd' and the scan output 'sq' is tied to logic 1. When SCAN is logic 1, the data output q is tied to logic 0 and the scan output 'sq' follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 14:
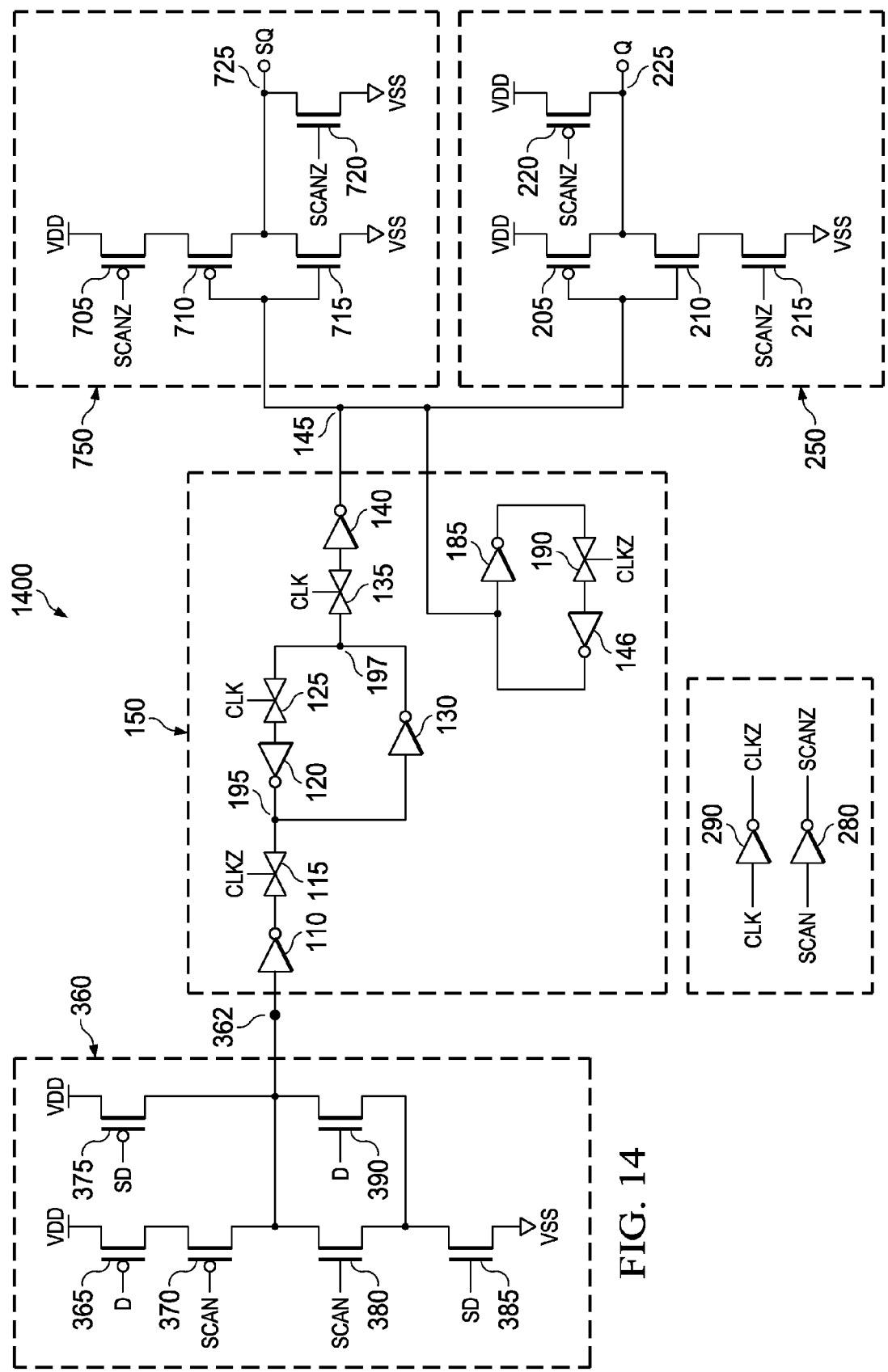
FIG. 14 illustrates a scannable storage element with scan output pull-down in functional mode and data output pull-up in shift mode according to an embodiment.

FIG. 14 illustrates an example of a storage element other than the first storage element of the scan chain 100 according to an embodiment. The storage element 1400 may be an example of any of the storage elements 100₂, 100₃ ... or 100ₙ, in cases where the scan input data 'sd' received by the storage element 1400 is pull-up in the functional mode. For instance, the storage element 1400 is utilized when the scan output 'sq' (that is coupled to the scan input 'sd' of the storage element 1400) provided by a preceding storage element (of the storage element 1400) is pull-up in the functional mode (when SCAN is logic 0). For example, when SCAN is logic 0, the scan input 'sd' is logic 1.

The storage element 1400 includes a node 145 coupled to a scan output buffer 750 for driving a node 725 (scan output terminal). In this example embodiment, the node 145 is also coupled to a data output buffer 250 for driving a node 225 (data output terminal). The storage element 1400 includes the input circuit 360 that is configured to receive a data input (see, 'd') and a scan input (see, 'sd') from a data output and a scan output 'sq' of the preceding storage element, respectively. The input circuit 360 is configured to provide a signal corresponding to one of the data input 'd' and the scan input 'sd', at the node 362. For instance, an inverse of the data input 'd' is provided at the node 362 in the shift mode (when SCAN is logic 1), and an inverse of the scan input 'sd' is provided at the node 362 in the functional mode (when SCANZ is logic 0).

An output (for example, the node 362) of the input circuit 360 is connected to the shifting circuit 150 that is configured to transfer a signal corresponding to the node 362 to the node 145. The input of the data output buffer 250 is connected to the node 145 and the output of the data output buffer 250 is connected to the node 225 (the data output terminal). Data output (q) of the storage element 1400 is taken from the node 225. The scan output buffer 750 is also connected to the node 145. In functional mode, the scan output buffer 750 is configured to pull-up the node 725. In the shift mode, the transistors 705, 710 and 715 form an inverter configuration (and the transistor 720 is disabled) providing an inverse of the value of the node 145 to the node 725.

The operation of the storage element 1400 is now explained. The input circuit 360 causes a signal corresponding to one of the data input and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 1400 is pull-up when the SCAN is logic 0, and this pull-up logic 1 is fed to the scan input 'sd' of the storage element 1100. When the SCAN is logic 1, the scan input 'sd' may have either of logic 0 or logic 1 depending upon the test data and value as received from the preceding storage element. As described in reference to FIG. 4, when SCAN is logic 0, an inverse of the data input 'd' is transferred at the node 362, and when SCAN is logic 1, an inverse of the scan input 'sd' is transferred at the node 362.

In functional mode (when SCAN is logic 0 or SCANZ is logic 1), the scan input 'sd' is logic 1, so the transistor 375 and 380 are disabled, and the transistors 370 and 385 are enabled. Accordingly, the transistors 365, 370, 390 and 385 form an inverter configuration, and an inverted logic level of 'd' is transferred to the node 362. Assuming that 'd' is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 250 inverts the value at the node 145 and forces a logic 0 at the node 225. As SCAN is logic 0, the transistor 220 is disabled, and the transistors 205, 210 and 215 form an inverter configuration, thereby transferring the inverted value of the node 145 (for example, a logic 0) at the node 225. The data output 'q' is taken from the node 225 (that is the data output terminal) as inverse of the data input 'd'. As SCAN is logic 0, the transistor 705 is disabled, which stops the data propagation to the node 725. At the same time the transistor 720 is enabled which then pulls-down the node 725 to logic 0. The scan output terminal is coupled to the node 725. Accordingly, in functional mode (when SCAN is logic 0), the scan output 'sq' is tied to logic 0 (this may help in power reduction in functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 750 acts as an inverter, as the transistor 720 is disabled and the transistors 705, 710 and 715 form an inverter configuration. The shifting circuit 150 is configured to force a logic level at the node 145 that is the inverse of the node 362. For instance, if the scan input 'sd' is logic 1 (provided the SCAN is logic 1), the node 362 is at logic 0, and the node 145 is at logic 1. The scan output buffer 750 then transfers logic 0 at the node 725 that is coupled to the scan output 'sq'. Accordingly, inverse of the scan input 'sd' is transferred to the scan output 'sq' when the IC operates in the shift mode. As SCAN is logic 1, the transistor 215 is disabled causing disabling the inverter comprised by transistors 205 and 210. The transistor 220 is enabled and pulls-up the node 225 (the data output terminal) in response to SCANZ being logic 0. It is noted that transistor 215 is configured to protect leakage current through the inverter (formed by the transistors 205 and 210) when the data output terminal (the node 225) is pull-up.

In shift mode, the data output 'q' is tied to logic 1 (this will help in power reduction in shift mode due to combinational logic switching which is driven by data output terminal). The scan enable input (SCAN) acts as a control signal, which decides whether to tie the data output terminal 'q' to logic 1 or not. When SCAN is 0, the data output 'q' follows the inversion of the data input 'd' and the scan output 'sq' is tied to logic 0. When SCAN is logic 1, the data output q is tied to logic 1 and the scan output 'sq' follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 15:
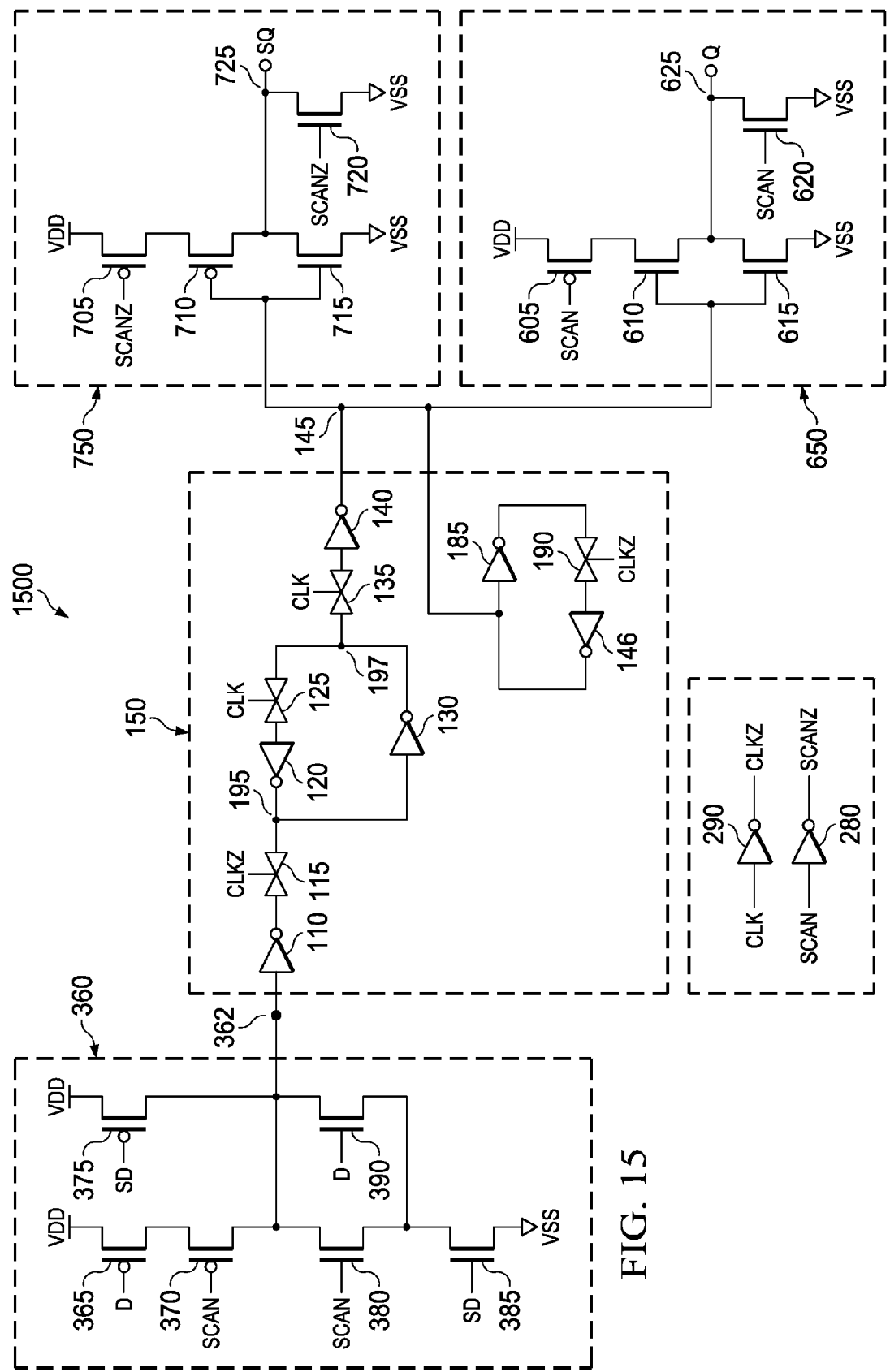
FIG. 15 illustrates a scannable storage element with scan output pull-down in functional mode and data output pull-down in shift mode according to an embodiment.

FIG. 15 illustrates an example of a storage element other than the first storage element of the scan chain 100 according to an embodiment. The storage element 1500 may be an example of any of the storage elements 100$_2$, 100$_3$ ... or 100$_n$, in cases where the scan input data 'sd' received by the storage element 1500 is pull-up in the functional mode. For instance, the storage element 1500 is utilized when the scan output 'sq' (that is coupled to the scan input 'sd' of the storage element 1500) provided by a preceding storage element (of the storage element 1500) is pull-up in the functional mode (when SCAN is logic 0). For example, when SCAN is logic 0, the scan input 'sd' is logic 1.

The storage element 1500 includes a node 145 coupled to a scan output buffer 750 for driving a node 725 (scan output terminal). In this example embodiment, the node 145 is also coupled to the data output buffer 650 for driving the node 625 (data output terminal). The storage element 1000 includes the input circuit 360 that is configured to receive a data input (see, 'd') and a scan input (see, 'sd') from a data output 'q' and a scan output 'sq' of the preceding storage element, respectively. The input circuit 360 is configured to provide a signal corresponding to one of the data input 'd' and the scan input 'sd', at the node 362. For instance, an inverse of the data input 'd' is provided at the node 362 in the shift mode (when SCAN is logic 1), and an inverse of the scan input 'sd' is provided at the node 362 in the functional mode (when SCANZ is logic 0).

An output (for example, the node 362) of the input circuit 360 is connected to the shifting circuit 150 that is configured to transfer a signal corresponding to the node 362 to the node 145. The input of the data output buffer 650 is connected to the node 145 and the output of the data output buffer 650 is connected to the node 625 (the data output terminal). Data output (q) of the storage element 1500 is taken from the node 625. The scan output buffer 750 is also connected to the node 145. In functional mode, the scan output buffer 750 is configured to pull-down the node 725. In the shift mode, the transistors 705, 710 and 715 form an inverter configuration (and the transistor 720 is disabled) providing an inverse of the value of the node 145 to the node 725.

The operation of the storage element 1500 is now explained. The input circuit 360 causes a signal corresponding to one of the data input 'd' and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 1500 is pull-up when the SCAN is logic 0, and this pull-up logic 1 is fed to the scan input 'sd' of the storage element 1500. When the SCAN is logic 1, the scan input 'sd' may have either of logic 0 or logic 1 depending upon the test data and value as received from the preceding storage element. As described in reference to FIG. 4, when SCAN is logic 0, an inverse of the data input 'd' is transferred at the node 362, and when SCAN is logic 1, an inverse of the scan input 'sd' is transferred at the node 362.

In functional mode (when SCAN is logic 0 or SCANZ is logic 1), the scan input 'sd' is logic 1, so the transistor 375 and 380 are disabled, and the transistors 370 and 385 are enabled. Accordingly, the transistors 365, 370, 390 and 385 form an inverter configuration, and an inverted logic level of is transferred to the node 362. Assuming that 'd' is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 150. The inverter 150 forces logic 1 on the node 145. The inverter 185, the transmission gate 190 and the inverter 156 comprise a loop back path when CLK is logic 0 and helps to retain the value at the node 145. The data output buffer 650 inverts the value at the node 145 and forces a logic 0 at the node 625. As SCAN is logic 0, the transistor 620 is disabled, and the transistors 605, 610 and 615 form an inverter configuration, thereby transferring the inverted value of the node 145 (for example, a logic 0) at the node 625. The data output 'q' is taken from the node 625 (that is the data output terminal) as inverse of the data input 'd'. As SCAN is logic 0, the transistor 705 is disabled, which stops the data propagation to the node 725. At the same time the transistor 720 is enabled which then pulls-down the node 725 to logic 0. The scan output terminal is coupled to the node 725. Accordingly, in functional mode (when SCAN is logic 0), the scan output 'sq' is tied to logic 0 (this may help in power reduction in functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 750 acts as an inverter, as the transistor 720 is disabled and the transistors 705, 710 and 715 form an inverter configuration. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 750 then transfers logic 0 at the node 725 that is coupled to the scan output 'sq'. Accordingly, inverse of the scan input 'sd' is transferred to the scan output 'sq' when the IC operates in the shift mode. As SCAN is logic 1, the transistor 605 is disabled causing disabling the inverter comprised by transistors 605 and 610. The transistor 620 is enabled and pulls down the node 625 (the data output terminal q) in response to SCAN. It is noted that transistor 605 is configured to protect leakage current through the inverter (formed by the transistors 610 and 615) when the data output terminal is pull-down.

In shift mode, the data output 'q' is tied to logic 0 (this will help in power reduction in shift mode due to combinational logic switching which is driven by data output terminal). The scan enable input (SCAN) acts as a control signal, which decides whether to tie the data output terminal 'q' to logic1 or not. When SCAN is 0, the data output 'q' follows the inversion of the data input 'd' and the scan output 'sq' is tied to logic 0. When SCAN is logic 1, the data output q is tied to logic 0 and the scan output 'sq' follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 16:
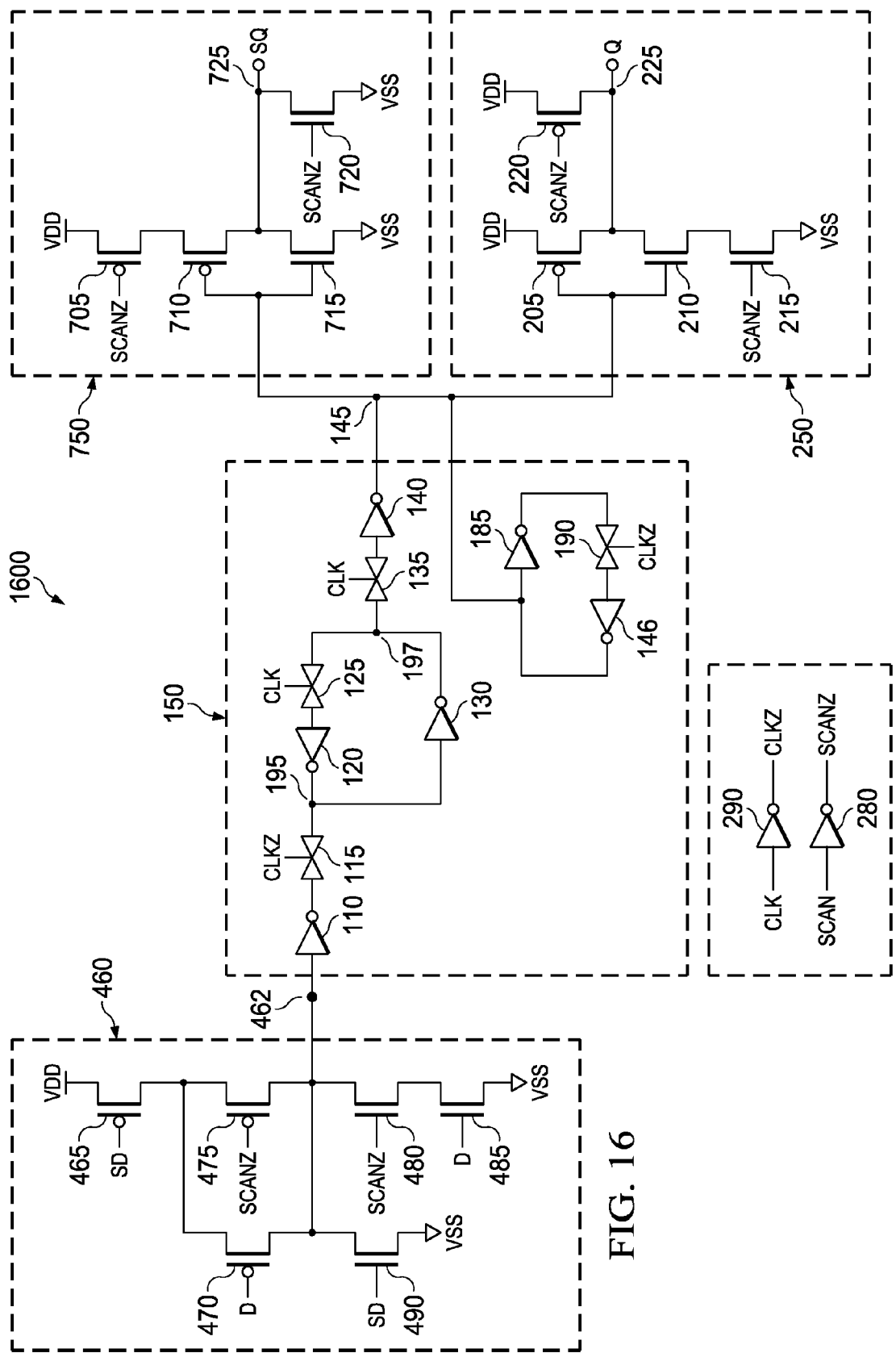
FIG. 16 illustrates a scannable storage element with scan output pull-down in functional mode and data output pull-up in shift mode according to another embodiment.

FIG. 16 illustrates an example of a storage element other than the first storage element of the scan chain 100 according to an embodiment. The storage element 1600 may be an example of any of the storage elements $100_2$, $100_3$ ... or $100_n$, in cases where the scan input data 'sd' received by the storage element 1600 is pull-down in the functional mode. For instance, the storage element 1600 is utilized when the scan output 'sq' (that is coupled to the scan input 'sd' of the storage element 1600) provided by a preceding storage element (of the storage element 1600) is pull-down in the functional mode (when SCAN is logic 0). For example, when SCAN is logic 0, the scan input 'sd' is logic 1.

The storage element 1600 includes a node 145 coupled to a scan output buffer 750 for driving a node 725 (scan output terminal). In this example embodiment, the node 145 is also coupled to a data output buffer 250 for driving a node 225 (data output terminal). The storage element 1600 includes the input circuit 460 that is configured to receive a data input (see, 'd') and a scan input (see, 'sd') from a data output 'q' and a scan output 'sq' of the preceding storage element, respectively. The input circuit 460 is configured to provide a signal corresponding to one of the data input 'd' and the scan input 'sd', at the node 462. For instance, an inverse of the data input 'd' is provided at the node 462 in the shift mode (when SCANZ is logic 1), and an inverse of the scan input 'sd' is provided at the node 462 in the functional mode (when SCANZ is logic 0).

An output (for example, the node 462) of the input circuit 460 is connected to the shifting circuit 150 that is configured to transfer a signal corresponding to the node 462 to the node 145. The input of the data output buffer 250 is connected to the node 145 and the output of the data output buffer 250 is connected to the node 225 (the data output terminal). Data output (q) of the storage element 1600 is taken from the node 225. The scan output buffer 550 is also connected to the node 145. In functional mode, the scan output buffer 750 is configured to pull-down the node 725. In the shift mode, the transistors 705, 710 and 715 form an inverter configuration (and the transistor 720 is disabled) providing an inverse of the value of the node 145 to the node 725.

The operation of the storage element 1600 is now explained. The input circuit 460 causes a signal corresponding to one of the data input and the scan input 'sd', to be transferred at the node 462. It should be noted that in this embodiment, the scan input 'sd' is logic 0, when the SCAN is logic 0. For instance, a scan output 'sq' of a preceding storage element (such as the storage element 300) of the storage element 1600 is pull-down when the SCAN is logic 0, and this pull-down logic 0 is fed to the scan input 'sd' of the storage element 1600. When the SCAN is logic 1, the scan input 'sd' may have either of logic 0 or logic 1 depending upon the test data and value as received from the preceding storage element. As illustrated in the FIG. 15, when SCAN is logic 0, an inverse of the data input 'd' is transferred at the node 462, and when SCAN is logic 1, an inverse of the scan input 'sd' is transferred at the node 462.

In functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that 'd' is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 120 of the shifting circuit 145. When CLK is low the transmission gate 125 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 250 inverts the value at the node 145 and forces a logic 0 at the node 225. As SCAN is logic 0, the transistor 220 is disabled, and the transistors 205, 210 and 215 form an inverter configuration, thereby transferring the inverted value of the node 145 (for example, a logic 0) at the node 225. The data output 'q' is taken from the node 225 (that is the data output terminal) as inverse of the data input 'd'. As SCAN is logic 0, the transistor 705 is disabled, which stops the data propagation to the node 725. At the same time the transistor 720 is enabled which then pulls-down the node 725 to logic 0. The scan output terminal is coupled to the node 725. Accordingly, in functional mode (when SCAN is logic 0), the scan output 'sq' is tied to logic 0 (this may help in power reduction in functional mode due to combinational logic switching in scan path which is driven by the scan output terminal). The scan enable input (SCANZ) acts as a control signal, which decides whether to tie the scan output terminal 'sq' to logic 0 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 750 acts as an inverter, as the transistor 720 is disabled and the transistors 705, 710 and 715 form an inverter configuration. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 750 then transfers logic 0 at the node 725 that is coupled to the scan output 'sq'. Accordingly, inverse of the scan input 'sd' is transferred to the scan output 'sq' when the IC operates in the shift mode. As SCAN is logic 1, the transistor 215 is disabled causing disabling the inverter comprised by transistors 205 and 210. The transistor 220 is enabled and pulls-up the node 225 (the data output terminal q) in response to SCANZ being logic 0. It is noted that transistor 215 is configured to protect leakage current through the inverter (formed by the transistors 205 and 210) when the data output terminal (the node 225) is pull-up.

In shift mode, the data output 'q' is tied to logic 1 (this will help in power reduction in shift mode due to combinational logic switching which is driven by data output terminal). The scan enable input (SCAN) acts as a control signal, which decides whether to tie the data output terminal 'q' to logic1 or not. When SCAN is 0, the data output 'q' follows the inversion of the data input 'd' and the scan output 'sq' is tied to logic 0. When SCAN is logic 1, the data output q is tied to logic 1 and the scan output 'sq' follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 17:
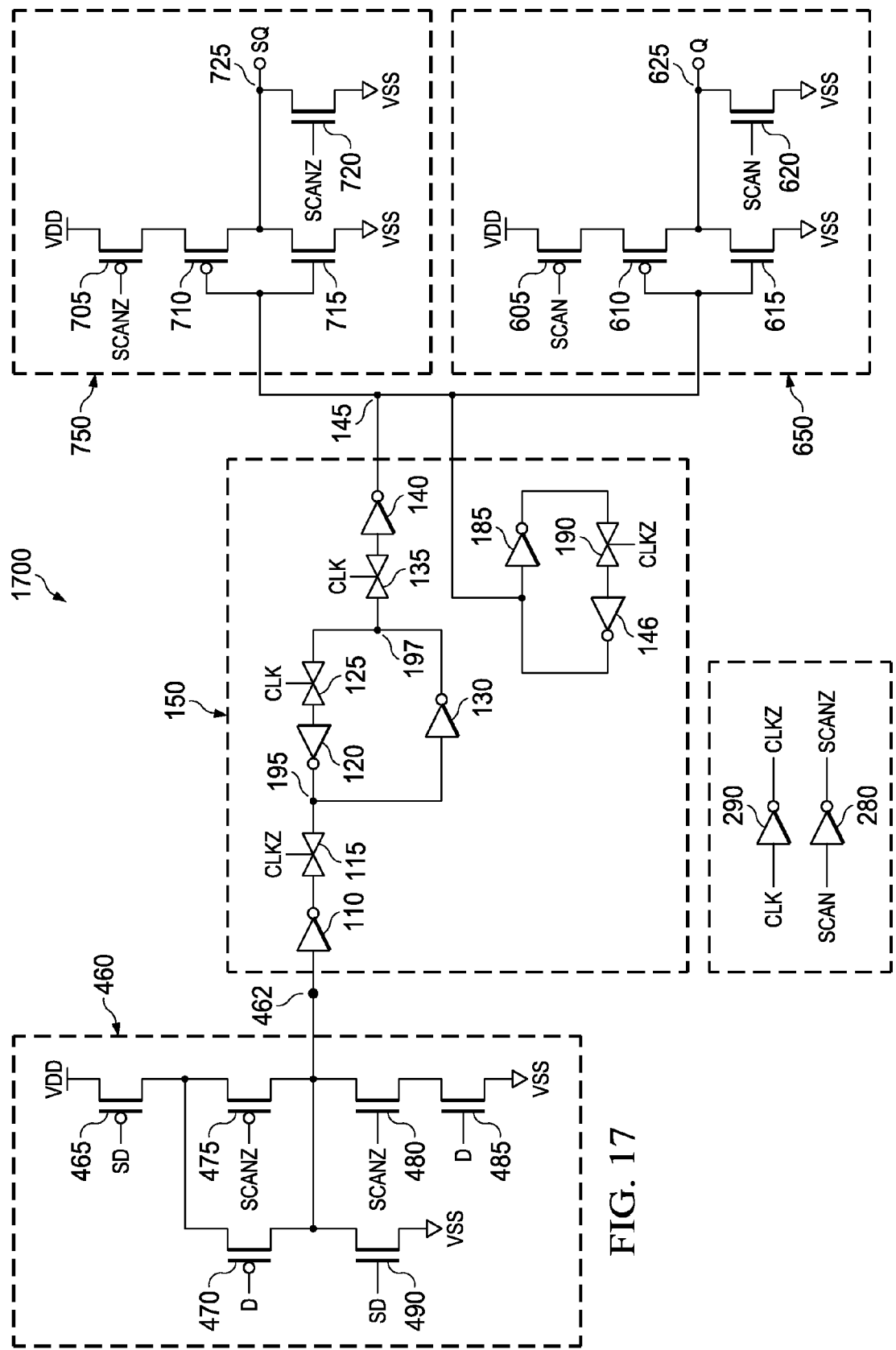
FIG. 17 illustrates a scannable storage element with scan output pull-down in functional mode and data output pull-down in shift mode according to an embodiment.

FIG. 17 illustrates an example of a storage element other than the first storage element of the scan chain 100 according to an embodiment. The storage element 1700 may be an example of any of the storage elements $100_2$, $100_3$ ... or $100_n$, in cases where the scan input data 'sd' received by the storage element 1700 is pull-down in the functional mode. For instance, the storage element 1700 is utilized when the scan output 'sq' (that is coupled to the scan input 'sd' of the storage element 1700) provided by a preceding storage element (of the storage element 1700) is pull-down in the functional mode (when SCAN is logic 0). For example, when SCAN is logic 0, the scan input 'sd' is logic 1.

The storage element 1700 includes a node 145 coupled to a scan output buffer 750 for driving a node 725 (scan output terminal). In this example embodiment, the node 145 is also coupled to a data output buffer 650 for driving the node 625 (data output terminal). The storage element 1700 includes the input circuit 460 that is configured to receive a data input (see, 'd') and a scan input (see, 'sd') from a data output 'q' and a scan output 'sq' of the preceding storage element, respectively. The input circuit 460 is configured to provide a signal corresponding to one of the data input 'd' and the scan input 'sd', at the node 462. For instance, an inverse of the data input 'd' is provided at the node 462 in the shift mode (when SCANZ is logic 1), and an inverse of the scan input 'sd' is provided at the node 462 in the functional mode (when SCANZ is logic 0).

An output (for example, the node 462) of the input circuit 460 is connected to the shifting circuit 150 that is configured to transfer a signal corresponding to the node 462 to the node 145. The input of the data output buffer 650 is connected to the node 145 and the output of the data output buffer 650 is connected to the node 625 (the data output terminal). Data output (q) of the storage element 1700 is taken from the node 625. The scan output buffer 550 is also connected to the node 145. In functional mode, the scan output buffer 750 is configured to pull-down the node 725. In the shift mode, the transistors 705, 710 and 715 form an inverter configuration (and the transistor 720 is disabled) providing an inverse of the value of the node 145 to the node 725.

The operation of the storage element 1700 is now explained. The input circuit 460 causes a signal corresponding to one of the data input and the scan input 'sd', to be transferred at the node 462. It should be noted that in this embodiment, the scan input 'sd' is logic 0, when the SCAN is logic 0. For instance, a scan output 'sq' of a preceding storage element (such as the storage element 300) of the storage element 1700 is pull-down when the SCAN is logic 0, and this pull-down logic 0 is fed to the scan input 'sd' of the storage element 1700. When the SCAN is logic 1, the scan input 'sd' may have either of logic 0 or logic 1 depending upon the test data and value as received from the preceding storage element. As illustrated in the FIG. 17, when SCAN is logic 0, an inverse of the data input 'd' is transferred at the node 462, and when SCAN is logic 1, an inverse of the scan input 'sd' is transferred at the node 462.

In functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that 'd' is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 120 of the shifting circuit 145. When CLK is low the transmission gate 125 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 650 inverts the value at the node 145 and forces a logic 0 at the node 625. As SCAN is logic 0, the transistor 620 is disabled, and the transistors 605, 610 and 615 form an inverter configuration, thereby transferring the inverted value of the node 145 (for example, a logic 0) at the node 625. The data output 'q' is taken from the node 625 (that is the data output terminal) as inverse of the data input 'd'. As SCAN is logic 0, the transistor 705 is disabled, which stops the data propagation to the node 725. At the same time the transistor 720 is enabled which then pulls-down the node 725 to logic 0. The scan output terminal is coupled to the node 725. Accordingly, in functional mode (when SCAN is logic 0), the scan output 'sq' is tied to logic 0 (this may help in power reduction in functional mode due to combinational logic switching in scan path which is driven by the scan output terminal). The scan enable input (SCANZ) acts as a control signal, which decides whether to tie the scan output terminal 'sq' to logic 0 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 750 acts as an inverter, as the transistor 720 is disabled and the transistors 705, 710 and 715 form an inverter configuration. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 750 then transfers logic 0 at the node 725 that is coupled to the scan output 'q'. Accordingly, inverse of the scan input 'sd' is transferred to the scan output 'sq' when the IC operates in the shift mode. As SCAN is logic 1, the transistor 605 is disabled causing disabling the inverter comprised by transistors 605 and 610. The transistor 620 is enabled and pulls down the node 625 (the data output terminal q) in response to SCAN. It is noted that transistor 605 is configured to protect leakage current through the inverter (formed by the transistors 610 and 615) when the data output terminal is pull-down.

In shift mode, the data output 'q' is tied to logic 0 (this will help in power reduction in shift mode due to combinational logic switching which is driven by data output terminal). The scan enable input (SCAN) acts as a control signal, which decides whether to tie the data output terminal 'q' to logic 0 or not. When SCAN is 0, the data output 'q' follows the inversion of the data input 'd' and the scan output 'sq' is tied to logic 0. When SCAN is logic 1, the data output q is tied to logic 0 and the scan output 'sq' follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" q gating.

Figure 18:
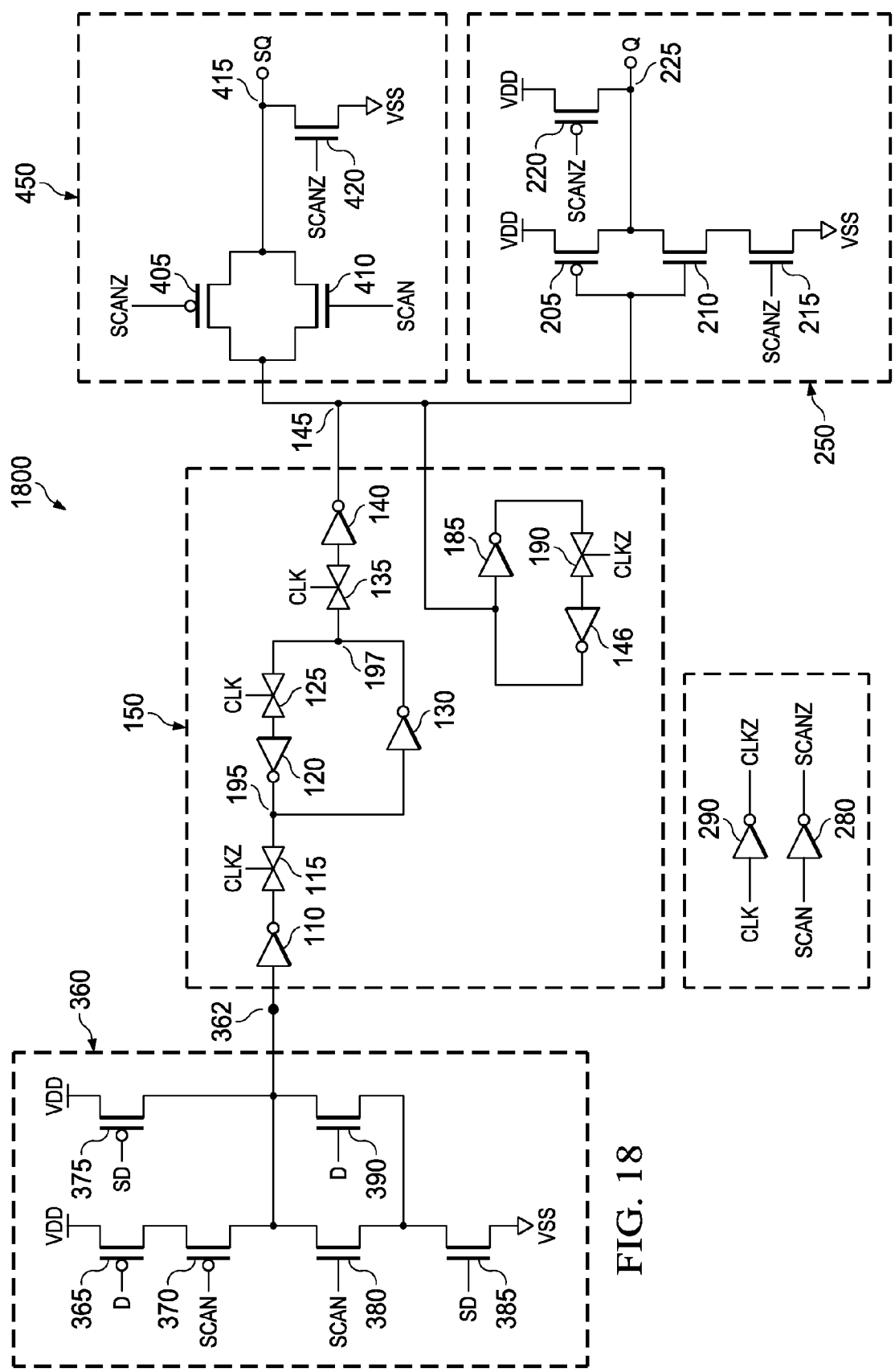
FIG. 18 illustrates a scannable storage element with scan output pull-down in functional mode and data output pull-up in shift mode according to another embodiment.

FIG. 18 illustrates an example of a storage element other than the first storage element of the scan chain 100 according to an embodiment. The storage element 1800 may be an example of any of the storage elements $100_2$, $100_3$ ... or $100_n$, in cases where the scan input data 'sd' received by the storage element 1800 is pull-up in the functional mode. For instance, the storage element 1800 is utilized when the scan output 'sq' (that is coupled to the scan input 'sd' of the storage element 1800) provided by a preceding storage element (of the storage element 1800) is pull-up in the functional mode (when SCAN is logic 0). For example, when SCAN is logic 0, the scan input 'sd' is logic 1.

The storage element 1800 includes a node 145 coupled to a scan output buffer 450 for driving the node 415 (scan output terminal). In this example embodiment, the node 145 is also coupled to the data output buffer 250 for driving the node 225 (data output terminal). The storage element 1800 includes the input circuit 360 that is configured to receive a data input (see, 'd') and a scan input (see, 'sd') from a data output 'q' and a scan output 'sq' of the preceding storage element, respectively. The input circuit 360 is configured to provide a signal corresponding to one of the data input and the scan input 'sd', at the node 362. For instance, an inverse of the data input 'd' is provided at the node 362 in the shift mode (when SCAN is logic 1), and an inverse of the scan input 'sd' is provided at the node 362 in the functional mode (when SCANZ is logic 0).

An output (for example, the node 362) of the input circuit 360 is connected to the shifting circuit 150 that is configured to transfer a signal corresponding to the node 362 to the node 145. The input of the data output buffer 250 is connected to the node 145 and the output of the data output buffer 250 is connected to the node 225 (the data output terminal). Data output (q) of the storage element 1800 is taken from the node 225. The scan output buffer 450 is also connected to the node 145. As described in reference to FIG. 8, the scan output buffer 450 includes the PMOS transistor 405 (first MOS transistor) and the NMOS transistor 410 (second MOS transistor) (forming a transmission gate) followed by the pull-down NMOS transistor 420. The transistor 420 to act as a pull-down transistor in functional mode (when SCANZ is logic 1), as the transistors 405 and 410 are disabled in the functional mode. In the shift mode (when SCANZ is logic 0), the transistor 420 is disabled; and the transmission gate is enabled and provides the value of the node 145 to the node 415.

The operation of the storage element 1800 is now explained. The input circuit 360 causes a signal corresponding to one of the data input 'd' and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 1800 is pull-up when the SCAN is logic 0, and this pull-up logic 1 is fed to the scan input 'sd' of the storage element 1800. When the SCAN is logic 1, the scan input 'sd' may have either of logic 0 or logic 1 depending upon the test data and value as received from the preceding storage element. As described in reference to FIG. 4, when SCAN is logic 0, an inverse of the data input 'd' is transferred at the node 362, and when SCAN is logic 1, an inverse of the scan input 'sd' is transferred at the node 362.

In functional mode (when SCAN is logic 0 or SCANZ is logic 1), the scan input 'sd' is logic 1, so the transistor 375 and 380 are disabled, and the transistors 370 and 385 are enabled. Accordingly, the transistors 365, 370, 390 and 385 form an inverter configuration, and an inverted logic level of 'd' is transferred to the node 362. Assuming that 'd' is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 250 inverts the value at the node 145 and forces a logic 0 at the node 225. As SCAN is logic 0, the transistor 220 is disabled, and the transistors 205, 210 and 215 form an inverter configuration, thereby transferring the inverted value of the node 145 (for example, a logic 0) at the node 225. The data output 'q' is taken from the node 225 (that is the data output terminal) as inverse of the data input 'd'. As SCAN is logic 0, the transmission gate formed by the transistors 405 and 410 isolates the node 415 from node 145. At the same time the transistor 420 is enabled which then pulls-down the node 415 to logic 0 irrespective of the clock signal CLK in functional mode. The scan output terminal is coupled to the node 415. Accordingly, in the functional mode (when SCAN is logic 0), the scan output 'sq' is tied to logic 0 (this may help in power reduction in the functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 450 acts as a transmission gate buffer, as the transistor 420 is disabled and the transmission gate formed by the transistors 405 and 410 transfers the value present at the node 145 to the node 415. The shifting circuit 150 is configured to force a logic level at the node 145 that is the inverse of the node 362. For instance, if the scan input 'sd' is logic 1 (provided the SCAN is logic 1), the node 362 is at logic 0, and the node 145 is at logic 1. The scan output buffer 450 then transfers logic 1 at the node 415 that is coupled to the scan output 'sq'. Accordingly, the scan input 'sd' is transferred to the scan output 'sq' when the IC operates in the shift mode. As SCAN is logic 1, the transistor 215 is disabled causing disabling the inverter comprised by transistors 205 and 210. The transistor 220 is enabled and pulls-up the node 225 (the data output terminal) in response to SCANZ being logic 0. It is noted that transistor 215 is configured to protect leakage current through the inverter (formed by the transistors 205 and 210) when the data output terminal (the node 225) is pull-up.

In shift mode, the data output 'q' is tied to logic 1 (this will help in power reduction in shift mode due to combinational logic switching which is driven by data output terminal). The scan enable input (SCAN) acts as a control signal, which decides whether to tie the data output terminal 'q' to logic 1 or not. When SCAN is 0, the data output 'q' follows the inversion of the data input 'd' and the scan output 'sq' is tied to logic 0. When SCAN is logic 1, the data output 'q' is tied to logic 1 and the scan output 'sq' follows the scan input (sd).

According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 19:
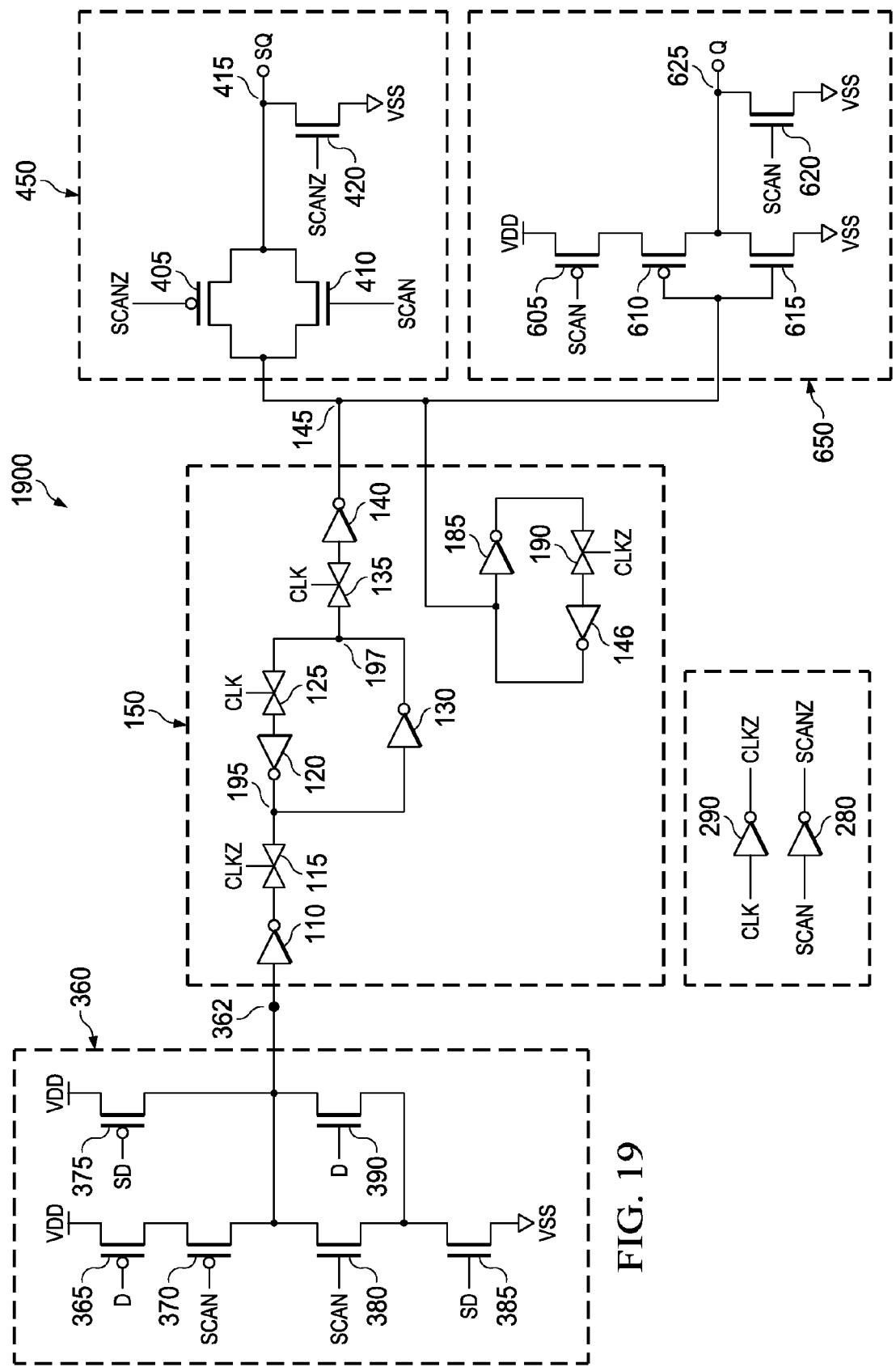
FIG. 19 illustrates a scannable storage element with scan output pull-down in functional mode and data output pull-down in shift mode according to another embodiment.

FIG. 19 illustrates an example of a storage element other than the first storage element of the scan chain 100 according to an embodiment. The storage element 1900 may be an example of any of the storage elements $100_2, 100_3 \ldots$ or $100_n$, in cases where the scan input data 'sd' received by the storage element 1900 is pull-up in the functional mode. For instance, the storage element 1900 is utilized when the scan output 'sq' (that is coupled to the scan input 'sd' of the storage element 1900) provided by a preceding storage element (of the storage element 1900) is pull-up in the functional mode (when SCAN is logic 0). For example, when SCAN is logic 0, the scan input 'sd' is logic 1.

The storage element 1900 includes a node 145 coupled to a scan output buffer 450 for driving the node 415 (scan output terminal). In this example embodiment, the node 145 is also coupled to the data output buffer 650 for driving the node 625 (data output terminal). The storage element 1900 includes the input circuit 360 that is configured to receive a data input (see, 'd') and a scan input (see, 'sd') from a data output 'q' and a scan output 'sq' of the preceding storage element, respectively. The input circuit 360 is configured to provide a signal corresponding to one of the data input 'd' and the scan input 'sd', at the node 362. For instance, an inverse of the data input 'd' is provided at the node 362 in the shift mode (when SCAN is logic 1), and an inverse of the scan input 'sd' is provided at the node 362 in the functional mode (when SCANZ is logic 0).

An output (for example, the node 362) of the input circuit 360 is connected to the shifting circuit 150 that is configured to transfer a signal corresponding to the node 362 to the node 145. The input of the data output buffer 650 is connected to the node 145 and the output of the data output buffer 650 is connected to the node 625 (the data output terminal). Data output (q) of the storage element 1900 is taken from the node 625. The scan output buffer 450 is also connected to the node 145. As described in reference to FIG. 8, the scan output buffer 450 includes the PMOS transistor 405 (first MOS transistor) and the NMOS transistor 410 (second MOS transistor) (forming a transmission gate) followed by the pull-down NMOS transistor 420. The transistor 420 to act as a pull-down transistor in functional mode (when SCANZ is logic 1), as the transistors 405 and 410 are disabled in the functional mode. In the shift mode (when SCANZ is logic 0), the transistor 420 is disabled; and the transmission gate is enabled and provides the value of the node 145 to the node 415.

The operation of the storage element 1900 is now explained. The input circuit 360 causes a signal corresponding to one of the data input 'd' and the scan input 'sd', to be transferred at the node 362. It should be noted that the scan input 'sd' is logic 1, when the SCAN is logic 0. For instance, a scan output 'sq' of a preceding storage element (such as the storage element 200) of the storage element 1900 is pull-up when the SCAN is logic 0, and this pull-up logic 1 is fed to the scan input 'sd' of the storage element 1900. When the SCAN is logic 1, the scan input 'sd' may have either of logic 0 or logic 1 depending upon the test data and value as received from the preceding storage element. As described in reference to FIG. 4, when SCAN is logic 0, an inverse of the data input 'd' is transferred at the node 362, and when SCAN is logic 1, an inverse of the scan input 'sd' is transferred at the node 362.

In functional mode (when SCAN is logic 0 or SCANZ is logic 1), the scan input 'sd' is logic 1, so the transistor 375 and 380 are disabled, and the transistors 370 and 385 are enabled. Accordingly, the transistors 365, 370, 390 and 385 form an inverter configuration, and an inverted logic level of 'd' is transferred to the node 362. Assuming that 'd' is set to logic 1, then inverse of 'd', for example, logic 0 will then be available at the node 362. The shifting circuit 150 is configured to force a logic level at the node 145 that is the inverse of the value at the node 362. For example, output of inverter 110 of the shifting circuit 145 is logic 1. When CLK is low the transmission gate 115 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 650 inverts the value at the node 145 and forces a logic 0 at the node 625. As SCAN is logic 0, the transistor 620 is disabled, and the transistors 605, 610 and 615 form an inverter configuration, thereby transferring the inverted value of the node 145 (for example, a logic 0) at the node 625. The data output 'q' is taken from the node 625 (that is the data output terminal) as inverse of the data input 'd'. As SCAN is logic 0, the transmission gate formed by the transistors 405 and 410 isolates the node 415 from node 145. At the same time the transistor 420 is enabled which then pulls-down the node 415 to logic 0 irrespective of the clock signal CLK in functional mode. The scan output terminal is coupled to the node 415. Accordingly, in the functional mode (when SCAN is logic 0), the scan output 'sq' is tied to logic 0 (this may help in power reduction in the functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 370 is disabled, and the transistor 375 (pull-up) and transistors 380 and 385 (pull-down) form an inverter configuration, and an inverse of the scan input 'sd' is transferred to the node 362. It should be further be noted that when SCAN is logic 1, the scan output buffer 450 acts as a transmission gate buffer, as the transistor 420 is disabled and the transmission gate formed by the transistors 405 and 410 transfers the value present at the node 145 to the node 415. The shifting circuit 150 is configured to force a logic level at the node 145 that is the inverse of the node 362. For instance, if the scan input 'sd' is logic 1 (provided the SCAN is logic 1), the node 362 is at logic 0, and the node 145 is at logic 1. The scan output buffer 450 then transfers logic 1 at the node 415 that is coupled to the scan output 'sq'. Accordingly, the scan input 'sd' is transferred to the scan output 'sq' when the IC operates in the shift mode. As SCAN is logic 1, the transistor 605 is disabled causing disabling the inverter comprised by transistors 605 and 610. The transistor 620 is enabled and pulls down the node 625 (the data output terminal q) in response to SCAN. It is noted that transistor 605 is configured to protect leakage current through the inverter (formed by the transistors 610 and 615) when the data output terminal 625 is pull-down.

In shift mode, the data output 'q' is tied to logic 0 (this will help in power reduction in shift mode due to combinational logic switching which is driven by data output terminal). The scan enable input (SCAN) acts as a control signal, which decides whether to tie the data output terminal 'q' to logic 0 or not. When SCAN is 0, the data output 'q' follows the inversion of the data input 'd' and the scan output 'sq' is tied to logic 0. When SCAN is logic 1, the data output 'q' is tied to logic 0 and the scan output 'sq' follows the scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 20:
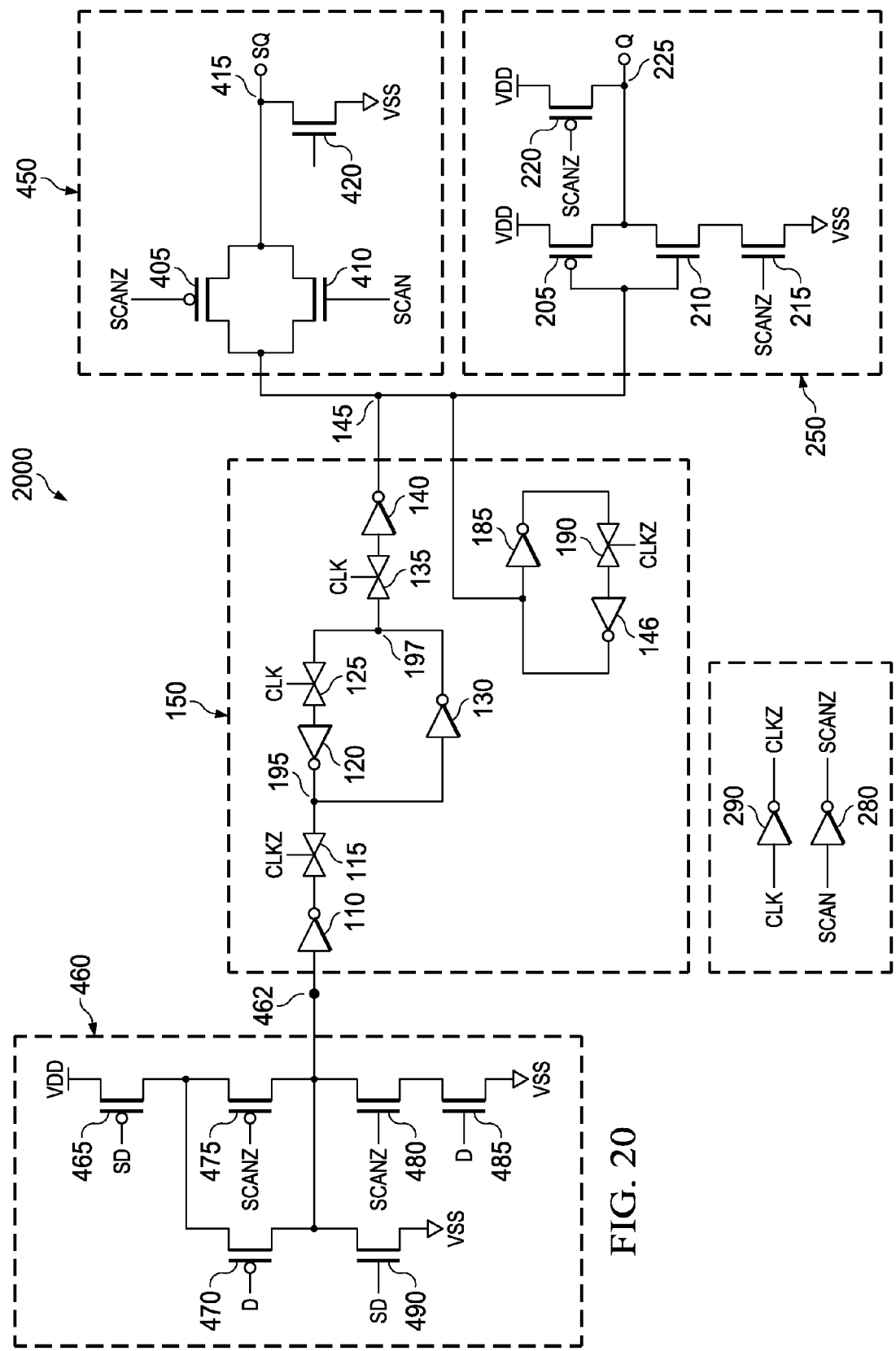
FIG. 20 illustrates a scannable storage element with scan output pull-down in functional mode and data output pull-up in shift mode according to another embodiment.

FIG. 20 illustrates an example of a storage element other than the first storage element of the scan chain 100 according to an embodiment. The storage element 2000 may be an example of any of the storage elements $100_2, 100_3 \ldots$ or $100_n$, in cases where the scan 'sd' received by the storage element 2000 is pull-down in the functional mode. For instance, the storage element 2000 is utilized when the scan output 'sq' (that is coupled to the scan input 'sd' of the storage element 2000) provided by a preceding storage element (of the storage element 2000) is pull-down in the functional mode (when SCAN is logic 0). For example, when SCAN is logic 0, the scan input 'sd' is logic 0.

The storage element 2000 includes a node 145 coupled to a scan output buffer 450 for driving the node 415 (scan output terminal). In this example embodiment, the node 145 is also coupled to the data output buffer 250 for driving the node 225 (data output terminal). The storage element 2000 includes the input circuit 460 that is configured to receive a data input (see, 'd') and a scan input (see, 'sd') from a data output 'q' and a scan output 'sq' of the preceding storage element, respectively. The input circuit 460 is configured to provide a signal corresponding to one of the data input 'sd' and the scan input 'sd', at the node 462. For instance, an inverse of the data input 'd' is provided at the node 462 in the shift mode (when SCANZ is logic 1), and an inverse of the scan input 'sd' is provided at the node 462 in the functional mode (when SCANZ is logic 0).

An output (for example, the node 462) of the input circuit 460 is connected to the shifting circuit 150 that is configured to transfer a signal corresponding to the node 462 to the node 145. The input of the data output buffer 250 is connected to the node 145 and the output of the data output buffer 250 is connected to the node 225 (the data output terminal). Data output (q) of the storage element 2000 is taken from the node 225. The scan output buffer 450 is also connected to the node 145. As described in reference to FIG. 8, the scan output buffer 450 includes the PMOS transistor 405 (first MOS transistor) and the NMOS transistor 410 (second MOS transistor) (forming a transmission gate) followed by the pull-down NMOS transistor 420. The transistor 420 to act as a pull-down transistor in functional mode (when SCANZ is logic 1), as the transistors 405 and 410 are disabled in the functional mode. In the shift mode (when SCANZ is logic 0), the transistor 420 is disabled; and the transmission gate is enabled and provides the value of the node 145 to the node 415.

The operation of the storage element 2000 is now explained. The input circuit 460 causes a signal corresponding to one of the data input 'd' and the scan input 'sd', to be transferred at the node 462. It should be noted that the scan input 'sd' is logic 0, when the SCAN is logic 0. For instance, a scan output 'sq' of a preceding storage element (such as the storage element 200) of the storage element 2000 is pull-down when the SCAN is logic 0, and this pull-down logic 0 is fed to the scan input 'sd' of the storage element 1100. When the SCAN is logic 1, the scan input 'sd' may have either of logic 0 or logic 1 depending upon the test data and value as received from the preceding storage element. As described in reference to FIG. 5, when SCAN is logic 0, an inverse of the data input 'd' is transferred at the node 462, and when SCAN is logic 1, an inverse of the scan input 'sd' is transferred at the node 462.

In functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that 'd' is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 120 of the shifting circuit 145. When CLK is low the transmission gate 125 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 250 inverts the value at the node 145 and forces a logic 0 at the node 225. As SCAN is logic 0, the transistor 220 is disabled, and the transistors 205, 210 and 215 form an inverter configuration, thereby transferring the inverted value of the node 145 (for example, a logic 0) at the node 225. The data output 'd' is taken from the node 225 (that is the data output terminal) as inverse of the data input 'd'. As SCAN is logic 0, the transmission gate formed by the transistors 405 and 410 isolates the node 415 from node 145. At the same time the transistor 420 is enabled which then pulls-down the node 415 to logic 0 irrespective of the clock signal CLK in functional mode. The scan output terminal is coupled to the node 415. Accordingly, in the functional mode (when SCAN is logic 0), the scan output 'sq' is tied to logic 0 (this may help in power reduction in the functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 450 acts as a transmission gate buffer, as the transistor 420 is disabled and the transmission gate formed by the transistors 405 and 410 transfers the value present at the node 145 to the node 415. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 450 then transfers logic 1 at the node 415 that is coupled to the scan output 'sq'. Accordingly, the scan input 'sd' is transferred to the scan output 'sq' when the IC operates in the shift mode. As SCAN is logic 1, the transistor 215 is disabled causing disabling the inverter comprised by transistors 205 and 210. The transistor 220 is enabled and pulls-up the node 225 (the data output terminal) in response to SCANZ being logic 0. It is noted that transistor 215 is configured to protect leakage current through the inverter (formed by the transistors 205 and 210) when the data output terminal (the node 225) is pull-up.

In shift mode, the data output 'q' is tied to logic 1 (this will help in power reduction in shift mode due to combinational logic switching which is driven by data output terminal). The scan enable input (SCAN) acts as a control signal, which decides whether to tie the data output terminal 'q' to logic 1 or not. When SCAN is 0, the data output 'q' follows the inversion of the data input 'd' and the scan output 'sq' is tied to logic 0. When SCAN is logic 1, the data output 'q' is tied to logic 1 and the scan output 'sq' follows the scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating.

Figure 21:
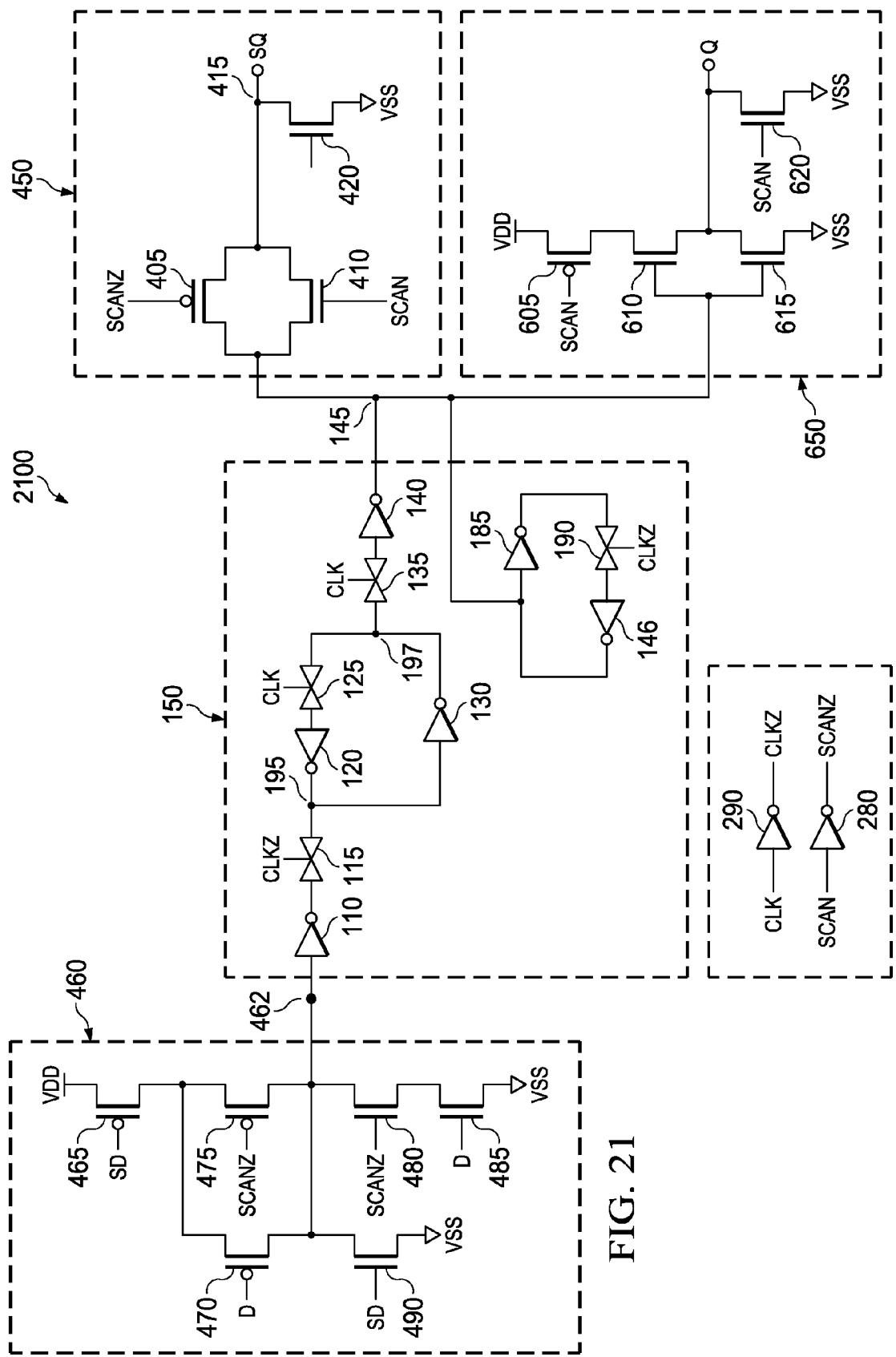
FIG. 21 illustrates a scannable storage element with scan output pull-down in functional mode and data output pull-down in shift mode according to another embodiment.
Figure 22:
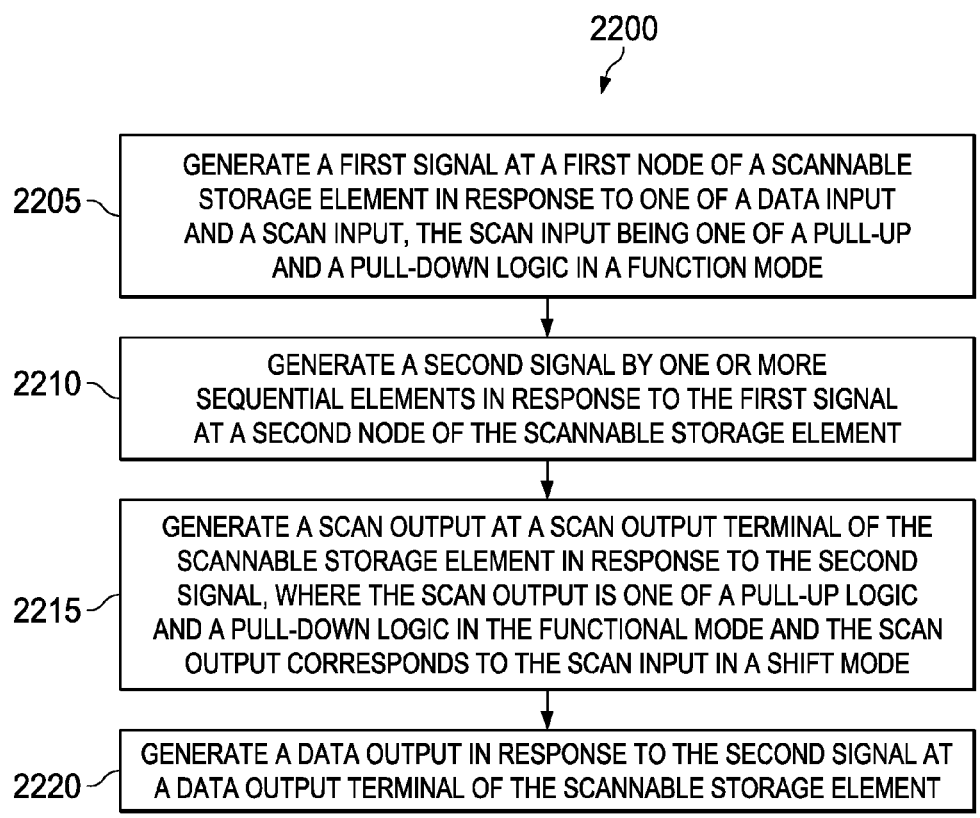
FIG. 22 illustrates a method for operating a scannable storage element in a scan chain of the IC according to another embodiment.

FIG. 21 illustrates an example of a storage element other than the first storage element of the scan chain 100 according to an embodiment. The storage element 2100 may be an example of any of the storage elements $100_2, 100_3 \ldots$ or $100_n$, in cases where the scan 'sd' received by the storage element 2100 is pull-down in the functional mode. For instance, the storage element 2100 is utilized when the scan output 'sq' (that is coupled to the scan input 'sd' of the storage element 2100) provided by a preceding storage element (of the storage element 2100) is pull-down in the functional mode (when SCAN is logic 0). For example, when SCAN is logic 0, the scan input 'sd' is logic 0.

The storage element 2100 includes a node 145 coupled to a scan output buffer 450 for driving the node 415 (scan output terminal). In this example embodiment, the node 145 is also coupled to the data output buffer 250 for driving the node 225 (data output terminal). The storage element 2100 includes the input circuit 460 that is configured to receive a data input (see, 'd') and a scan input (see, 'sd') from a data output 'q' and a scan output 'sq' of the preceding storage element, respectively. The input circuit 460 is configured to provide a signal corresponding to one of the data input 'd' and the scan input 'sd', at the node 462. For instance, an inverse of the data input 'd' is provided at the node 462 in the shift mode (when SCANZ is logic 1), and an inverse of the scan input 'sd' is provided at the node 462 in the functional mode (when SCANZ is logic 0).

An output (for example, the node 462) of the input circuit 460 is connected to the shifting circuit 150 that is configured to transfer a signal corresponding to the node 462 to the node 145. The input of the data output buffer 650 is connected to the node 145 and the output of the data output buffer 650 is connected to the node 625 (the data output terminal). Data output (q) of the storage element 2100 is taken from the node 625. The scan output buffer 450 is also connected to the node 145. As described in reference to FIG. 8, the scan output buffer 450 includes the PMOS transistor 405 (first MOS transistor) and the NMOS transistor 410 (second MOS transistor) (forming a transmission gate) followed by the pull-down NMOS transistor 420. The transistor 420 to act as a pull-down transistor in functional mode (when SCANZ is logic 1), as the transistors 405 and 410 are disabled in the functional mode. In the shift mode (when SCANZ is logic 0), the transistor 420 is disabled; and the transmission gate is enabled and provides the value of the node 145 to the node 415.

The operation of the storage element 2100 is now explained. The input circuit 460 causes a signal corresponding to one of the data input 'd' and the scan input 'sd', to be transferred at the node 462. It should be noted that the scan input 'sd' is logic 0, when the SCAN is logic 0. For instance, a scan output 'sq' of a preceding storage element (such as the storage element 200) of the storage element 2100 is pull-down when the SCAN is logic 0, and this pull-down logic 0 is fed to the scan input 'sd' of the storage element 2100. When the SCAN is logic 1, the scan input 'sd' may have either of logic 0 or logic 1 depending upon the test data and value as received from the preceding storage element. As described in reference to FIG. 5, when SCAN is logic 0, an inverse of the data input is transferred at the node 462, and when SCAN is logic 1, an inverse of the scan input 'sd' is transferred at the node 462.

In functional mode (when SCAN is logic 0 or SCANZ is logic 1), the scan input 'sd' is logic 0, so the transistor 475 and 490 are disabled, and the transistors 465 and 480 are enabled. Accordingly, the transistors 465, 470, 480 and 485 form an inverter configuration, and an inverted logic level of 'd' is transferred to the node 462. Assuming that 'd' is set to logic 1, then inverse of 'd', for example, logic 0 will then be available at the node 462. The shifting circuit 150 is configured to force a logic level at the node 145 that is the inverse of value at the node 462. For example, logic 1 is transferred at the output of inverter 120 of the shifting circuit 145. When CLK is low the transmission gate 125 becomes transparent and the logic 1 at the input of transmission gets transferred to the node 195, forcing the output of the inverter 130 (node 197) to be logic 0. When CLK becomes high the transmission gate 125 becomes transparent which transfers the value at the node 197 (logic 0) to the inverter 120. The inverter 120 forces logic 1 on the node 195. Another transmission gate 135 in enabled when CLK becomes high and hence transfers the value at the node 197 (logic 0) to the inverter 140. The inverter 140 forces logic 1 on the node 145. The inverter 185, the transmission gate 190 and the inverter 146 comprise a loop back path when CLK is logic 0 and helps to retain the value at the node 145. The data output buffer 650 inverts the value at the node 145 and forces a logic 0 at the node 625. As SCAN is logic 0, the transistor 620 is disabled, and the transistors 605, 610 and 615 form an inverter configuration, thereby transferring the inverted value of the node 145 (for example, a logic 0) at the node 625. The data output is taken from the node 625 (that is the data output terminal) as inverse of the data input 'd'. As SCAN is logic 0, the transmission gate formed by the transistors 405 and 410 isolates the node 415 from node 145. At the same time the transistor 420 is enabled which then pulls-down the node 415 to logic 0 irrespective of the clock signal CLK in functional mode. The scan output terminal is coupled to the node 415. Accordingly, in the functional mode (when SCAN is logic 0), the scan output 'sq' is tied to logic 0 (this may help in power reduction in the functional mode due to combinational logic switching in scan path which is driven by the scan output terminal). The scan enable input (SCANZ) acts as a control signal, which decides whether to tie the scan output terminal 'sq' to logic 1 or not. Accordingly, when SCAN is logic 0, the data output 'q' follows the inverse of the data input 'd' and the scan output 'sq' is tied to logic 0 (i.e., pull-down).

In shift mode (when SCAN is logic 1 or SCANZ is logic 0), the transistor 480 is disabled, and the transistors 465, 475 (pull-up) and transistors 490 (pull-down) form an inverter configuration, and an inverse of the scan input 'sd' is transferred to the node 462. It should be further be noted that when SCAN is logic 1, the scan output buffer 450 acts as a transmission gate buffer, as the transistor 420 is disabled and the transmission gate formed by the transistors 405 and 410 transfers the value present at the node 145 to the node 415. The shifting circuit 150 is configured to force a logic level at the node 145 that is the inverse of the node 462. For instance, if the scan input 'sd' is logic 1 (provided the SCAN is logic 1), the node 462 is at logic 0, and the node 145 is at logic 1. The scan output buffer 450 then transfers logic 1 at the node 415 that is coupled to the scan output 'sq'. Accordingly, the scan input 'sd' is transferred to the scan output 'sq' when the IC operates in the shift mode. As SCAN is logic 1, the transistor 215 is disabled causing disabling the inverter comprised by transistors 205 and 210. The transistor 620 is enabled and pulls-down the node 625 (the data output terminal) in response to SCANZ being logic 1. It is noted that transistor 605 is configured to protect leakage current through the inverter (formed by the transistors 610 and 615) when the data output terminal is pull-down.

In shift mode, the data output 'q' is tied to logic 0 (this will help in power reduction in shift mode due to combinational logic switching which is driven by data output terminal). The scan enable input (SCAN) acts as a control signal, which decides whether to tie the data output terminal 'q' to logic 0 or not. When SCAN is 0, the data output 'q' follows the inversion of the data input 'd' and the scan output 'sq' is tied to logic 0. When SCAN is logic 1, the data output 'q' is tied to logic 0 and the scan output 'sq' follows the scan input (sd). According to this embodiment, average power over a number of ATPG shift cycles comes down as all the functional combinational logic does not toggle due to 'q' gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" 'q' gating.

Various embodiments also provide a method 2200 for operating a scannable storage element in a scan chain (for example, the scan chain 100) an IC is provided. Examples of the scannable storage element may be the scannable storage elements described in reference to FIGS. 4-21. At 2205, the method 2200 includes generating a first signal at a first node of the scannable storage element in response of one of a data input and a scan input. In an embodiment, the scan input may be one of a pull-up and a pull-down logic in a functional mode of testing the IC. In an embodiment, generating the first signal may include providing a first pull-up path comprising a first switch to receive the data input and a second switch to receive a scan enable input and providing a second pull-up path comprising a third switch to receive the scan input, where the first pull-up path and the second pull-up path are coupled between a power supply and the first node. In this embodiment, generating the first signal also includes providing a first pull-down path comprising a fourth switch to receive the scan enable input and a fifth switch to receive the scan input, and providing a second pull-down path comprising a sixth switch to receive the data input, wherein the first pull-down path and the second pull-down path are coupled between the first node and a reference supply. Examples of the first to sixth switches may include MOS transistors or any other electronics/electrical components or a combination of components that may be functionally analogous to the MOS transistors.

In another embodiment, generating the first signal may include providing a first pull-up path comprising a first switch to receive the scan input and a second switch to receive the data input and providing a second pull-up path comprising the first switch and a third switch to receive an inverted scan enable input, where the first pull-up path and the second pull-up path are coupled between a power supply and the first node. In this embodiment, generating the first signal may also include providing a first pull-down path comprising a fourth switch to receive the inverted scan enable input and a fifth switch to receive the data input, and providing a second pull-down path comprising a sixth switch to receive the scan input, where the first pull-down path and the second pull-down path are coupled between the first node and a reference supply. Examples of the first to sixth switches may include MOS transistors or any other electronics/electrical components or a combination of components that may be functionally analogous to the MOS transistors.

At 2210, the method 2200 includes generating a second signal by one or more sequential elements in response to the first signal at a second node of the scannable storage element. Further, at 2215, the method 2200 includes generating a scan output at a scan output terminal of the scannable storage element in response to the second signal, wherein the scan output is one of a pull-up logic and a pull-down logic in the functional mode and the scan output corresponds to the scan input in a shift mode. At 2220, the method 2200 further includes generating a data output in response to the second signal at a data output terminal.

It should be noted that reference throughout this specification to features, advantages, or similar language does not imply that all of the features and advantages should be, or are in, any single embodiment. Rather, language referring to the features and advantages is understood to mean that a specific feature, advantage, or characteristic described in connection with an embodiment is included in at least one embodiment of the present technology. Thus, discussions of the features and advantages, and similar language, throughout this specification may, but do not necessarily, refer to the same embodiment.

Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions are apparent and well within the spirit and scope of the technology. Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. A scannable storage element for use in an Integrated Circuit (IC), the scannable storage element comprising:
   an input circuit configured to provide a first signal at a first node in response to one of a data input and a scan input, the scan input being of a pull-up logic in a functional mode, the input circuit comprising:
      a first pull-up path comprising a first switch to receive the data input and a second switch to receive a scan enable input;
      a second pull-up path comprising a third switch to receive the scan input, the first pull-up path and the second pull-up path coupled between a power supply and the first node;
      a first pull-down path comprising a fourth switch to receive the scan enable input and a fifth switch to receive the scan input; and
      a second pull-down path comprising a sixth switch to receive the data input, the first pull-down path and the second pull-down path coupled between the first node and a reference supply;
   a shifting circuit coupled with the first node, the shifting circuit comprising one or more sequential components and configured to provide a second signal in response to the first signal at a second node;
   a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein the scan output buffer comprises:
      an inverter having a p-channel MOS (PMOS) transistor and an n-channel MOS (NMOS) transistor, an output of the inverter coupled to the scan output terminal;
      a first MOS transistor having a source coupled to the power supply, a drain coupled to the source of the PMOS transistor and a gate coupled to an inverted scan enable input; and
      a second MOS transistor with a source coupled to the reference supply, a drain coupled to the scan output terminal and a gate coupled to the inverted scan enable input, wherein the second MOS transistor is configured to pull-down the scan output terminal in response to the inverted scan enable input in the functional mode.

2. The scannable storage circuit of claim 1, wherein each of the first switch, the second switch, the third switch, the fourth switch, the fifth switch and the sixth switch is a Metal Oxide Semiconductor (MOS) transistor.

3. A scannable storage element for use in an Integrated Circuit (IC), the scannable storage element comprising:
   an input circuit configured to provide a first signal at a first node in response to one of a data input and a scan input, the scan input being of a pull-up logic in a functional mode, the input circuit comprising:
      a first pull-up path comprising a first switch to receive the data input and a second switch to receive a scan enable input;
      a second pull-up path comprising a third switch to receive the scan input, the first pull-up path and the second pull-up path coupled between a power supply and the first node;

a first pull-down path comprising a fourth switch to receive the scan enable input and a fifth switch to receive the scan input; and a second pull-down path comprising a sixth switch to receive the data input, the first pull-down path and the second pull-down path coupled between the first node and a reference supply;

a shifting circuit coupled with the first node, the shifting circuit comprising one or more sequential components and configured to provide a second signal in response to the first signal at a second node;

a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein the scan output buffer comprises:

an inverter having a PMOS transistor and an NMOS transistor, an output of the inverter coupled to the scan output terminal;

a third MOS transistor having a source coupled to the reference supply, a drain coupled to the source of the NMOS transistor and a gate coupled to the scan enable input; and a fourth MOS transistor with a source coupled to the power supply, a drain coupled to the scan output terminal and a gate coupled to the scan enable input, wherein the fourth MOS transistor is configured to pull-up the scan output terminal in response to the inverted scan enable input in the functional mode.

4. A scannable storage element for use in an Integrated Circuit (IC), the scannable storage element comprising;

an input circuit configured to provide a first signal at a first node in response to one of a data input and a scan input the scan input being of a pull-up logic in a functional mode, the input circuit comprising:

a first pull-up path comprising a first switch to receive the data input and a second switch to receive a scan enable input;

a second pull-up path comprising a third switch to receive the scan input the first pull-up path and the second pull-up path coupled between a power supply and the first node;

a first pull-down path comprising a fourth switch to receive the scan enable input and a fifth switch to receive the scan input; and a second pull-down path comprising a sixth switch to receive the data input, the first pull-down path and the second pull-down path coupled between the first node and a reference supply;

a shifting circuit coupled with the first node, the shifting circuit comprising one or more sequential components and configured to provide a second signal in response to the first signal at a second node;

a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein the scan output buffer comprises:

a transmission gate having an fifth MOS transistor with source and drain coupled to source and drain of a sixth MOS transistor respectively, drains of the fifth and the sixth MOS transistors being coupled to the second node and sources of the fifth and the sixth MOS transistors being coupled to the scan output terminal, gates of the fifth and the sixth MOS transistors being coupled to an inverted scan enable input and the scan enable input, respectively; and a seventh MOS transistor, coupled to the scan output terminal, configured to pull-down the scan output terminal in response to the inverted scan enable input in the functional mode, and configured to pull-down the scan output terminal in response to the inverted scan enable input in the functional mode.

5. The scannable storage element of claim 1, further comprising:

a data output buffer coupled to the second node, the data output buffer configured to provide a data output in response to the second signal at a data output terminal.

6. A scannable storage element for use in an Integrated Circuit (IC), the scannable storage element comprising:

an input circuit configured to provide a first signal at a first node in response to one of a data input and a scan input, the scan input being of a pull-up logic in a functional mode, the input circuit comprising:

a first pull-up path comprising a first switch to receive the data input and a second switch to receive a scan enable input;

a second pull-up path comprising a third switch to receive the scan input, the first pull-up path and the second pull-up path coupled between a power supply and the first node;

a first pull-down path comprising a fourth switch to receive the scan enable input and a fifth switch to receive the scan input; and a second pull-down path comprising a sixth switch to receive the data input the first pull-down path and the second pull-down path coupled between the first node and a reference supply;

a shifting circuit coupled with the first node, the shifting circuit comprising one or more sequential components and configured to provide a second signal in response to the first signal at a second node;

a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode;

a data output buffer coupled to the second node, the data output buffer configured to provide a data output in response to the second signal at a data output terminal, wherein the data output buffer comprises:

an inverter having a PMOS transistor and an NMOS transistor, an output of the inverter coupled to the data output terminal;

a eighth MOS transistor with a drain coupled to a source of the NMOS transistor and with a source coupled to the reference supply and with a gate coupled to an inverted scan enable input; and a ninth MOS transistor having a source coupled to the power supply, a drain coupled to the data output terminal and a gate coupled to the inverted scan enable input, wherein the ninth MOS transistor is configured to pull-up the data output terminal in a shift mode.

7. A scannable storage element for use in an Integrated Circuit (IC), the scannable storage element comprising:

an input circuit configured to provide a first signal at a first node in response to one of a data input and a scan input, the scan input being of a pull-up logic in a functional mode, the input circuit comprising:
  a first pull-up path comprising a first switch to receive the data input and a second switch to receive a scan enable input;
  a second pull-up path comprising a third switch to receive the scan input the first pull-up path and the second pull-up path coupled between a power supply and the first node;
  a first pull-down path comprising a fourth switch to receive the scan enable input and a fifth switch to receive the scan input; and
  a second pull-down path comprising a sixth switch to receive the data input, the first pull-down path and the second pull-down path coupled between the first node and a reference supply;
a shifting circuit coupled with the first node, the shifting circuit comprising one or more sequential components and configured to provide a second signal in response to the first signal at a second node;
a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode;
a data output buffer coupled to the second node, the data output buffer configured to provide a data output in response to the second signal at a data output terminal, wherein the data output buffer comprises:
  an inverter having a PMOS transistor and an NMOS transistor, an output of the inverter coupled to the data output terminal;
  a sixteenth MOS transistor with a source coupled to the power supply, a drain coupled to a source of the PMOS transistor and with a gate coupled to the scan enable input; and
  a seventeenth MOS transistor having a drain coupled to the data output terminal, a source coupled to the reference supply and a gate coupled to the scan enable input, wherein the second MOS transistor is configured to pull-down the data output terminal in a shift mode.

8. A scannable storage element for use in an Integrated Circuit (IC), the scannable storage element comprising
an input circuit configured to provide a first signal at a first node in response to one of a data input and a scan input, the scan input being of a pull-down logic in a functional mode, the input circuit comprising:
  a first pull-up path comprising a first switch to receive the scan input and a second switch to receive the data input;
  a second pull-up path comprising the first switch and a third switch to receive an inverted scan enable input, the first pull-up path and the second pull-up path coupled between a power supply and the first node;
  a first pull-down path comprising a fourth switch to receive the inverted scan enable input and a fifth switch to receive the data input and
  a second pull-down path comprising a sixth switch to receive the scan input the first pull-down path and the second pull-down path coupled between the first node and a reference supply;
a shifting circuit coupled with the first node, the shifting circuit comprising one or more sequential components and configured to provide a second signal in response to the first signal at a second node; and
a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein the scan output buffer comprises:
  an inverter having a p-channel Metal Oxide Semiconductor (PMOS) transistor and an n-channel MOS (NMOS) transistor, an output of the inverter coupled to the scan output terminal;
  a first MOS transistor having a source coupled to the power supply, a drain coupled to the source of the PMOS transistor and a gate coupled to an inverted scan enable input; and
  a second MOS transistor with a source coupled to the reference supply, a drain coupled to the scan output terminal and a gate coupled to the inverted scan enable input, wherein the second MOS transistor is configured to pull-down the scan output terminal in response to the inverted scan enable input in the functional mode.

9. The scannable storage circuit of claim 8, wherein each of the first switch, the second switch, the third switch, the fourth switch, the fifth switch and the sixth switch is a Metal Oxide Semiconductor (MOS) transistor.

10. A scannable storage element for use in an Integrated Circuit (IC), the scannable storage element comprising:
an input circuit configured to provide a first signal at a first node in response to one of a data input and a scan input the scan input being of a pull-down logic in a functional mode, the input circuit comprising:
  a first pull-up path comprising a first switch to receive the scan input and a second switch to receive the data input;
  a second pull-up path comprising the first switch and a third switch to receive an inverted scan enable input, the first pull-up path and the second pull-up path coupled between a power supply and the first node;
  a first pull-down path comprising a fourth switch to receive the inverted scan enable input and a fifth switch to receive the data input; and
  a second pull-down path comprising a sixth switch to receive the scan input, the first pull-down path and the second pull-down path coupled between the first node and a reference supply;
a shifting circuit coupled with the first node, the shifting circuit comprising one or more sequential components and configured to provide a second signal in response to the first signal at a second node; and
a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein the scan output buffer comprises:
  an inverter having a PMOS transistor and an NMOS transistor, an output of the inverter coupled to the scan output terminal;

a third MOS transistor having a source coupled to the reference supply, a drain coupled to the source of the NMOS transistor and a gate coupled to the scan enable input; and a fourth MOS transistor with a source coupled to the power supply, a drain coupled to the scan output terminal and a gate coupled to the scan enable input, wherein the fourth MOS transistor is configured to pull-up the scan output terminal in response to the inverted scan enable input in the functional mode.

11. A scannable storage element for use in an Integrated Circuit (IC), the scannable storage element comprising:

an input circuit configured to provide a first signal at a first node in response to one of a data input and a scan input, the scan input being of a pull-down logic in a functional mode, the input circuit comprising:
a first pull-up path comprising a first switch to receive the scan input and a second switch to receive the data input;
a second pull-up path comprising the first switch and a third switch to receive an inverted scan enable input the first pull-up path and the second pull-up path coupled between a power supply and the first node;
a first pull-down path comprising a fourth switch to receive the inverted scan enable input and a fifth switch to receive the data input; and
a second pull-down path comprising a sixth switch to receive the scan input, the first pull-down path and the second pull-down path coupled between the first node and a reference supply;

a shifting circuit coupled with the first node, the shifting circuit comprising one or more sequential components and configured to provide a second signal in response to the first signal at a second node; and a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein the scan output buffer comprises:
a transmission gate having an fifth MOS transistor with source and drain coupled to source and drain of a sixth MOS transistor respectively, drains of the fifth and the sixth MOS transistors being coupled to the second node and sources of the fifth and the sixth MOS transistors being coupled to the scan output terminal, gates of the fifth and the sixth MOS transistors being coupled to an inverted scan enable input and the scan enable input respectively; and
a seventh MOS transistor, coupled to the scan output terminal, configured to pull-down the scan output terminal in response to the inverted scan enable input in the functional mode, and configured to pull-down the scan output terminal in response to the inverted scan enable input in the functional mode.

12. The scannable storage element of claim 8, further comprising:
a data output buffer coupled to the second node, the data output buffer configured to provide a data output in response to the second signal at a data output terminal.

13. A scannable storage element for use in an Integrated Circuit (IC), the scannable storage element comprising:

an input circuit configured to provide a first signal at a first node in response to one of a data input and a scan input, the scan input being of a pull-down logic in a functional mode, the input circuit comprising:
a first pull-up path comprising a first switch to receive the scan input and a second switch to receive the data input;
a second pull-up path comprising the first switch and a third switch to receive an inverted scan enable input, the first pull-up path and the second pull-up path coupled between a power supply and the first node;
a first pull-down path comprising a fourth switch to receive the inverted scan enable input and a fifth switch to receive the data input; and
a second pull-down path comprising a sixth switch to receive the scan input, the first pull-down path and the second pull-down path coupled between the first node and a reference supply;

a shifting circuit coupled with the first node, the shifting circuit comprising one or more sequential components and configured to provide a second signal in response to the first signal at a second node; and a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein the data output buffer comprises:
an inverter having a PMOS transistor and an NMOS transistor, an output of the inverter coupled to the data output terminal;
a eighth MOS transistor with a drain coupled to a source of the NMOS transistor and with a source coupled to the reference supply and with a gate coupled to an inverted scan enable input; and
a ninth MOS transistor having a source coupled to the power supply, a drain coupled to the data output terminal and a gate coupled to the inverted scan enable input, wherein the ninth MOS transistor is configured to pull-up the data output terminal in a shift mode.

14. A scannable storage element for use in an Integrated Circuit (IC), the scannable storage element comprising:

an input circuit configured to provide a first signal at a first node in response to one of a data input and a scan input, the scan input being of a pull-down logic in a functional mode, the input circuit comprising:
a first pull-up path comprising a first switch to receive the scan input and a second switch to receive the data input;
a second pull-up path comprising the first switch and a third switch to receive an inverted scan enable input, the first pull-up path and the second pull-up path coupled between a power supply and the first node;
a first null-down path comprising a fourth switch to receive the inverted scan enable input and a fifth switch to receive the data input; and
a second pull-down path comprising a sixth switch to receive the scan input, the first pull-down path and the second pull-down path coupled between the first node and a reference supply;

a shifting circuit coupled with the first node, the shifting circuit comprising one or more sequential components and configured to provide a second signal in response to the first signal at a second node; and a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein the data output buffer comprises:
an inverter having a PMOS transistor and an NMOS transistor, an output of the inverter coupled to the data output terminal;
a sixteenth MOS transistor with a source coupled to the power supply, a drain coupled to a source of the PMOS transistor and with a gate coupled to the scan enable input; and
a seventeenth MOS transistor having a drain coupled to the data output terminal, a source coupled to the reference supply and a gate coupled to the scan enable input, wherein the second MOS transistor is configured to pull-down the data output terminal in a shift mode.

15. A scannable storage element for use in an Integrated Circuit (IC), the scannable storage element comprising:
an input circuit configured to provide a first signal at a first node in response to one of a data input and a scan input, the scan input being of a pull-down logic in a functional mode, the input circuit comprising:
a first pull-up path comprising a first switch to receive the scan input and a second switch to receive the data input;
a second pull-up path comprising the first switch and a third switch to receive an inverted scan enable input the first pull-up path and the second pull-up path coupled between a power supply and the first node;
a first pull-down path comprising a fourth switch to receive the inverted scan enable input and a fifth switch to receive the data input; and
a second pull-down path comprising a sixth switch to receive the scan input, the first pull-down path and the second pull-down path coupled between the first node and a reference supply;
a shifting circuit coupled with the first node, the shifting circuit comprising one or more sequential components and configured to provide a second signal in response to the first signal at a second node; and
a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein generating the first signal comprising:
providing a first pull-up path comprising a first switch to receive the data input and a second switch to receive a scan enable input;
providing a second pull-up path comprising a third switch to receive the scan input, the first pull-up path and the second pull-up path coupled between a power supply and the first node;
providing a first pull-down path comprising a fourth switch to receive the scan enable input and a fifth switch to receive the scan input;
providing a second pull-down path comprising a sixth switch to receive the data input, the first pull-down path and the second pull-down path coupled between the first node and a reference supply;
generating a second signal by one or more sequential elements in response to the first signal at a second node of the scannable storage element; and generating a scan output at a scan output terminal of the scannable storage element in response to the second signal, wherein the scan output is one of a pull-up logic and a pull-down logic in the functional mode and the scan output corresponds to the scan input in a shift mode.

16. A scannable storage element for use in an Integrated Circuit (IC), the scannable storage element comprising:
an input circuit configured to provide a first signal at a first node in response to one of a data input and a scan input, the scan input being of a pull-down logic in a functional mode, the input circuit comprising:
a first pull-up path comprising a first switch to receive the scan input and a second switch to receive the data input;
a second pull-up path comprising the first switch and a third switch to receive an inverted scan enable input, the first pull-up path and the second pull-up path coupled between a power supply and the first node;
a first pull-down path comprising a fourth switch to receive the inverted scan enable input and a fifth switch to receive the data input; and
a second pull-down path comprising a sixth switch to receive the scan input, the first pull-down path and the second pull-down path coupled between the first node and a reference supply;
a shifting circuit coupled with the first node, the shifting circuit comprising one or more sequential components and configured to provide a second signal in response to the first signal at a second node; and
a scan output buffer coupled to the second node to receive the second signal, the scan output buffer configured to provide a scan output at a scan output terminal in response to the second signal, wherein the scan output is one of the pull-up logic and the pull-down logic in the functional mode and the scan output corresponds to the scan input in a shift mode, wherein generating the first signal comprising:
providing a first pull-up path comprising a first switch to receive the scan input and a second switch to receive the data input;
providing a second pull-up path comprising the first switch and a third switch to receive an inverted scan enable input, the first pull-up path and the second pull-up path coupled between a power supply and the first node;
providing a first pull-down path comprising a fourth switch to receive the inverted scan enable input and a fifth switch to receive the data input; and
providing a second pull-down path comprising a sixth switch to receive the scan input, the first pull-down path and the second pull-down path coupled between the first node and a reference supply;
generating a second signal by one or more sequential elements in response to the first signal at a second node of the scannable storage element; and
generating a scan output at a scan output terminal of the scannable storage element in response to the second signal, wherein the scan output is one of a pull-up logic and a pull-down logic in the functional mode and the scan output corresponds to the scan input in a shift mode.

17. The method of claim 15, further comprising:
generating a data output in response to the second signal at a data output terminal of the scannable storage element.

18. The scannable storage circuit of claim 3, wherein each of the first switch, the second switch, the third switch, the fourth switch, the fifth switch and the sixth switch is a Metal Oxide Semiconductor (MOS) transistor.

19. The scannable storage circuit of claim 4, wherein each of the first switch, the second switch, the third switch, the fourth switch, the fifth switch and the sixth switch is a Metal Oxide Semiconductor (MOS) transistor.

20. The scannable storage circuit of claim 6, wherein each of the first switch, the second switch, the third switch, the fourth switch, the fifth switch and the sixth switch is a Metal Oxide Semiconductor (MOS) transistor.

* * * * *